US012787728B2

(12) United States Patent
Lin et al.

(10) Patent No.: US 12,787,728 B2
(45) Date of Patent: Nov. 3, 2026

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 338 days.

(21) Appl. No.: 18/662,427

(22) Filed: May 13, 2024

(65) Prior Publication Data

US 2025/0349596 A1 Nov. 13, 2025

(51) Int. Cl.

| | |
|---|---|
| *H10W 10/17* | (2026.01) |
| *H10D 30/67* | (2025.01) |
| *H10D 64/01* | (2025.01) |
| *H10D 84/01* | (2026.01) |
| *H10W 10/00* | (2026.01) |
| *H10D 62/10* | (2025.01) |

(52) U.S. Cl.

CPC ...... *H10W 10/014* (2026.01); *H10D 30/6735* (2025.01); *H10D 64/017* (2025.01); *H10D 84/0153* (2025.01); *H10W 10/17* (2026.01); *H10D 62/121* (2025.01); *H10D 64/018* (2025.01)

(58) Field of Classification Search

CPC ........... H10D 84/0153; H10D 84/0188; H10D 84/0151; H10D 84/0135; H10D 84/0172; H10D 84/832; H10D 84/851; H10D 64/017; H10D 30/6735; H10W 10/014–0148; H10W 10/17; H10W 10/021; H10W 10/20

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

(Continued)

*Primary Examiner* — Yu Chen

(74) *Attorney, Agent, or Firm* — Birch, Stewart, Kolasch & Birch, LLP

(57) ABSTRACT

A semiconductor device includes a substrate, a transistor over the substrate, and a first isolation structure adjacent to the transistor. The transistor includes a channel layer extending along a first direction, a gate structure over the channel layer and extending along a second direction substantially perpendicular to the first direction, and source/drain structures on opposite ends of the channel layer. In a top view, the first isolation structure includes a first extension portion and a second extension portion extending along the first direction, and a connection portion extending along the second direction and connecting with the first extension portion and the second extension portion.

20 Claims, 60 Drawing Sheets

(56) References Cited

U.S. PATENT DOCUMENTS

| | | | | |
|---|---|---|---|---|
| 2015/0054078 | A1* | 2/2015 | Xie | H10D 30/62<br>257/288 |
| 2019/0131297 | A1* | 5/2019 | Chen | H10D 30/791 |
| 2025/0079265 | A1* | 3/2025 | Na | H10W 20/20 |
| 2025/0081512 | A1* | 3/2025 | Tsai | H10D 30/019 |

* cited by examiner

SEMICONDUCTOR DEVICE AND METHOD FOR FORMING THE SAME

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, resistance of source/drain features increases, which affect device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
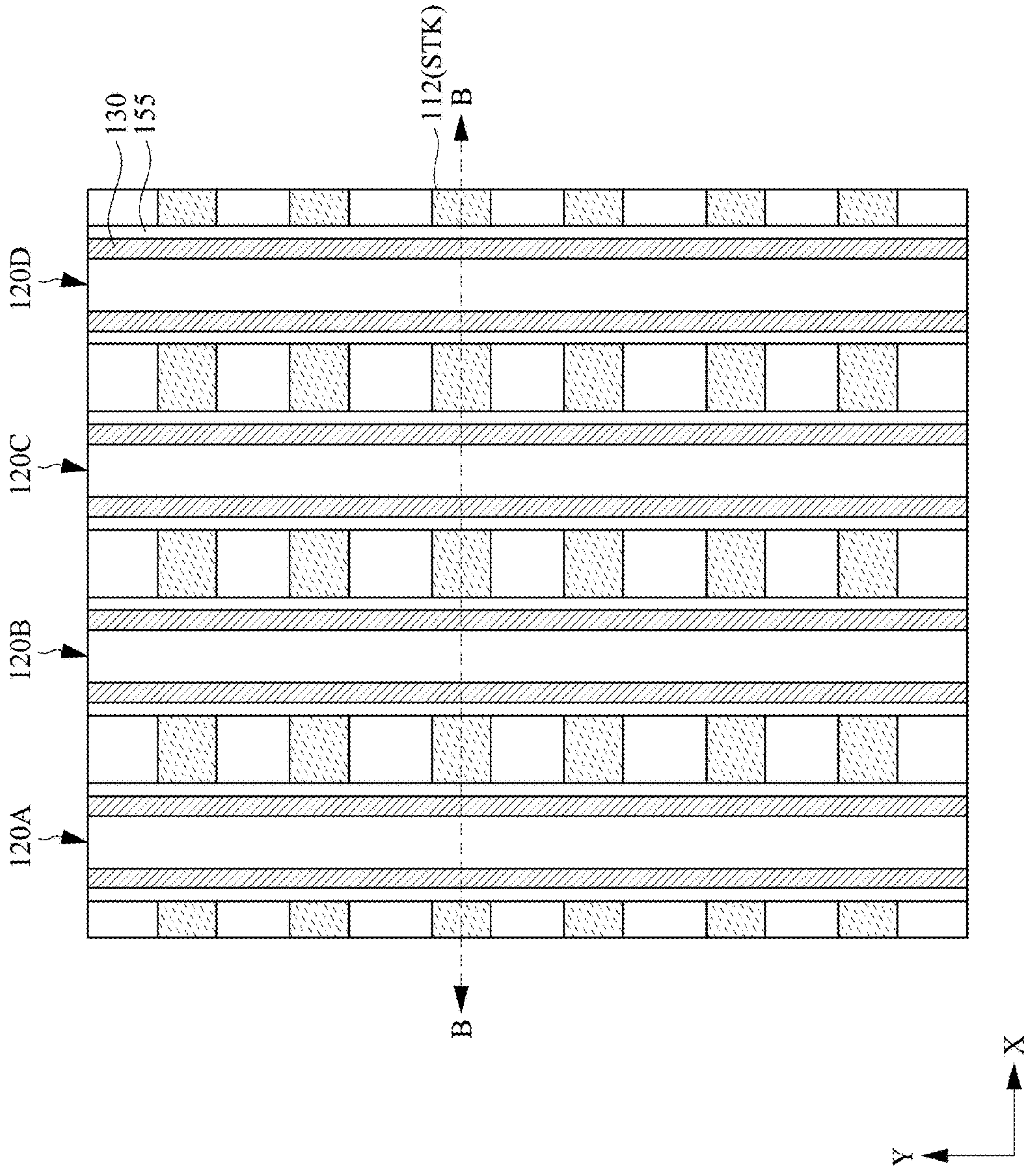
FIGS. 1A and 1B illustrate an initial structure of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
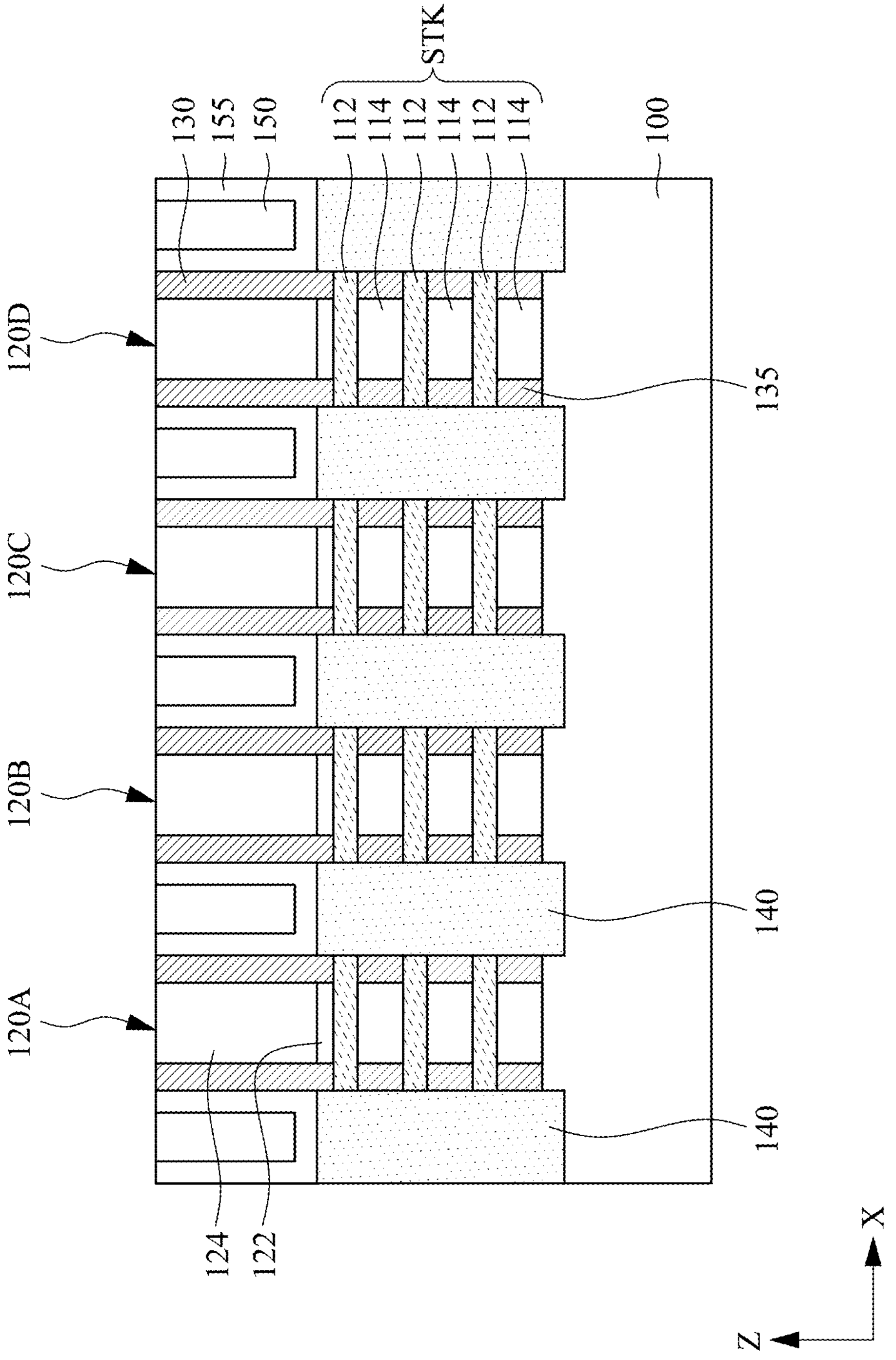

FIGS. 1A and 1B illustrate an initial structure of a semiconductor device in accordance with some embodiments of the present disclosure. In greater detail, FIG. 1A is a top view of a semiconductor device, and FIG. 1B is a cross-sectional view along line B-B of the semiconductor device in FIG. 1A.

Shown there is a semiconductor substrate 100, which is provided to form semiconductor device thereon. Generally, the substrate 100 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $GaxAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof.

Several stacks STK of alternating semiconductor channel layers 112 and sacrificial layers 114 are formed over the semiconductor substrate 100. Each stack STK may extend along a first direction (e.g., X direction). In some embodiments, the semiconductor channel layers 112 may be made of pure silicon layers that are free of germanium. The semiconductor channel layers 112 may also be substantially pure silicon layers, for example, with a germanium percentage lower than about 1 percent. The sacrificial layers 114 may be made of silicon germanium (SiGe). In some embodiments, the semiconductor channel layers 112 may include other suitable epitaxial materials, such as SiGe, SiGeC, Ge, Si, III-V materials, or a combination thereof. In some embodiments, the semiconductor channel layers 112 and the sacrificial layers 114 may be deposited using suitable deposition process, such as selective epitaxial growth (SEG), chemical vapor deposition (CVD), molecular beam epitaxy (MBE), or other suitable process(es). In some embodiments, the sacrificial layers 114 may be removed during a replacement gate (RPG) process. The sacrificial layers 114 may also be referred to as semiconductor layers. It is noted that the number of the semiconductor channel layers 112 (e.g., 3) is merely used to explain, the disclosure is not limited thereto. The number of the semiconductor channel layers 112A may be in a range from 2 to 10, such as 2, 3, or 4 layers.

Dummy gate structures 120A, 120B, 120C, and 120D are formed crossing the stacks STK. Each of the dummy gate structures 120A, 120B, 120C, and 120D may extend along a second direction (e.g., Y direction) perpendicular to the first direction. In some embodiments, each of the dummy gate structures 120A, 120B, 120C, and 120D includes a dummy gate dielectric 122 and a dummy gate electrode 124 over the dummy gate dielectric 122. The dummy gate dielectric 122 may be, for example, silicon oxide, silicon nitride, a combination thereof, or the like, and may be deposited or thermally grown according to acceptable techniques. The dummy gate electrode 124 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

Gate spacers 130 are formed on opposite sidewalls of the dummy gate structures 120A, 120B, 120C, and 120D, respectively. In some embodiments, the gate spacers 130 may be formed by, for example, depositing a spacer layer blanket over the substrate, and then performing an anisotropic etching process to remove horizontal portions of the spacer layer, such that vertical portions of the spacer layer remain on sidewalls of the dummy gate structures 120A, 120B, 120C, and 120D. In some embodiments, the remaining vertical portions of the spacer layer can be referred to as the 120A, 120B, 120C, and 120D. The spacer layer may be deposited using techniques such CVD, ALD, or the like. In some embodiments, the gate spacers 130 may include silicon nitride ($Si_3N_4$), nitride based dielectric layer, silicon oxide ($SiO_2$), silicon oxycarbide (SiOC), silicon oxynitride (SiON), silicon oxycarbonitride (SiOCN), the like, or other suitable materials.

In FIG. 1B, once the gate spacers 130 are formed, the stacks STK are etched, by using the dummy gate structures 120A, 120B, 120C, and 120D, and the gate spacers 130 as etch mask, to form source/drain openings in the stacks STK that penetrate through the semiconductor channel layers 112 and the sacrificial layers 114. The source/drain openings may also extend into the substrate 100.

After the source/drain openings are formed, the sacrificial layers 114 are laterally etched to form sidewall recesses. In some embodiments, the sidewalls of the sacrificial layers 114 may be etched using isotropic etching processes, such as wet etching or the like. In some embodiments where the sacrificial layers 114 include, e.g., SiGe, and the semiconductor channel layers 112 include, e.g., Si, an etch process with tetramethylammonium hydroxide (TMAH), ammonium hydroxide ($NH_4OH$), or the like may be used to etch sidewalls of the sacrificial layers 114.

Afterwards, inner spacers 135 are formed in the sidewall recesses on opposite ends the sacrificial layers 114, respectively. In some embodiments, the inner spacers 135 may be formed by, for example, depositing an inner spacer layer blanket over the semiconductor substrate 100 and filling the sidewall recesses, and then performing an anisotropic etching to remove portions of the inner spacer layer outside the sidewall recesses, leaving the remaining portions of the inner spacer layer in the sidewall recesses as the inner spacers 135. The inner spacers 135 may be deposited using a conformal deposition process, such as CVD, ALD, or the like. In some embodiments, the inner spacers 135 may include silicon nitride ($Si_3N_4$), nitride based dielectric layer, silicon oxide ($SiO_2$), silicon oxycarbide (SiOC), silicon oxynitride (SiON), silicon oxycarbonitride (SiOCN), the like, or other suitable materials.

Afterwards, source/drain epitaxial structures 140 are formed in the source/drain openings, respectively. In some embodiments, the source/drain epitaxial structures 140 may be formed by suitable deposition process, such as a selective epitaxial growth (SEG) process. In some embodiments, implantation process(es) may be performed to the source/drain epitaxial structures 140. For example, for a P-type device, an implantation process may be performed to dope the source/drain epitaxial structures 140 using P-type impurities, such as boron (B), gallium (Ga), indium (In), aluminium (Al), or the like, such that the source/drain epitaxial structures 140 are P-type epitaxy structures. Similarly, for an N-type device, an implantation process may be performed to dope the source/drain epitaxial structures 140 using N-type impurities, such as phosphorus (P), arsenic (As), or antimony (Sb), or the like, such that the source/drain epitaxial structures 140 are N-type epitaxy structures. It noted that the source/drain epitaxial structures 140 are not illustrated in FIG. 1A for brevity.

A contact etch stop layer (CESL) 155 is formed covering the source/drain epitaxial structures 140, and an interlayer dielectric (ILD) layer 150 is formed over the CESL 155. Then, a planarization process is performed to remove excess materials of the CESL 155 and the ILD layer 150 until top surfaces of the dummy gate structures 120A, 120B, 120C, and 120D are exposed. In some embodiments, the CESL 155 may be a dielectric layer including silicon nitride, silicon oxynitride or other suitable materials. In some embodiments, the ILD layer 150 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The CESL 155 and the ILD layer 150 can be formed using, for example, CVD, ALD or other suitable techniques. It noted that the ILD layer 150 is not illustrated in FIG. 1A for brevity.

Figure 2A:
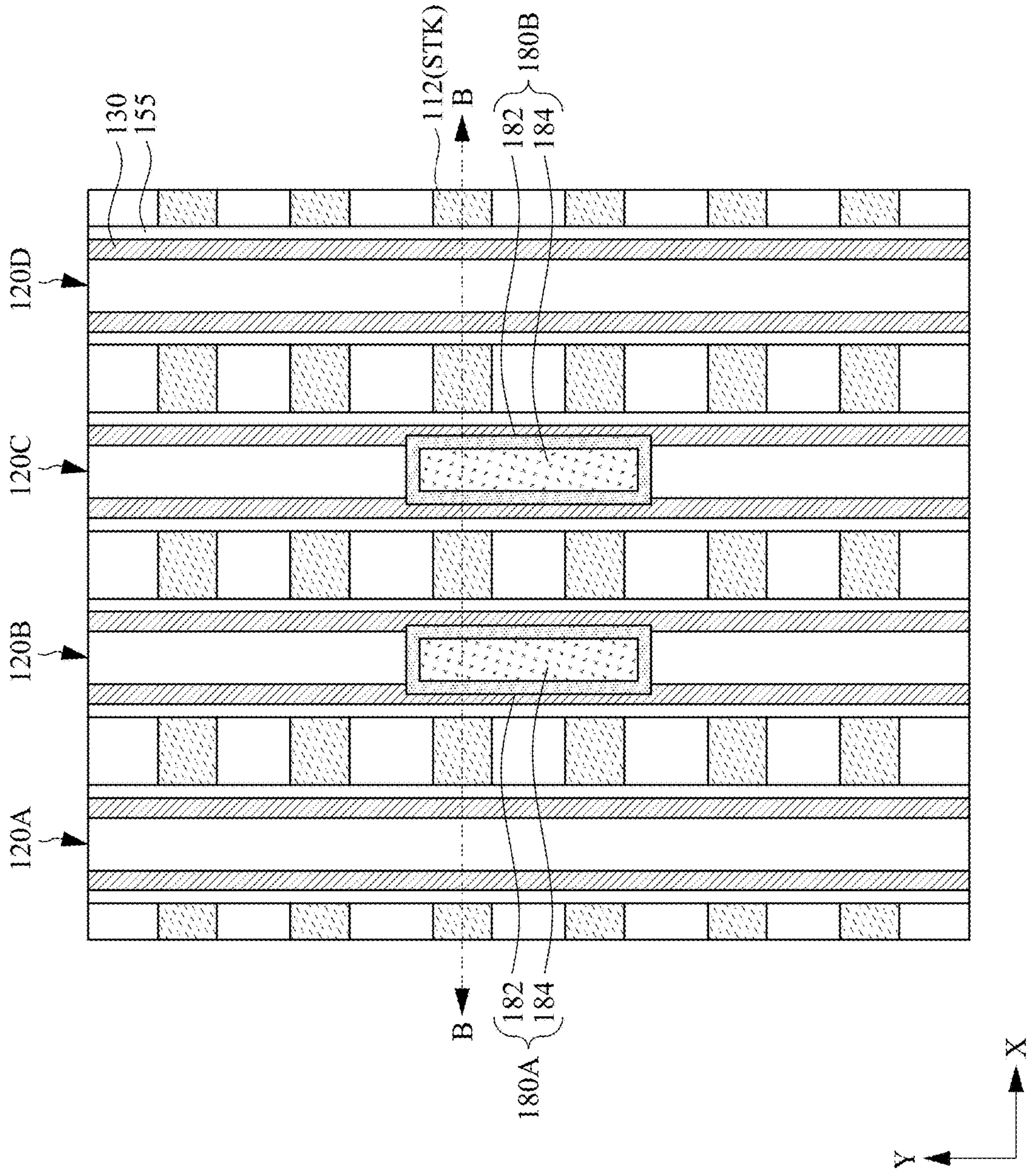
FIGS. 2A to 4B illustrate various stages of manufacturing a semiconductor device in accordance with some embodiments of the present disclosure.
Figure 2B:
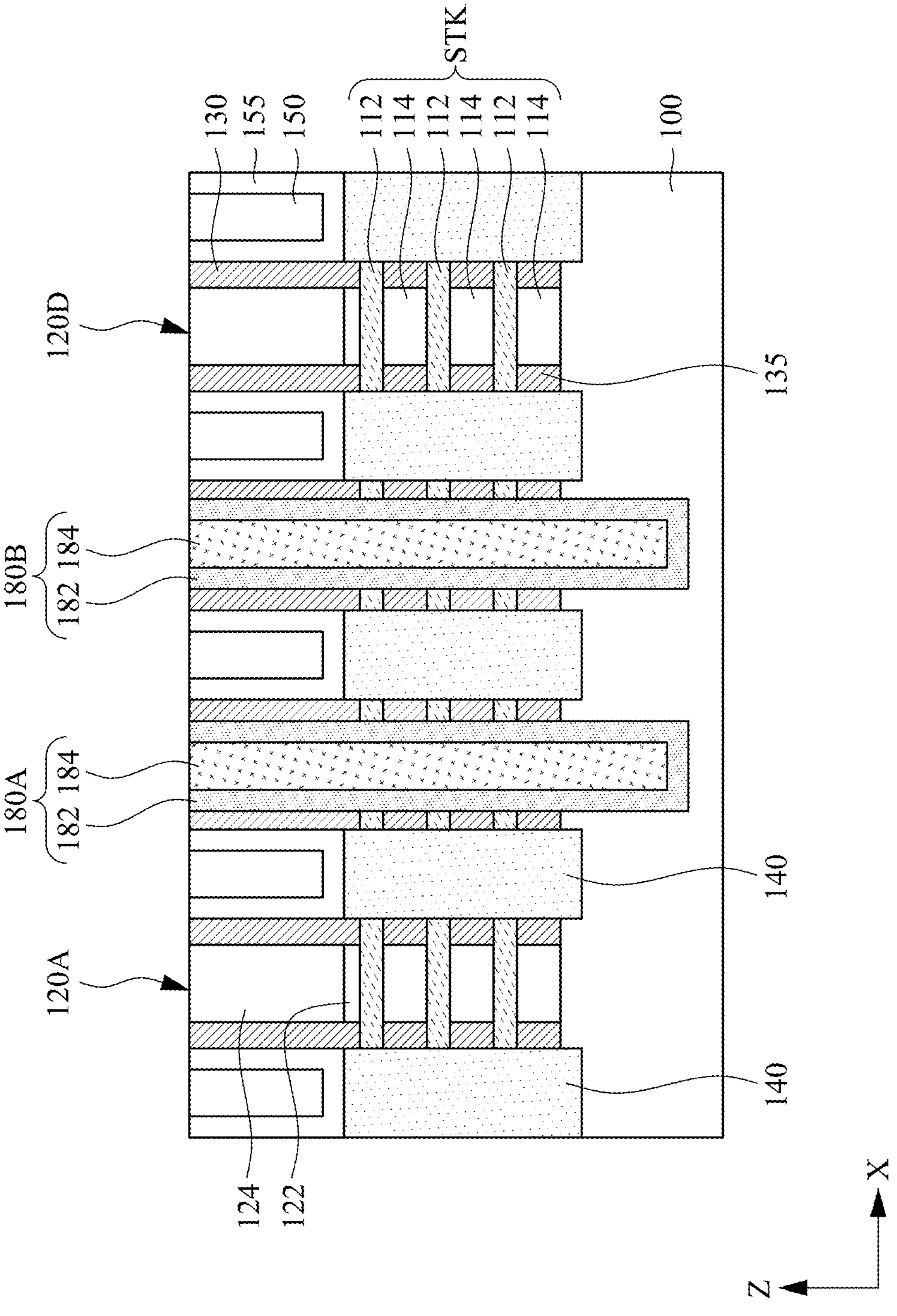
Figure 3A:
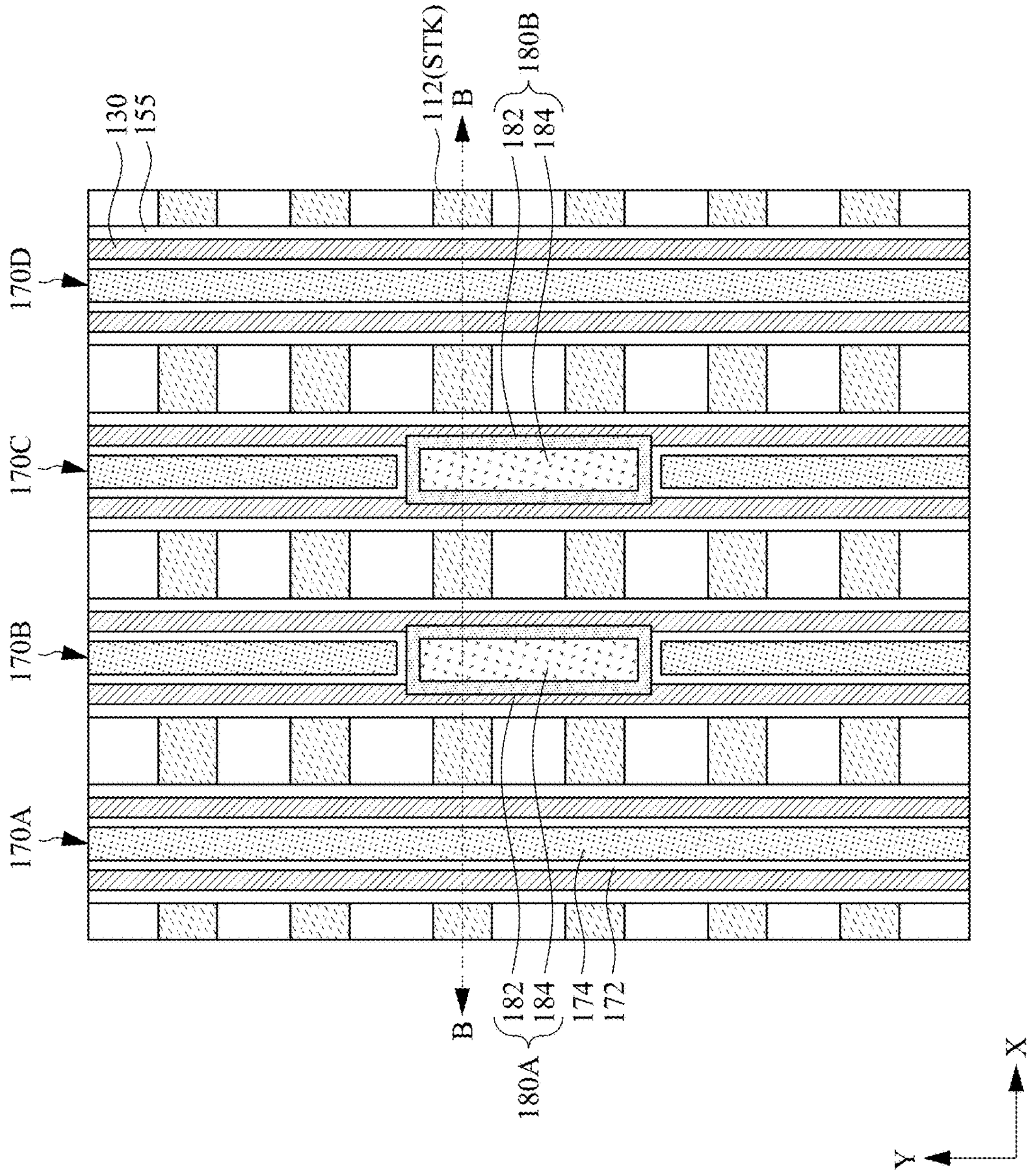
Figure 3B:
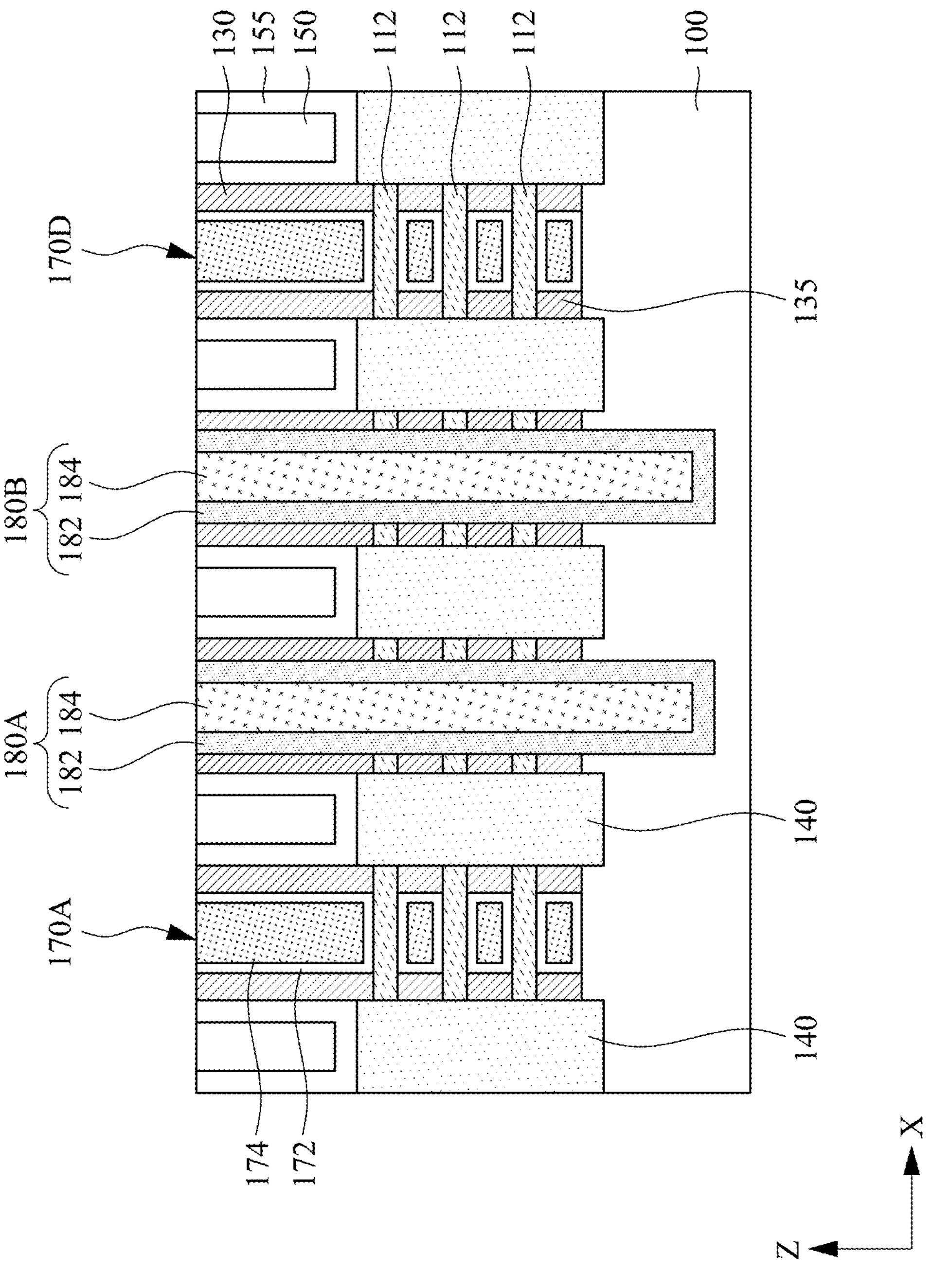
Figure 4A:
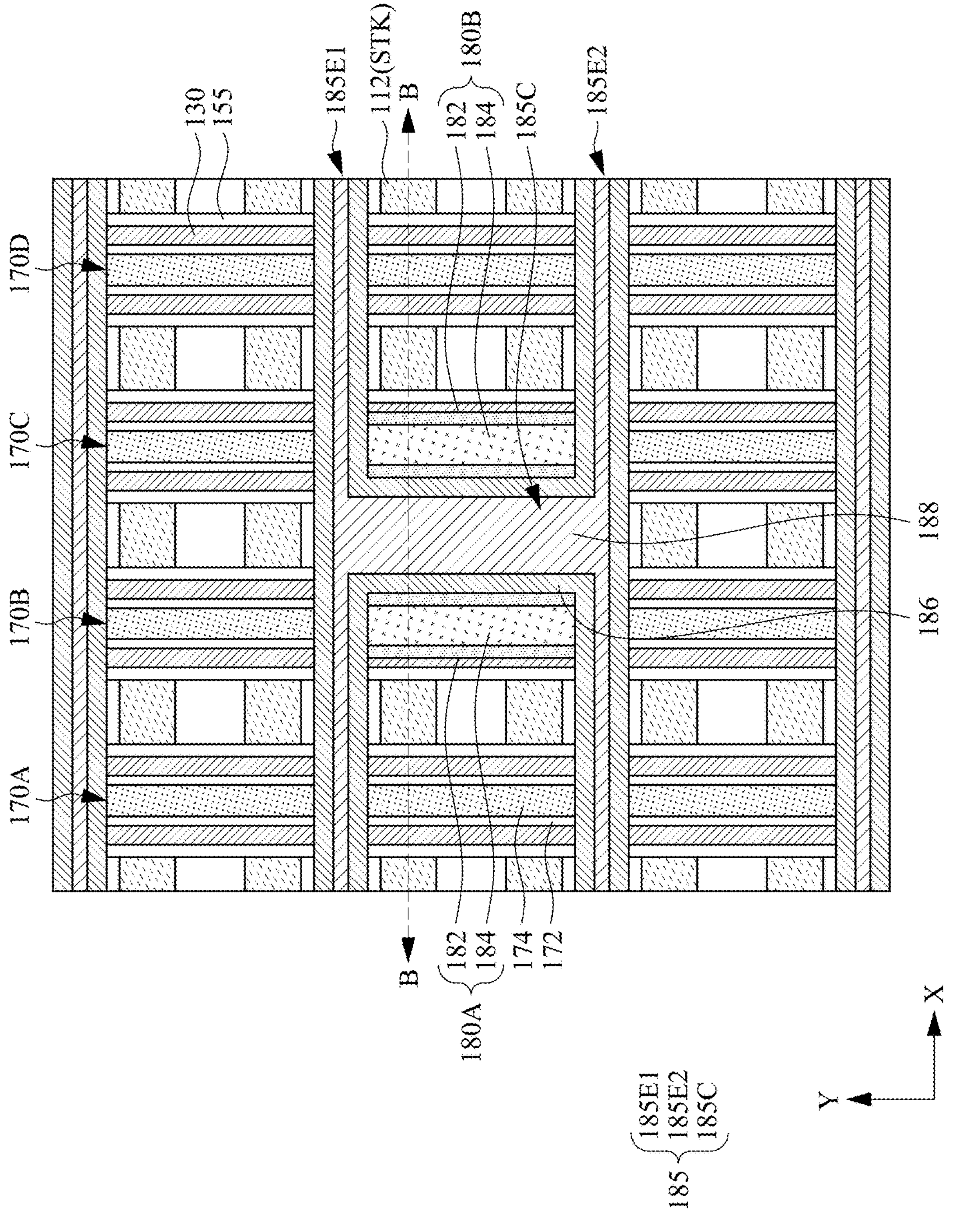
Figure 4B:
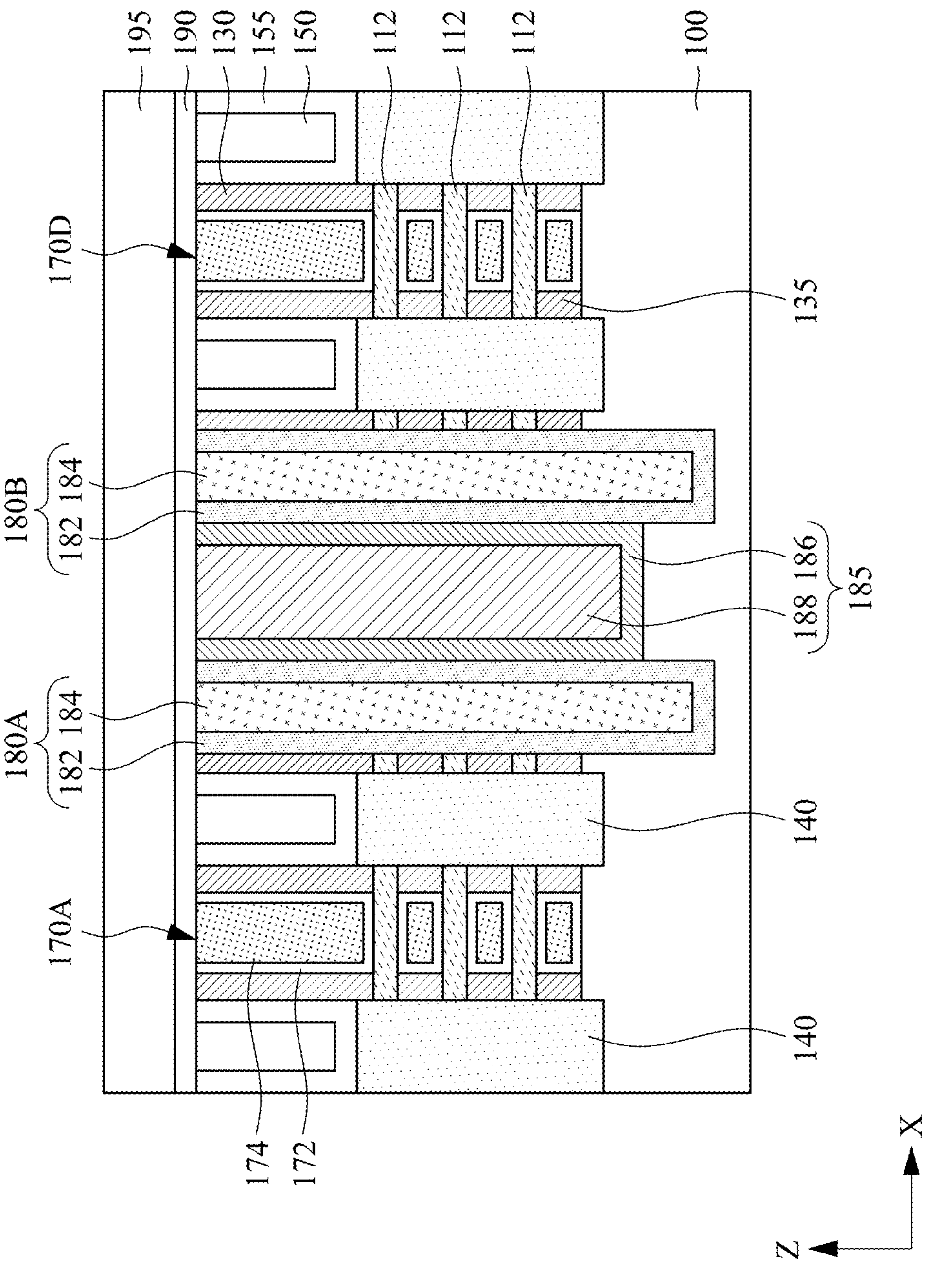

FIGS. 2A to 4B illustrate various stages of manufacturing a semiconductor device in accordance with some embodiments of the present disclosure, in which FIGS. 2A, 3A, and 4A are top views of a semiconductor device, and FIGS. 2B, 3B, and 4B are cross-sectional views along line B-B of the semiconductor device in FIGS. 2A, 3A, and 4A, respectively. In particular, the processes discussed through FIGS. 2A to 4B may be performed on the structure shown in FIGS. 1A and 1B.

Reference is made to FIGS. 2A and 2B. Portions of the dummy gate structures 120B and 120C are replaced with isolation structures 180A and 180B, respectively. In FIG. 2B, each of the isolation structures 180A and 180B may also penetrate through the stack STK of the semiconductor channel layers 112 and the sacrificial layers 114, and extends down into the substrate 100. In some embodiments, each of the isolation structures 180A and 180B may include a dielectric layer 182 and a dielectric layer 184 over the dielectric layer 182. In the top view of FIG. 2A, the dielectric layer 182 may include a rectangular ring-shape top profile that surrounds the dielectric layer 184. Each of the isolation structures 180A and 180B has a lengthwise direction along the second direction (e.g., Y direction). In the cross-sectional view of FIG. 2B, the dielectric layer 182 may extend along opposite sidewalls and bottom surface of the dielectric layer 184.

In some embodiments, the dielectric layers 182 and 184 may include silicon-based dielectric material, such as silicon nitride ($Si_3N_4$), silicon oxide ($SiO_2$), silicon oxycarbide (SiOC), silicon oxynitride (SiON), silicon oxycarbonitride (SiOCN), silicon carbonitride (SiCN), the like, or combinations thereof. In other embodiments, the dielectric layers 182 and 184 may also include high-k dielectric material, such as metal oxide dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), multiple metal content oxide, or the like. In some embodiments, the dielectric layer 182 may be made of a high-k dielectric material, and the dielectric layer 184 may be made of a silicon-based dielectric material. In some other embodiments, the dielectric layer 182 may be omitted. In some embodiments, the isolation structures 180A and 180B are made of a same material.

The isolation structures 180A and 180B may be formed by, for example, forming a mask (not shown) over the substrate 100, the mask having openings exposing unwanted portions of the dummy gate structures 120B and 120C. An etching process is performed to remove the exposed portions of the dummy gate structures 120B and 120C, such that the recesses are formed cutting the dummy gate structures 120B and 120C, respectively. The etching process may also remove portions of the semiconductor channel layers 112, the sacrificial layers 114, and the substrate 100 through the recesses in the dummy gate structures 120B and 120C. The mask is then removed. Afterwards, dielectric materials of the dielectric layers 182 and 184 are sequentially deposited into the recesses, followed by a planarization process, such as CMP, to remove excess dielectric materials of the dielectric layers 182 and 184 until the ILD layer 150 is exposed. The remaining dielectric materials in the recesses are referred to as the isolation structures 180A and 180B, respectively.

Reference is made to FIGS. 3A and 3B. After the isolation structures 180A and 180B are formed. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172. The gate dielectric layer 172 may include an interfacial layer and a high-k dielectric layer over the interfacial layer. In some embodiments, the interfacial layers may be made of oxide, such as aluminum oxide ($Al_2O_3$), silicon oxide ($SiO_2$), or the like. In some embodiments, the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate electrode 174 may include work function metal layer(s) and a filling metal. The work function metal layer may be an n-type or p-type work function layer. Exemplary p-type work function metals include TiN, TaN, Ru, Mo, Al, WN, $ZrSi_2$, $MoSi_2$, $NiSi_2$, WN, other suitable p-type work function materials, or combinations thereof. Exemplary n-type work function metals include Ti, Ag, TaAl, TaAlC, TiAlN, TaC, TaCN, Mn, Zr, other suitable n-type work function materials, or combinations thereof. The work function layer may include a plurality of layers. The filling metal may include tungsten (W), aluminum (Al), copper (Cu), or another suitable conductive material(s).

The metal gate structures 170A, 170B, 170C, and 170D may be formed by, for example, performing an etching process to remove the dummy gate structures 120A, 120B, 120C, and 120D, so as to form gate trenches between each pair of the gate spacers 130. Then, portions of the sacrificial layers 114 exposed through the gate trenches are removed, such that portions of the semiconductor channel layers 112 are suspended over the semiconductor substrate 100. In some embodiments, the sacrificial layers 114 may be removed using suitable etching process. Then, metal gate structures 170A, 170B, 170C, and 170D are formed, for example, by depositing gate materials filling the gate trenches, followed by a planarization process, such as CMP, to remove excess gate materials until the ILD layer 150 is exposed.

As shown in the top view of FIG. 3A, the gate dielectric layer 172 of the metal gate structure 170B is in contact with the dielectric layer 182 of the isolation structure 180A, and the gate dielectric layer 172 of the metal gate structure 170C is in contact with the dielectric layer 182 of the isolation structure 180B. This is because when the dummy gate structures 120B and 120C are removed, the gate trenches may expose sidewalls of the dielectric layers 182 of the isolation structures 180A and 180B, respectively. As a result, the gate dielectric layers 172 of the metal gate structures 170B and 170C may be deposited lining the dielectric layers 182 of the isolation structures 180A and 180B, respectively.

After the metal gate structures 170A, 170B, 170C, and 170D are formed, several transistors are formed. For example, in the cross-sectional view of FIG. 3B, a first transistor may include the semiconductor channel layers 112, the gate structure 170A wrapping around the semiconductor channel layers 112, and source/drain epitaxial structures 140 on opposite sides of the gate structure 170A and in contact with the semiconductor channel layers 112. A second transistor may include the semiconductor channel layers 112, the gate structure 170D wrapping around the semiconductor channel layers 112, and source/drain epitaxial structures 140 on opposite sides of the gate structure 170D and in contact with the semiconductor channel layers 112.

Reference is made to FIGS. 4A and 4B. Isolation structures 185 are formed cutting the metal gate structures 170A, 170B, 170C, and 170D, respectively. In some embodiments, each of the isolation structures 185 may include a dielectric layer 186 and a dielectric layer 188 over the dielectric layer 186. In the top view of FIG. 4A, the dielectric layer 188 may surround the dielectric layer 188. In the cross-sectional view of FIG. 4B, the dielectric layer 186 may extend along opposite sidewalls and bottom surface of the dielectric layer 188.

In the top view of FIG. 4A, at least one of the isolation structures 185 may include two extension portions 185E1 and 185E2 separated from each other, and a connection portion 185C connecting the extension portions 185E1 and 185E2. The extension portions 185E1 and 185E2 have a lengthwise direction along the first direction (e.g., X direction), and the connection portion 185C has a lengthwise direction along the second direction (e.g., Y direction). That is, the isolation structure 185 may include an H-shape top profile. Moreover, the isolation structures 180A and 180B are in contact with and on opposite sides of the connection portion 185C of the isolation structure 185. The isolation structures 180A and 180B are also in contact with the extension portions 185E1 and 185E2 of the isolation structure 185.

In some embodiments, the dielectric layers 186 and 188 may include silicon-based dielectric material, such as silicon nitride ($Si_3N_4$), silicon oxide ($SiO_2$), silicon oxycarbide (SiOC), silicon oxynitride (SiON), silicon oxycarbonitride (SiOCN), silicon carbonitride (SiCN), the like, or combinations thereof. In other embodiments, the dielectric layers 182 and 184 may also include high-k dielectric material, such as metal oxide dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), multiple metal content oxide, or the like. In some embodiments, the dielectric layer 186 may be made of a high-k dielectric material, and the dielectric layer 188 may be made of a silicon-based dielectric material. In some other embodiments, the dielectric layer 186 may be omitted. In some embodiments, the dielectric layer 186 of the isolation structure 185 may include a same material as the dielectric layer 182 of the isolation structures 180A and 180B, and the dielectric layer 188 of the isolation structure 185 may include a same material as the dielectric layer 184 of the isolation structures 180A and 180B. That is, the isolation structure 185 may include a same material as the isolation structures 180A and 180B.

The isolation structures 185 may be formed by, for example, forming a mask (not shown) over the substrate 100, the mask having openings exposing unwanted portions of the metal gate structures 170A, 170B, 170C, and 170D, the ILD layer 150, the CESL 155, the semiconductor channel layers 112, the sacrificial layers 114, and the source/drain epitaxial structures 140. An etching process is performed to remove the unwanted portions of the metal gate structures 170A, 170B, 170C, and 170D, the ILD layer 150, the CESL 155, the semiconductor channel layers 112, the sacrificial layers 114, and the source/drain epitaxial structures 140, such that the recesses are formed. The mask is then removed. Afterwards, dielectric materials of the dielectric layers 186 and 188 are sequentially deposited into the recesses, followed by a planarization process, such as CMP, to remove excess dielectric materials of the dielectric layers 186 and 188 until the ILD layer 150 is exposed. The remaining dielectric materials in the recesses are referred to as the isolation structures 185, respectively. In some embodiments, after the planarization process, top surfaces of the isolation structures 180A, 180B, 185, and metal gate structures 170A to 170D, the ILD layer 150 may be substantially level with each other.

In the top view of FIG. 4A, both of the dielectric layers 182 and 184 of the isolation structures 180A and 180B may be in contact with the isolation structure 185. This is because the isolation structures 185 are formed after the formation of the isolation structures 180A and 180B. For example, during forming the isolation structure 185, recesses may be formed cutting portions of the isolation structures 180A and 180B, and portions of the dielectric layers 182 of the isolation structures 180A and 180B may be removed to expose sidewalls of the dielectric layers 184 of the isolation structures 180A and 180B from the top view. Accordingly, the isolation structure 185 may be formed lining the exposed sidewalls of the dielectric layers 184 of the isolation structures 180A and 180B, and the resulting structure is shown in FIG. 4A. From another aspect, in the top view of FIG. 4A, the dielectric layer 182 of the isolation structures 180A (or 180B) may include two separated portions on opposite ends of the dielectric layer 184 of the isolation structures 180A (or 180B). In the cross-sectional view of FIG. 4B, bottom surfaces of the isolation structures 180A and 180B may be lower than bottom surface of the isolation structure 185.

Moreover, in the top view of FIG. 4A, both the gate dielectric layers 172 and the gate electrodes 174 of the metal gate structures 170A, 170B, 170C, and 170D may be in contact with the isolation structure 185. This is because the isolation structure 185 is formed after the formation of the metal gate structures 170A, 170B, 170C, and 170D. For example, during forming the isolation structures 185, recesses may be formed cutting portions of the metal gate structures 170A, 170B, 170C, and 170D to expose sidewalls of the gate electrodes 174 from the top view. Accordingly, the isolation structures 185 may be formed in contact with the exposed sidewalls of the gate electrodes 174 of the metal gate structures 170A, 170B, 170C, and 170D, and the resulting structure is shown in FIG. 4A.

In FIG. 4B, a contact etch stop layer (CESL) 190 is formed over the ILD layer 150 and covering the metal gate structures 170A, 170B, 170C, and 170D, and the isolation structures 180A, 180B, and 185. Then, an interlayer dielectric (ILD) layer 195 is formed over the CESL 190. Materials and formation methods of the ILD layer 195 and the CESL 190 may be similar to those described with respect to the ILD layer 150 and the CESL 155, and thus relevant details will not be repeated for brevity.

Figure 5A:
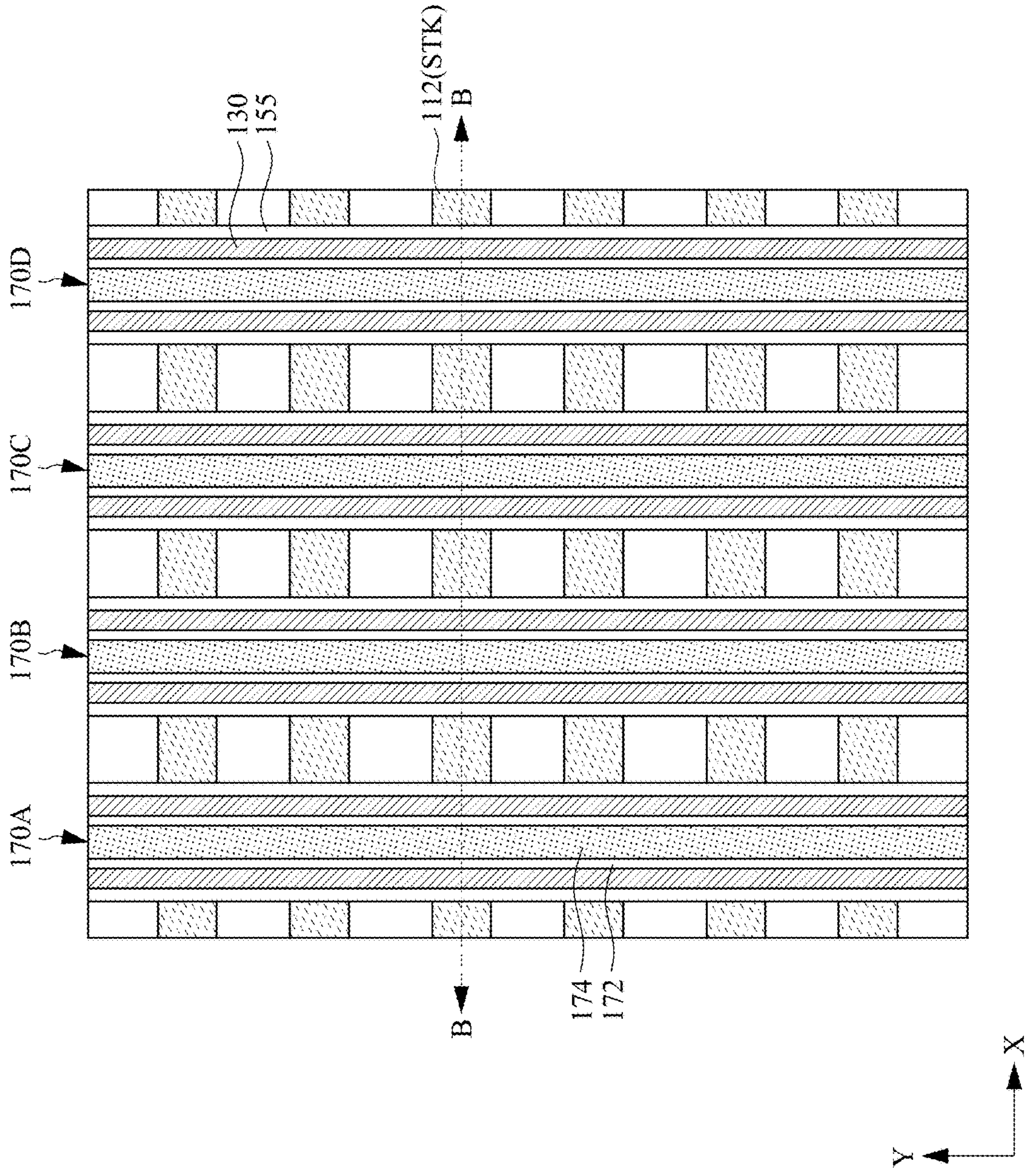
FIGS. 5A to 7B illustrate various stages of manufacturing a semiconductor device in accordance with some embodiments of the present disclosure.
Figure 5B:
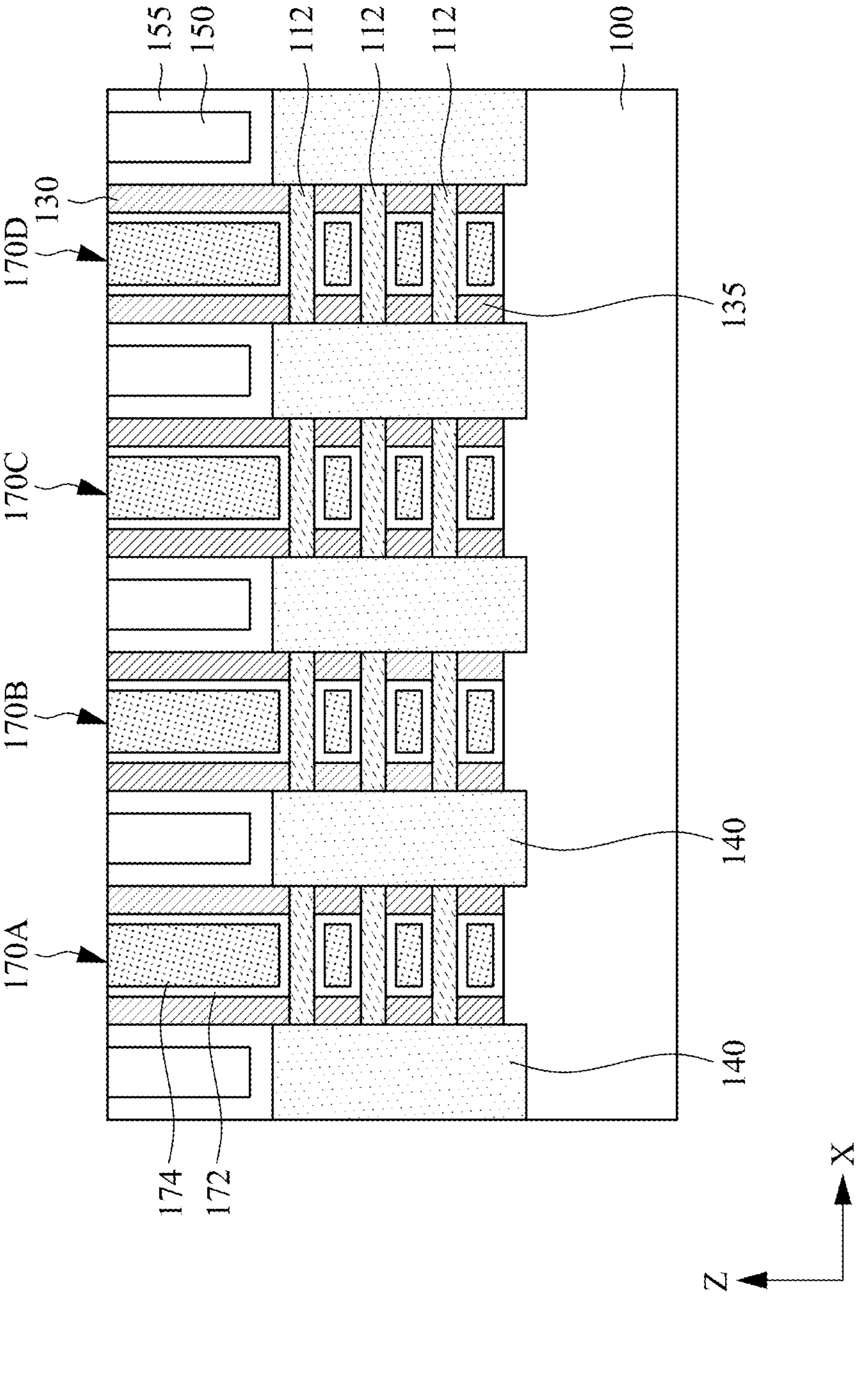
Figure 6A:
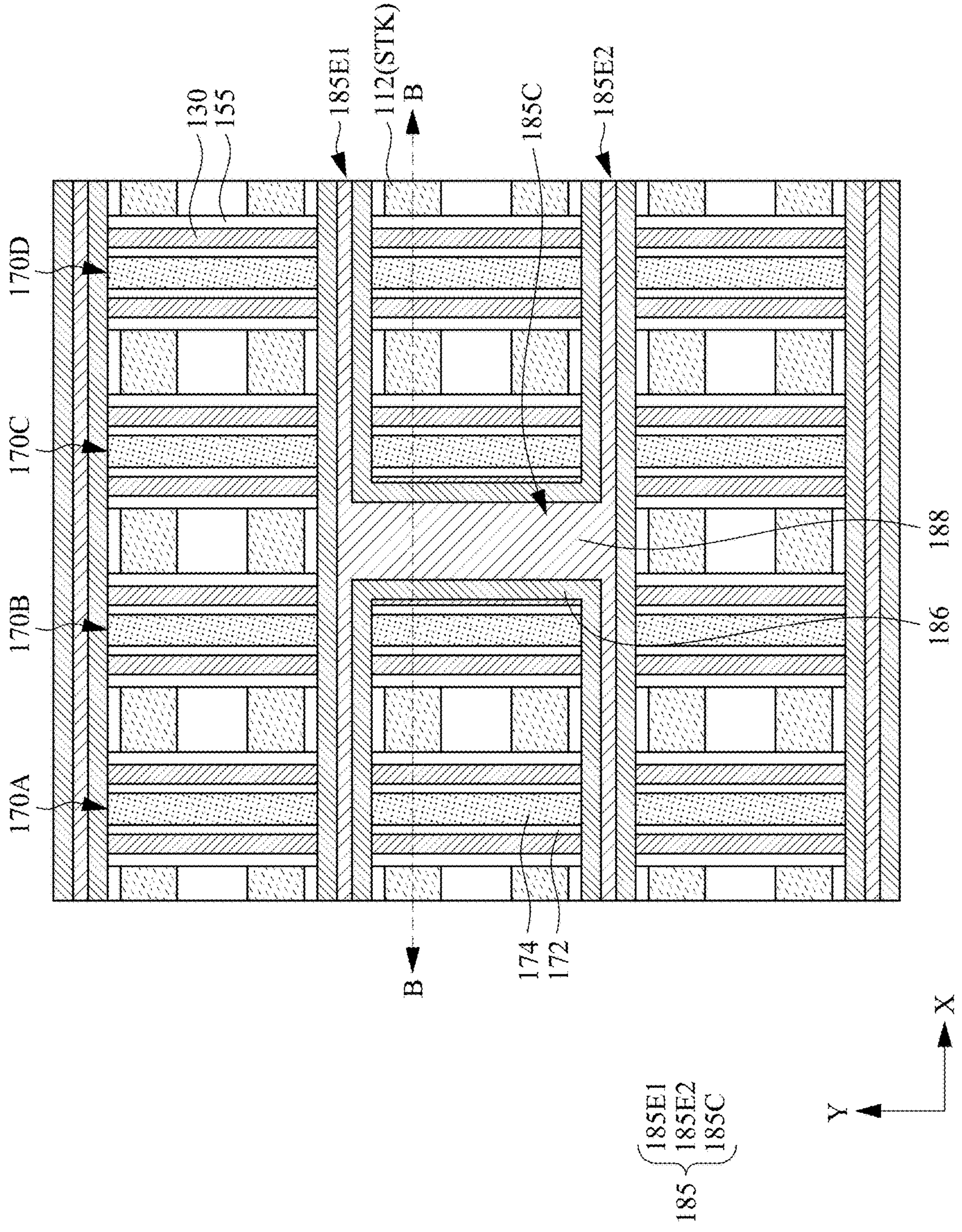
Figure 6B:
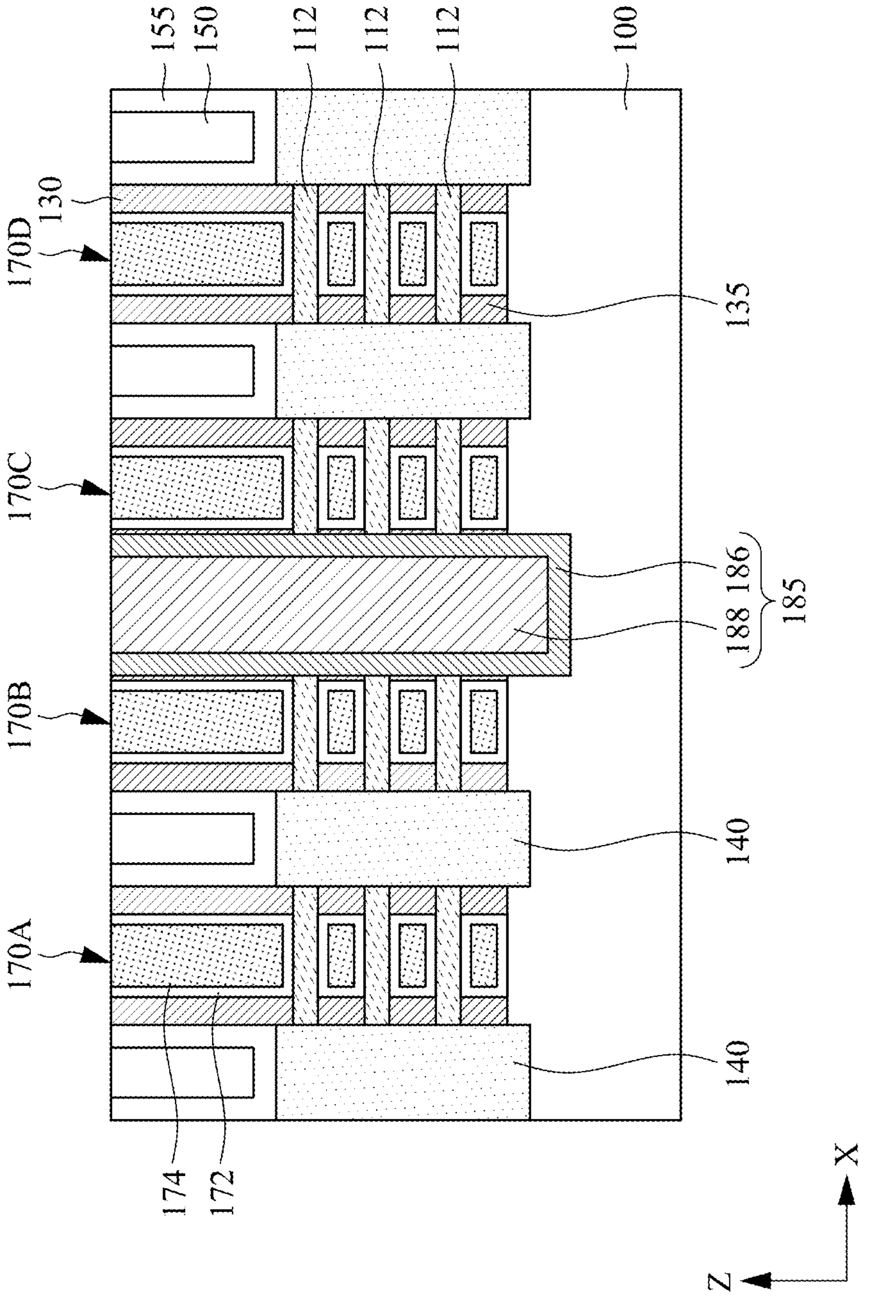
Figure 7A:
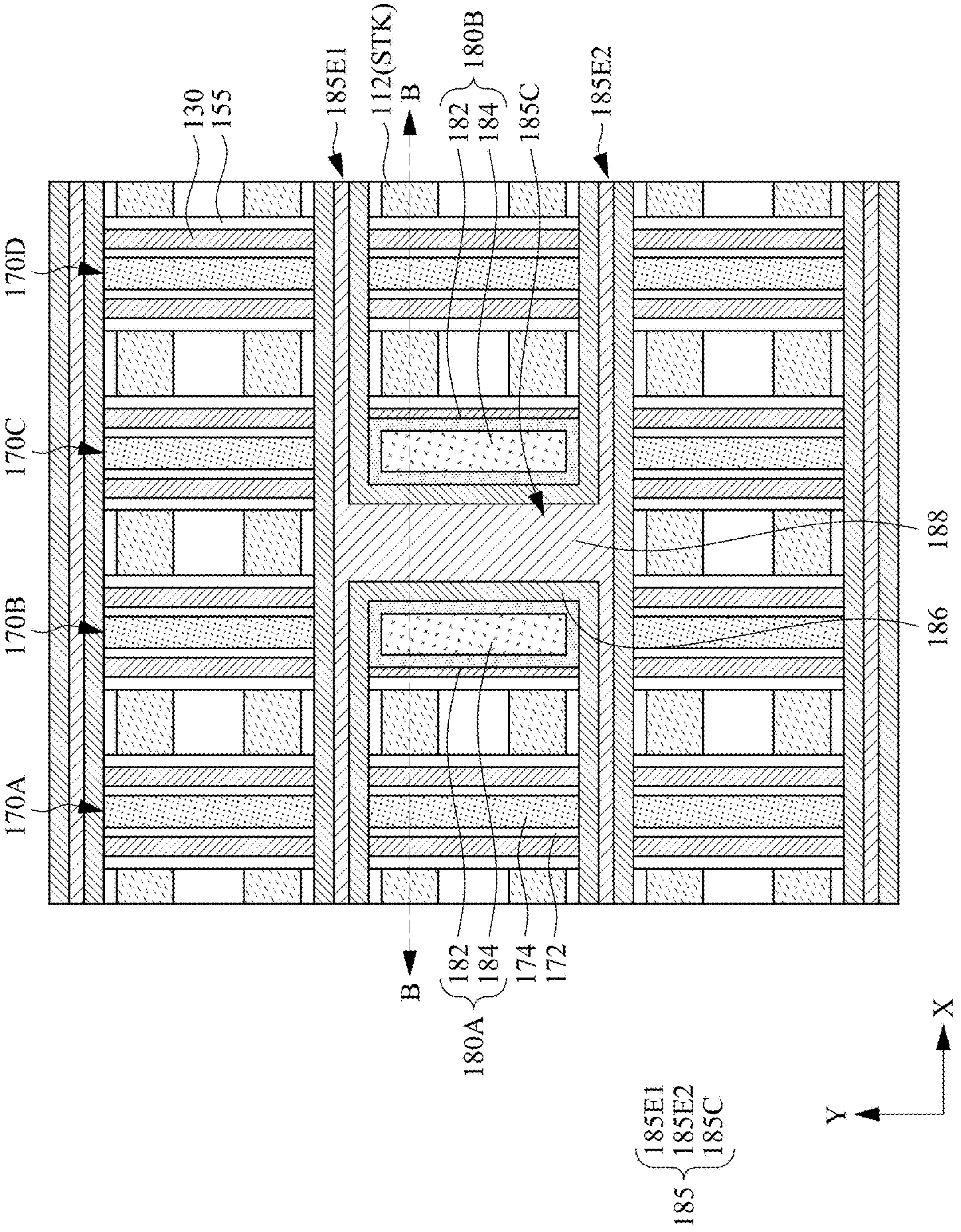
Figure 7B:
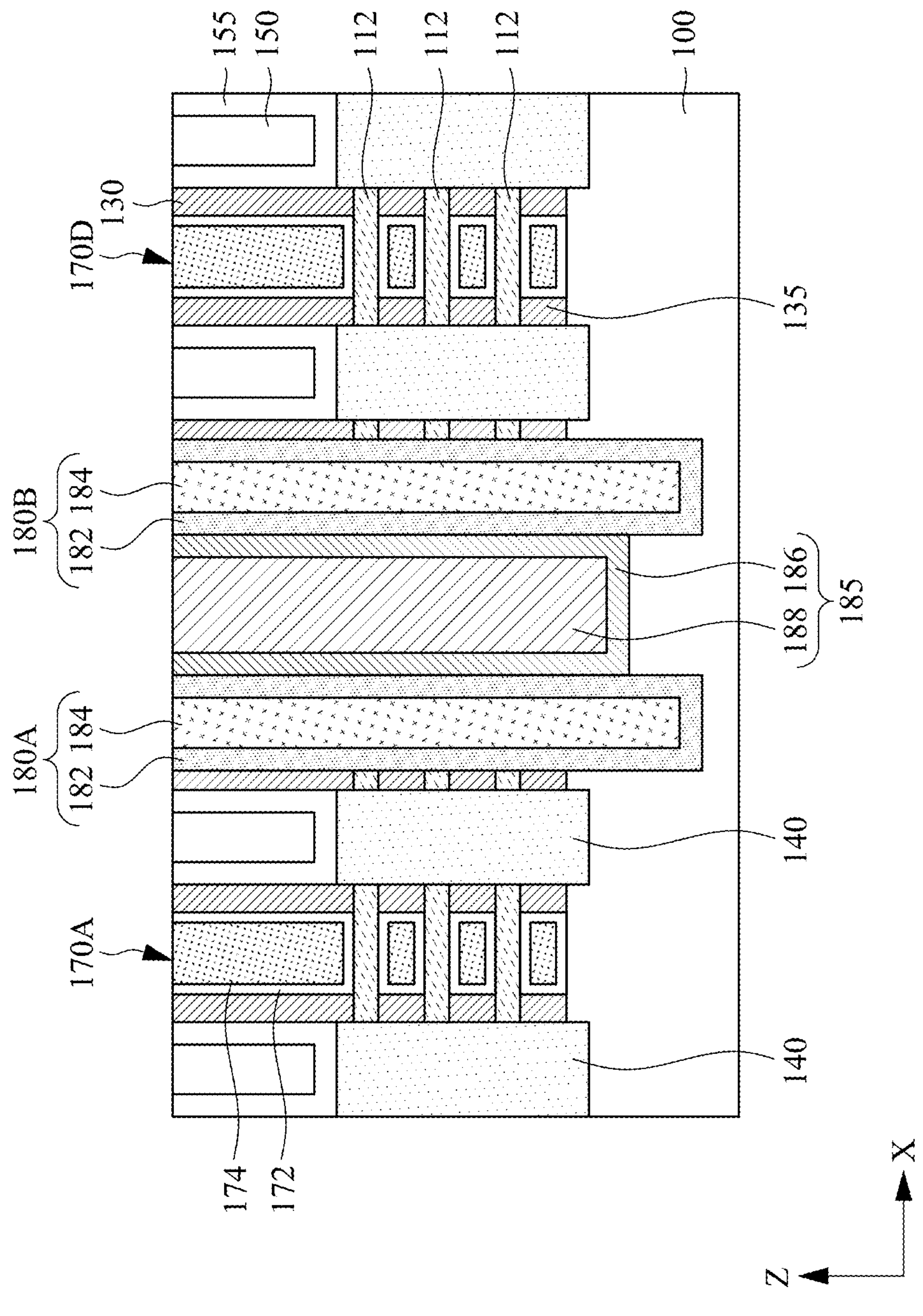

FIGS. 5A to 7B illustrate various stages of manufacturing a semiconductor device in accordance with some embodiments of the present disclosure, in which FIGS. 5A, 6A, and 7A are top views of a semiconductor device, and FIGS. 5B, 6B, and 7B are cross-sectional views along line B-B of the semiconductor device in FIGS. 5A, 6A, and 7A, respectively. In particular, the processes discussed through FIGS. 5A to 7B may be performed on the structure shown in FIGS. 1A and 1B. It is noted that some elements and processes described through FIGS. 5A to 7B may be similar to those described with respect to FIGS. 2A to 4B, similar elements are labeled the same, and relevant details will not be repeated for brevity.

Reference is made to FIGS. 5A and 5B. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172.

Reference is made to FIGS. 6A and 6B. Isolation structures 185 are formed cutting the metal gate structures 170A, 170B, 170C, and 170D, respectively. In some embodiments, each of the isolation structures 185 may include a dielectric layer 186 and a dielectric layer 188 over the dielectric layer 186.

The isolation structures 185 may be formed by, for example, forming a mask (not shown) over the substrate 100, the mask having openings exposing unwanted portions of the metal gate structures 170A, 170B, 170C, and 170D, the ILD layer 150, the CESL 155, the semiconductor channel layers 112, the sacrificial layers 114, and the source/drain epitaxial structures 140. An etching process is performed to remove the unwanted portions of the metal gate structures 170A, 170B, 170C, and 170D, the ILD layer 150, the CESL 155, the semiconductor channel layers 112, the sacrificial layers 114, and the source/drain epitaxial structures 140, such that the recesses are formed. The mask is then removed. Afterwards, dielectric materials of the dielectric layers 186 and 188 are sequentially deposited into the recesses, followed by a planarization process, such as CMP, to remove excess dielectric materials of the dielectric layers 186 and 188 until the ILD layer 150 is exposed. The remaining dielectric materials in the recesses are referred to as the isolation structures 185, respectively.

Reference is made to FIGS. 7A and 7B. Portions of the metal gate structures 170B and 170C are replaced with isolation structures 180A and 180B, respectively. In some embodiments, each of the isolation structures 180A and 180B may include a dielectric layer 182 and a dielectric layer 184 over the dielectric layer 182.

The isolation structures 180A and 180B may be formed by, for example, forming a mask (not shown) over the substrate 100, the mask having openings exposing unwanted portions of the metal gate structures 170B and 170C. An etching process is performed to remove the exposed portions of the metal gate structures 170B and 170C, such that the recesses are formed cutting the metal gate structures 170B and 170C, respectively. The etching process may also remove portions of the semiconductor channel layers 112 wrapped by the metal gate structures 170B and 170C. The mask is then removed. Afterwards, dielectric materials of the dielectric layers 182 and 184 are sequentially deposited into the recesses, followed by a planarization process, such as CMP, to remove excess dielectric materials of the dielectric layers 182 and 184 until the ILD layer 150 is exposed. The remaining dielectric materials in the recesses are referred to as the isolation structures 180A and 180B, respectively. In some embodiments, after the planarization process, top surfaces of the isolation structures 180A, 180B, 185, and metal gate structures 170A to 170D, the ILD layer 150 may be substantially level with each other.

In the top view of FIG. 7A, the dielectric layers 182 of the isolation structures 180A and 180B may include a rectangular ring-shape top profile that surrounds the respective dielectric layer 184. Moreover, the dielectric layers 184 of the isolation structures 180A and 180B may be separated from the isolation structure 185 through the respective dielectric layers 182. This is because the isolation structures 180A and 180B are formed after the formation of the isolation structures 185. For example, during forming the isolation structure 180A and 180B, recesses may be formed cutting portions of the metal gate structures 170B and 180C to expose sidewalls of the isolation structure 185 from the top view. Accordingly, the dielectric layer 182 of the isolation structures 180A and 180B may be formed lining the exposed sidewalls of the isolation structure 185, and the resulting structure is shown in FIG. 7A.

Moreover, in the top view of FIG. 7A, both the gate dielectric layers 172 and the gate electrodes 174 of the metal gate structures 170A, 170B, 170C, and 170D may be in contact with the isolation structure 185. This is because the isolation structures 185 are formed after the formation of the metal gate structures 170A, 170B, 170C, and 170D.

Figure 8A:
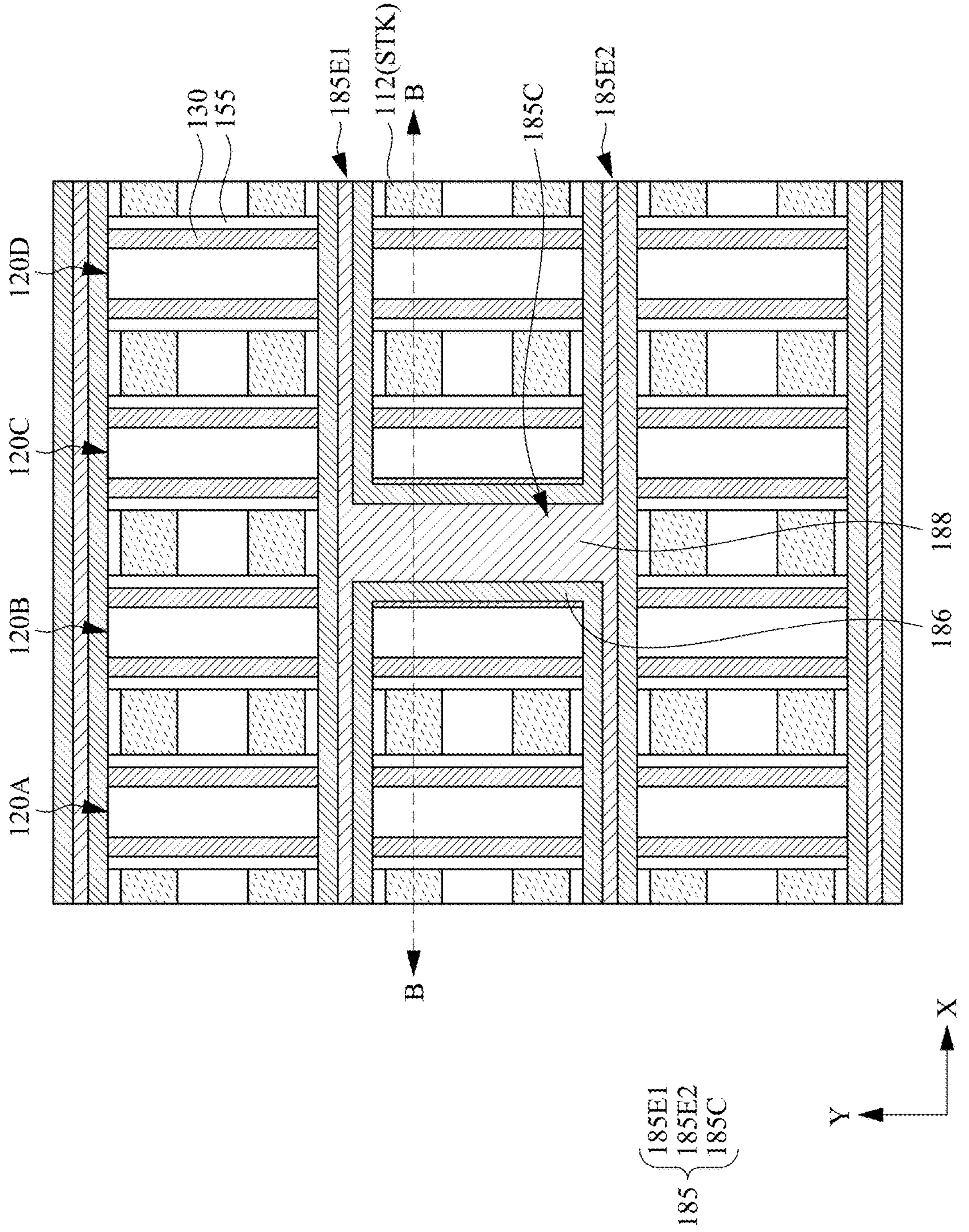
FIGS. 8A to 10B illustrate various stages of manufacturing a semiconductor device in accordance with some embodiments of the present disclosure.
Figure 8B:
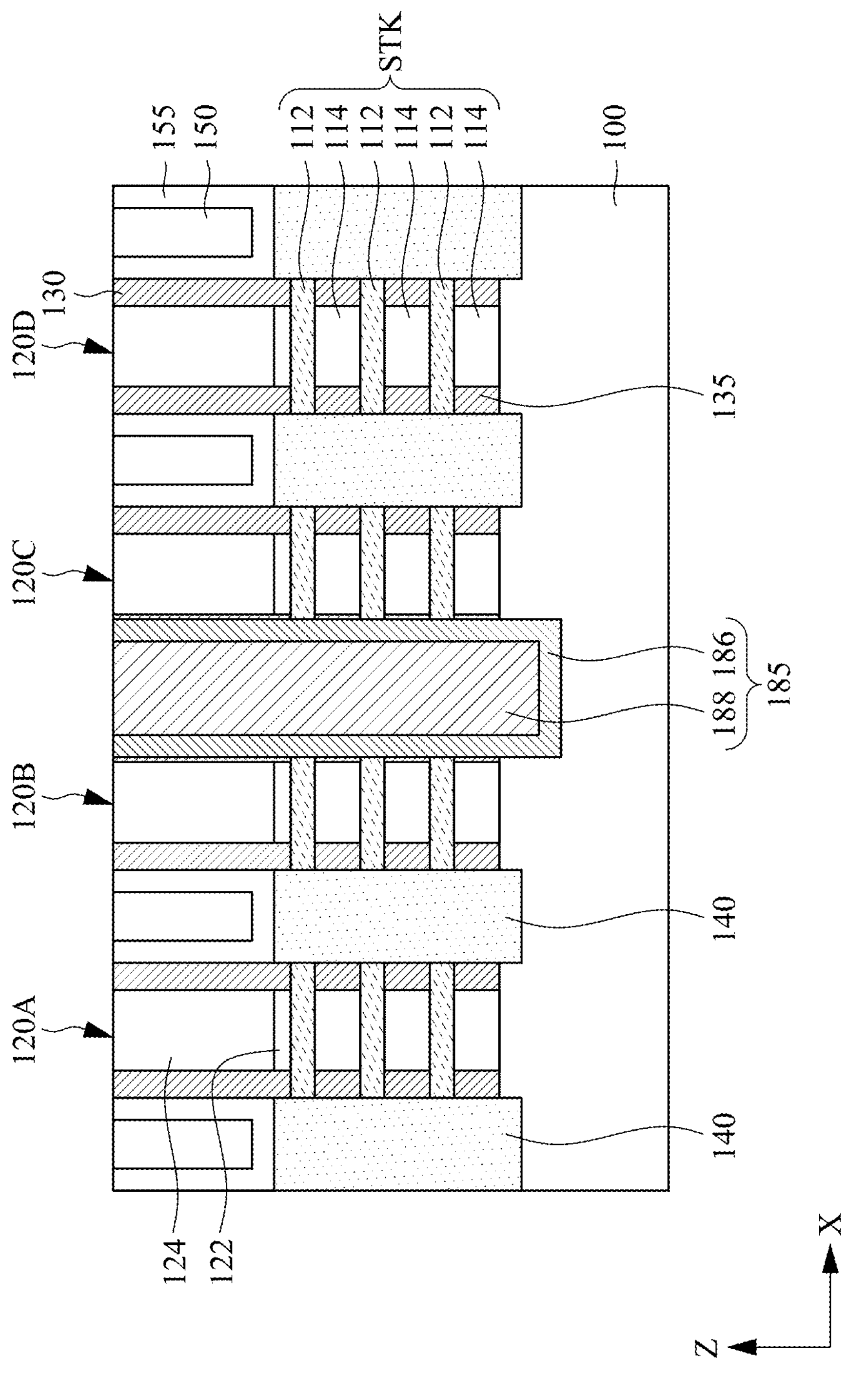
Figure 9A:
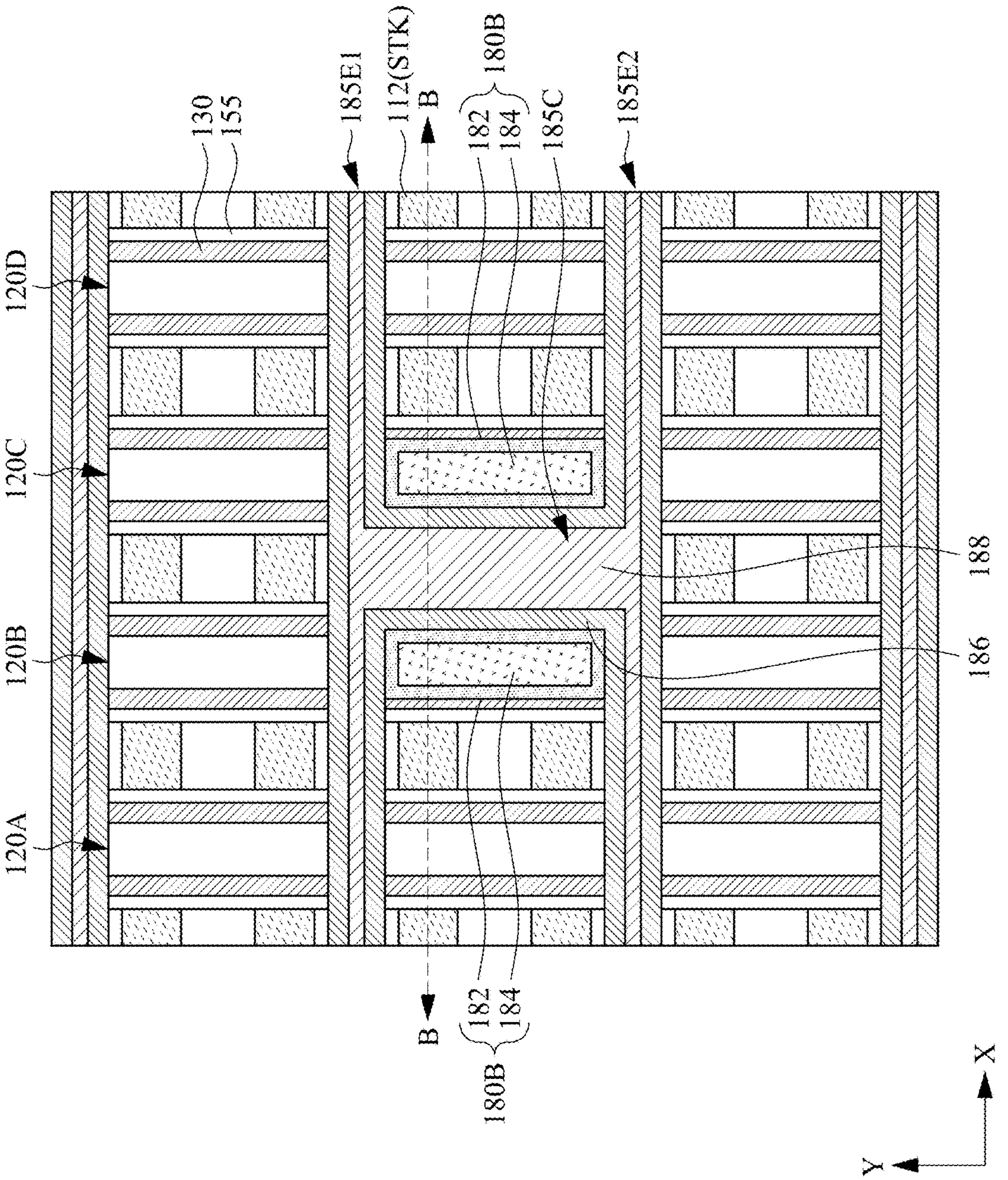
Figure 9B:
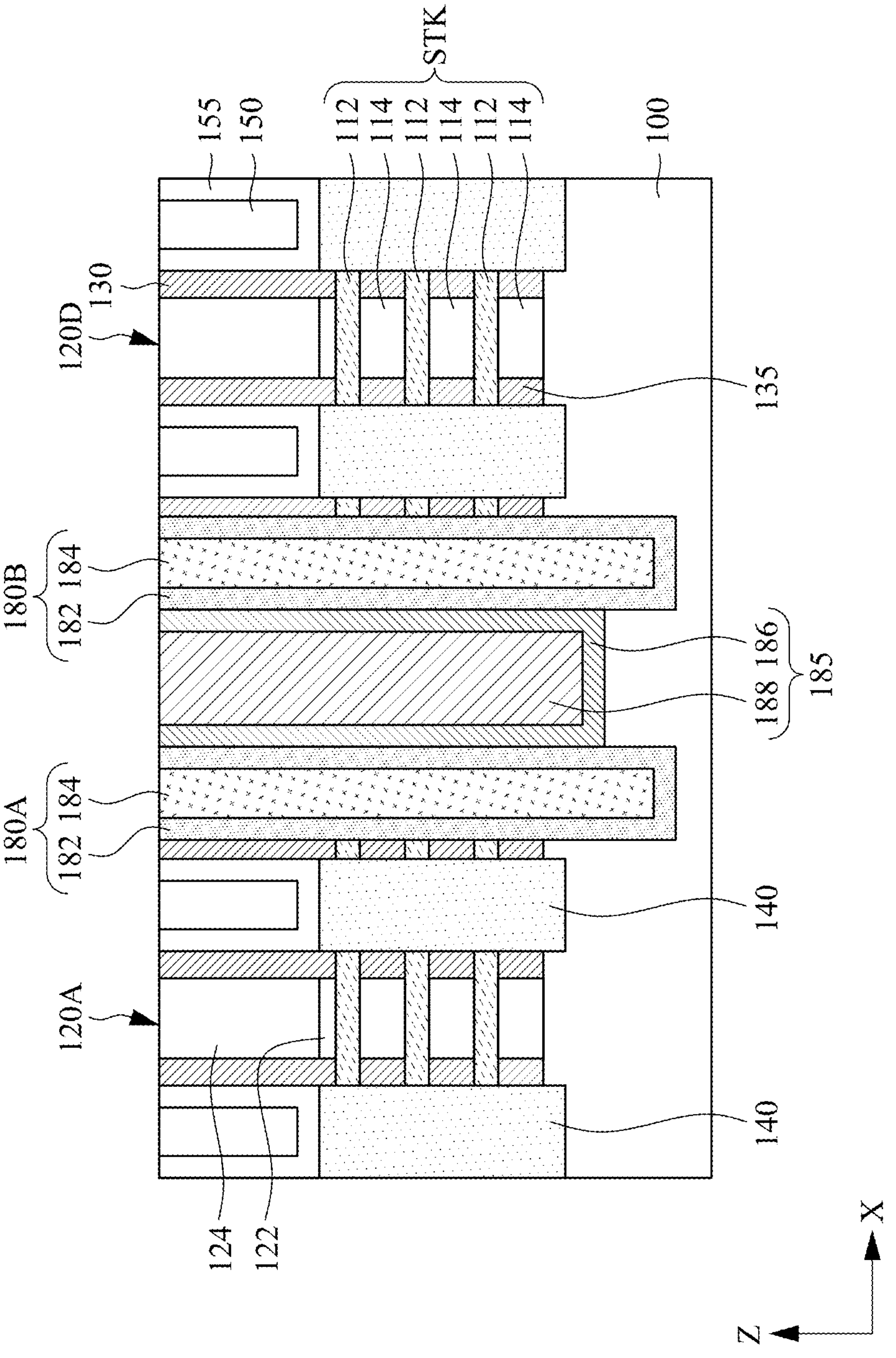
Figure 10A:
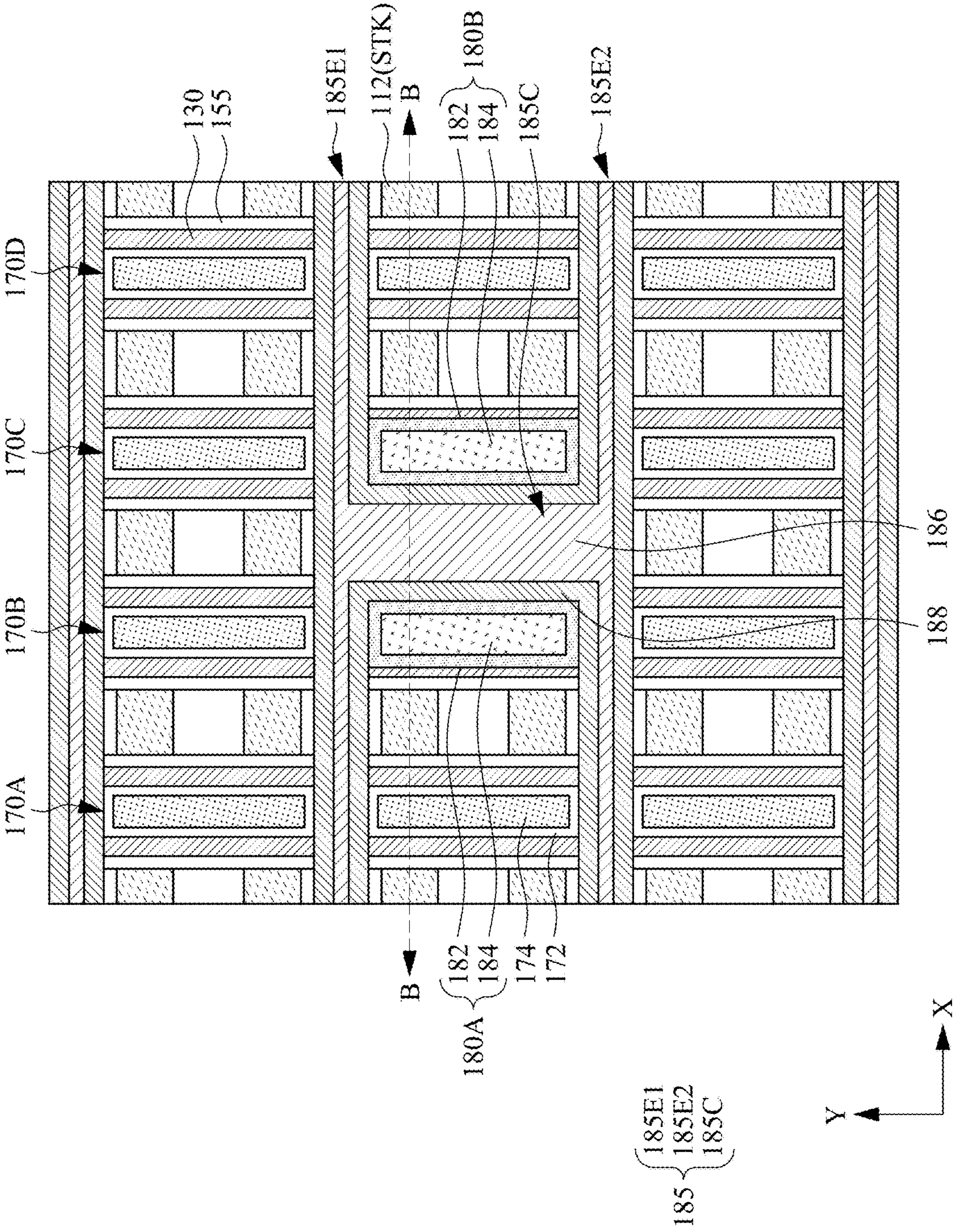
Figure 10B:
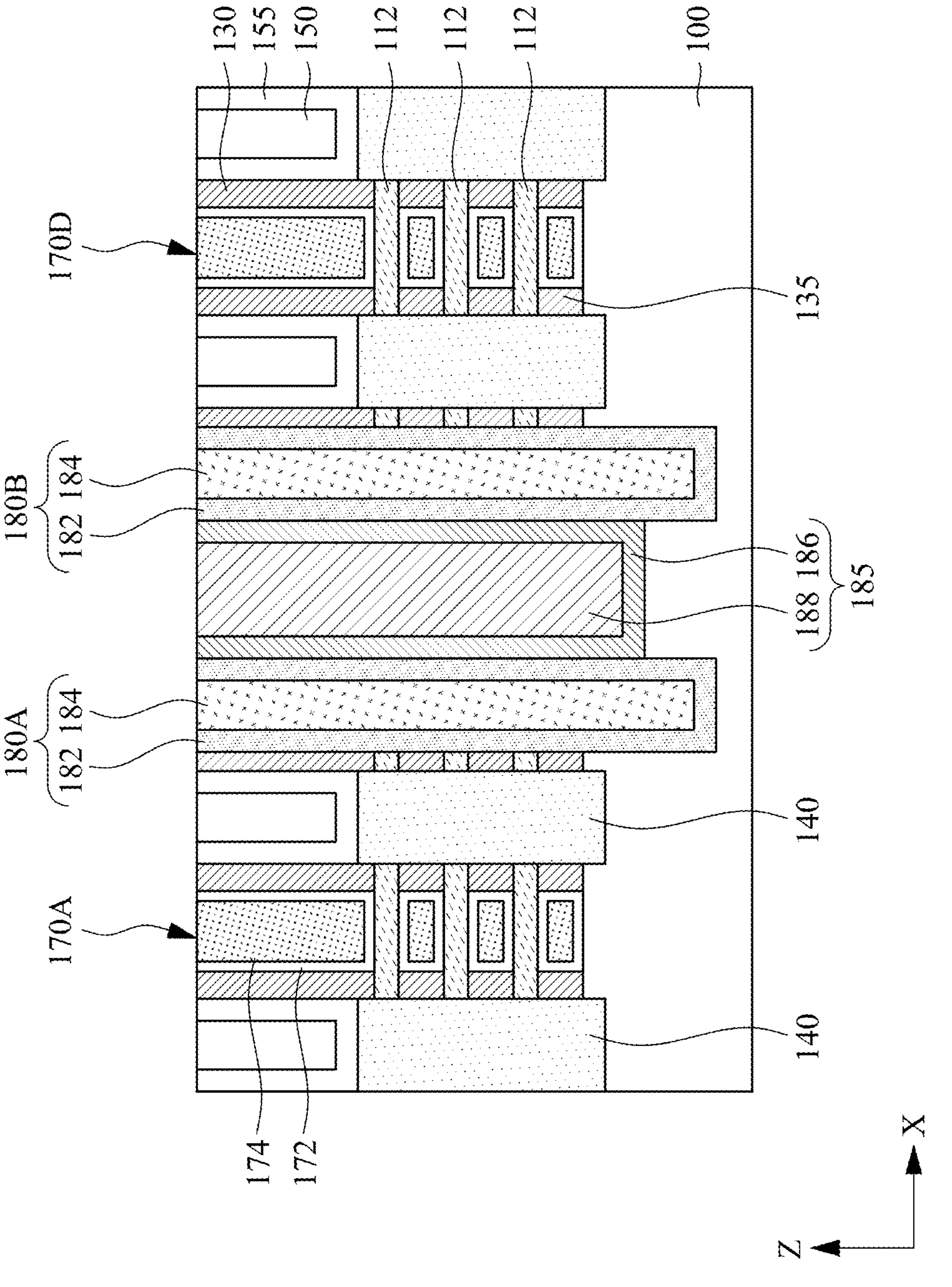

FIGS. 8A to 10B illustrate various stages of manufacturing a semiconductor device in accordance with some embodiments of the present disclosure, in which FIGS. 8A, 9A, and 10A are top views of a semiconductor device, and FIGS. 8B, 9B, and 10B are cross-sectional views along line B-B of the semiconductor device in FIGS. 8A, 9A, and 10A, respectively. In particular, the processes discussed through FIGS. 8A to 10B may be performed on the structure shown in FIGS. 1A and 1B. It is noted that some elements and processes described through FIGS. 8A to 10B may be similar to those described with respect to FIGS. 2A to 4B, similar elements are labeled the same, and relevant details will not be repeated for brevity.

Reference is made to FIGS. 8A and 8B. Isolation structures 185 are formed cutting the dummy gate structures 120A, 120B, 120C, and 120D, respectively. In some embodiments, each of the isolation structures 185 may include a dielectric layer 186 and a dielectric layer 188 over the dielectric layer 186.

The isolation structures 185 may be formed by, for example, forming a mask (not shown) over the substrate 100, the mask having openings exposing unwanted portions of the dummy gate structures 120A, 120B, 120C, and 120D, the ILD layer 150, the CESL 155, the semiconductor channel layers 112, the sacrificial layers 114, and the source/drain epitaxial structures 140. An etching process is performed to remove the unwanted portions of the dummy gate structures 120A, 120B, 120C, and 120D, the ILD layer 150, the CESL 155, the semiconductor channel layers 112, the sacrificial layers 114, and the source/drain epitaxial structures 140, such that the recesses are formed. The mask is then removed. Afterwards, dielectric materials of the dielectric layers 186 and 188 are sequentially deposited into the recesses, followed by a planarization process, such as CMP, to remove excess dielectric materials of the dielectric layers 186 and 188 until the ILD layer 150 is exposed. The remaining dielectric materials in the recesses are referred to as the isolation structures 185, respectively.

Reference is made to FIGS. 9A and 9B. Portions of the dummy gate structures 120B and 120C are replaced with isolation structures 180A and 180B, respectively. In some embodiments, each of the isolation structures 180A and 180B may include a dielectric layer 182 and a dielectric layer 184 over the dielectric layer 182.

Reference is made to FIGS. 10A and 10B. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172.

In the top view of FIG. 10A, the dielectric layers 182 of the isolation structures 180A and 180B may include a rectangular ring-shape top profile that surrounds the respective dielectric layer 184. Moreover, the dielectric layers 184 of the isolation structures 180A and 180B may be separated from the isolation structure 185 through the respective dielectric layers 182. This is because the isolation structures 180A and 180B are formed after the formation of the isolation structures 185. Relevant details have been described above, and will not be repeated for brevity.

In the top view of FIG. 10A, the gate electrodes 174 of the metal gate structures 170A, 170B, 170C, and 170D may be separated from the isolation structure 185 through the respective gate dielectric layers 172. This is because the metal gate structures 170A, 170B, 170C, and 170D are formed after the formation of the isolation structures 185. For example, during forming the metal gate structures 170A, 170B, 170C, and 170D, gate trenches may be formed by removing the dummy gate structures 120A, 120B, 120C, and 120D. The gate trenches may expose sidewalls of the isolation structure 185, and the gate dielectric layers 172 may be formed lining the exposed sidewalls of the isolation structure 185, and the resulting structure is shown in FIG. 10A.

Figure 11A:
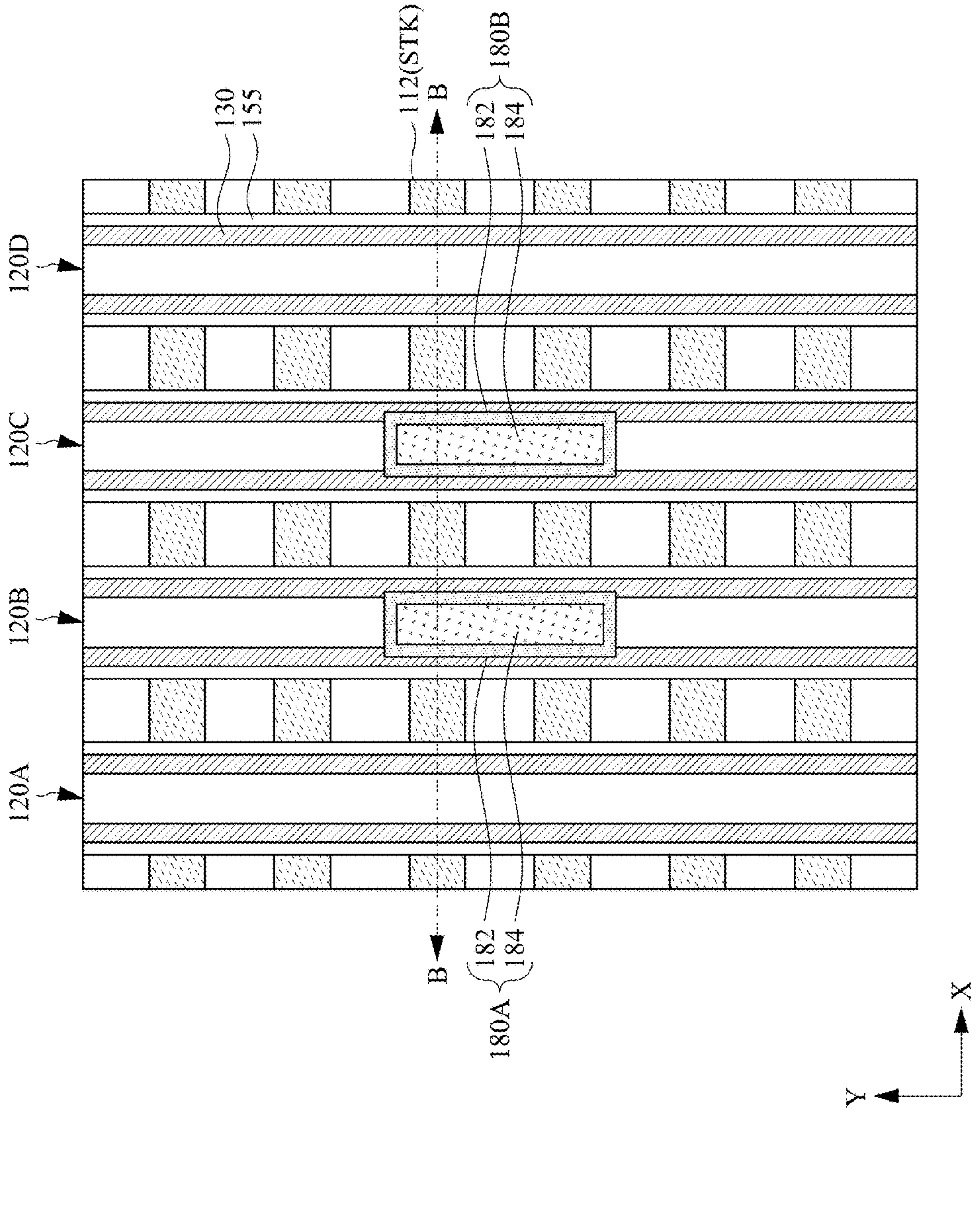
FIGS. 11A to 13B illustrate various stages of manufacturing a semiconductor device in accordance with some embodiments of the present disclosure.
Figure 11B:
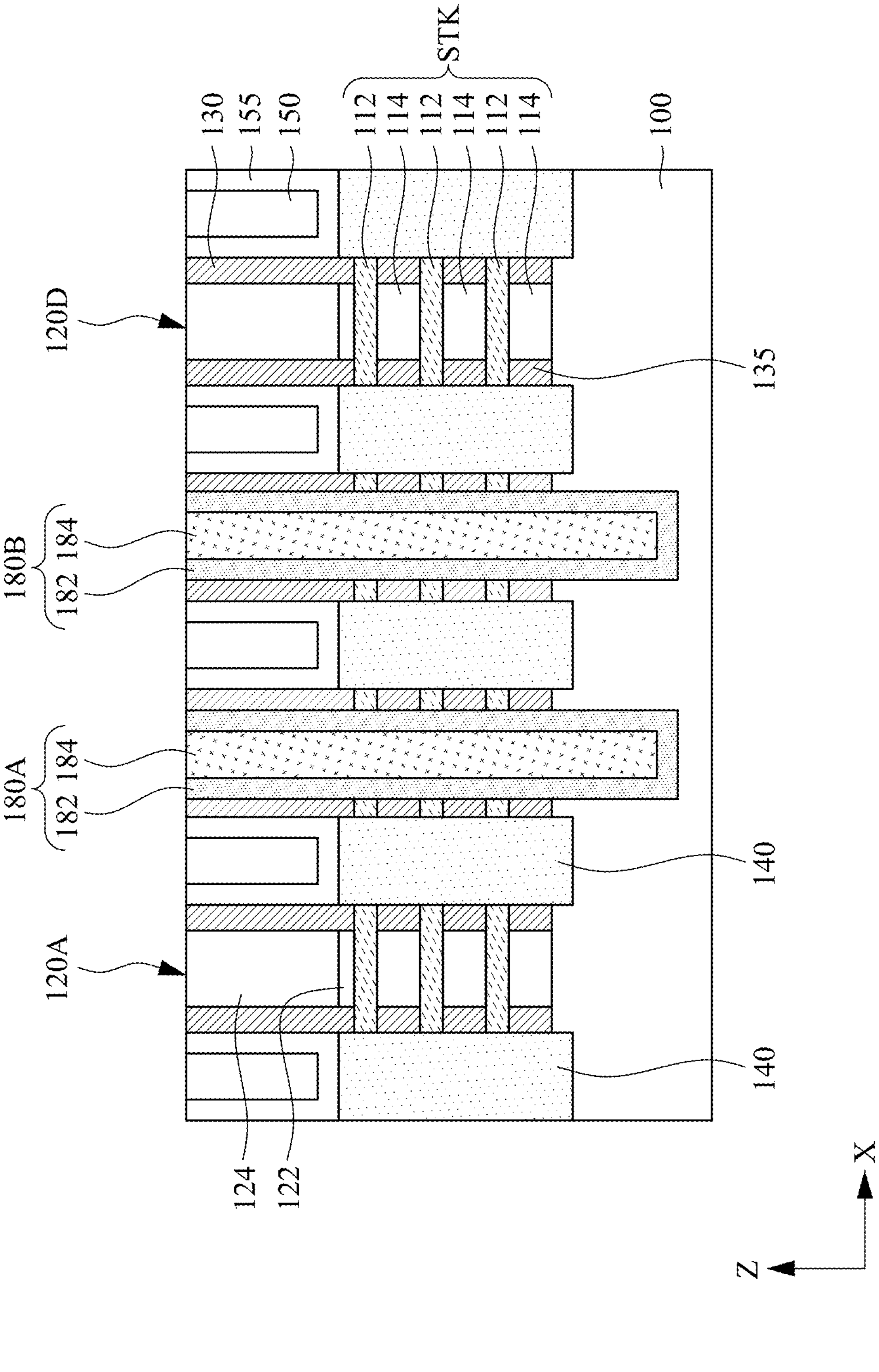
Figure 12A:
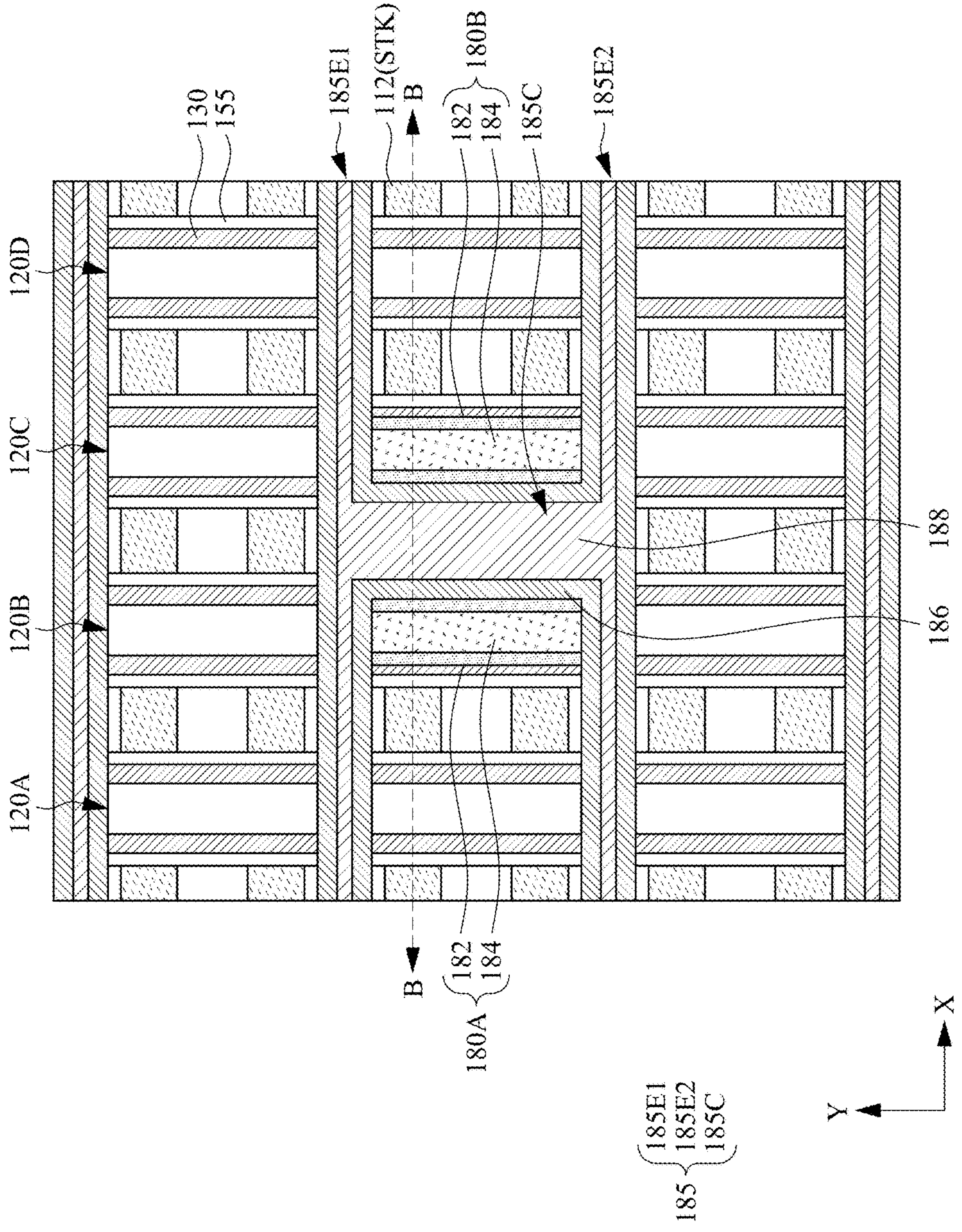
Figure 12B:
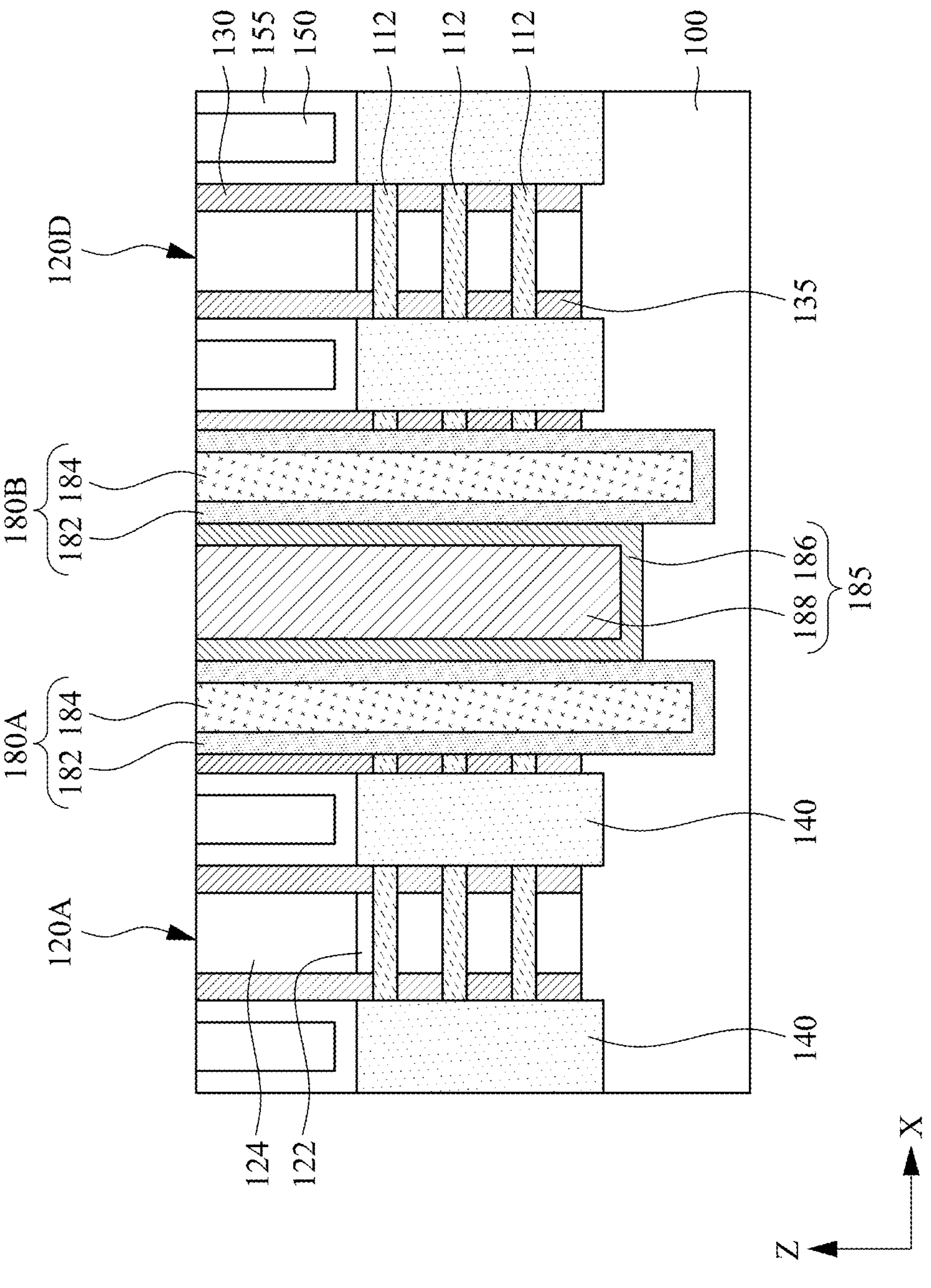
Figure 13A:
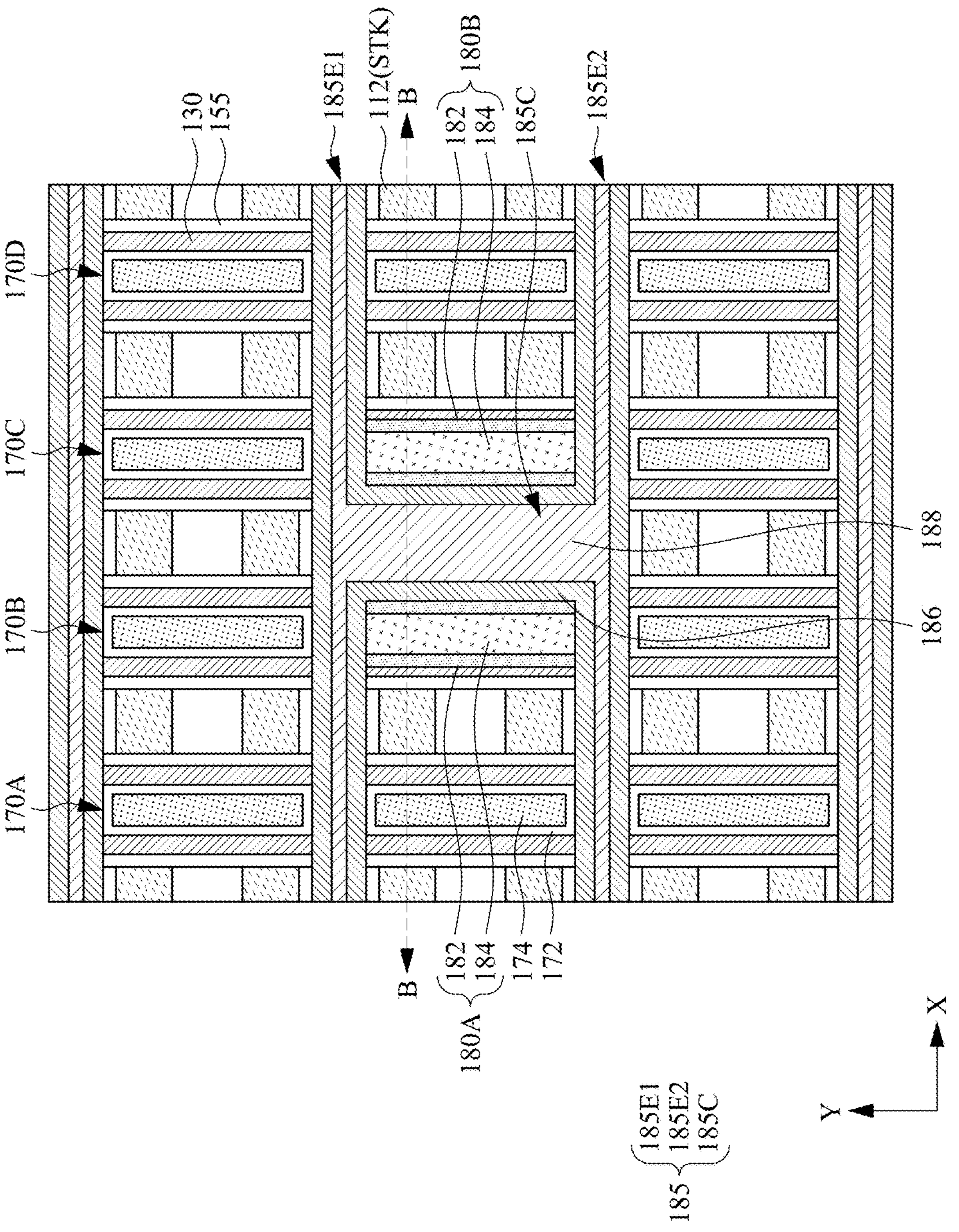
Figure 13B:
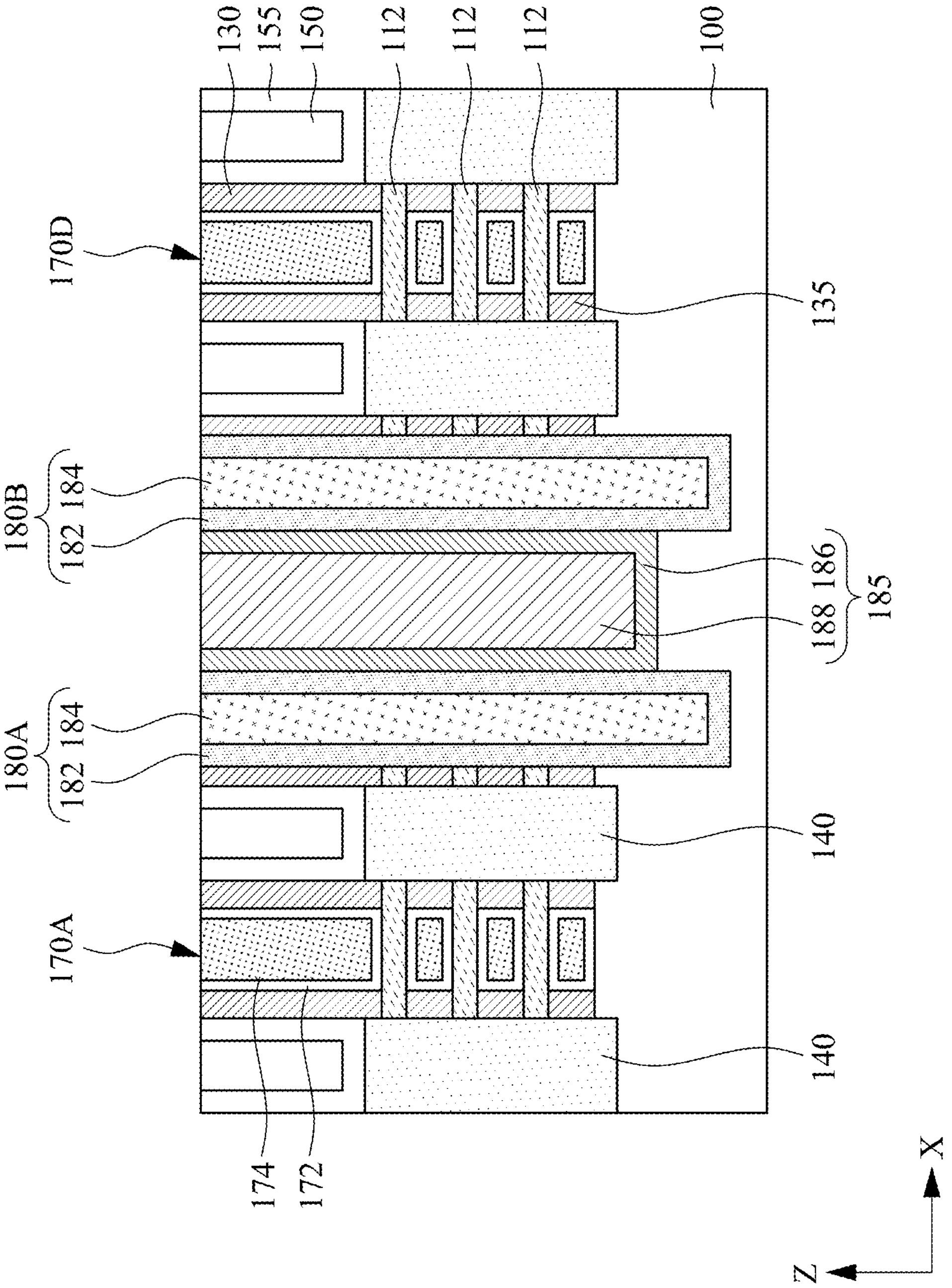

FIGS. 11A to 13B illustrate various stages of manufacturing a semiconductor device in accordance with some embodiments of the present disclosure, in which FIGS. 11A, 12A, and 13A are top views of a semiconductor device, and FIGS. 11B, 12B, and 13B are cross-sectional views along line B-B of the semiconductor device in FIGS. 11A, 12A, and 13A, respectively. In particular, the processes discussed through FIGS. 11A to 13B may be performed on the structure shown in FIGS. 1A and 1B. It is noted that some elements and processes described through FIGS. 11A to 13B may be similar to those described with respect to FIGS. 2A to 4B, similar elements are labeled the same, and relevant details will not be repeated for brevity.

Reference is made to FIGS. 11A and 11B. Portions of the dummy gate structures 120B and 120C are replaced with isolation structures 180A and 180B, respectively. In some embodiments, each of the isolation structures 180A and 180B may include a dielectric layer 182 and a dielectric layer 184 over the dielectric layer 182.

Reference is made to FIGS. 12A and 12B. Isolation structures 185 are formed cutting the dummy gate structures 120A, 120B, 120C, and 120D, respectively. In some embodiments, each of the isolation structures 185 may include a dielectric layer 186 and a dielectric layer 188 over the dielectric layer 186.

Reference is made to FIGS. 13A and 13B. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172.

In the top view of FIG. 13A, both of the dielectric layers 182 and 184 of the isolation structures 180A and 180B may be in contact with the dielectric layer 186 of the isolation structure 185. This is because the isolation structures 185 are formed after the formation of the isolation structures 180A and 180B. Relevant details have been described above, and will not be repeated for brevity.

In the top view of FIG. 13A, the gate electrodes 174 of the metal gate structures 170A, 170B, 170C, and 170D may be separated from the isolation structure 185 through the respective gate dielectric layers 172. This is because the metal gate structures 170A, 170B, 170C, and 170D are formed after the formation of the isolation structures 185. Relevant details have been described above, and will not be repeated for brevity.

Figure 14A:
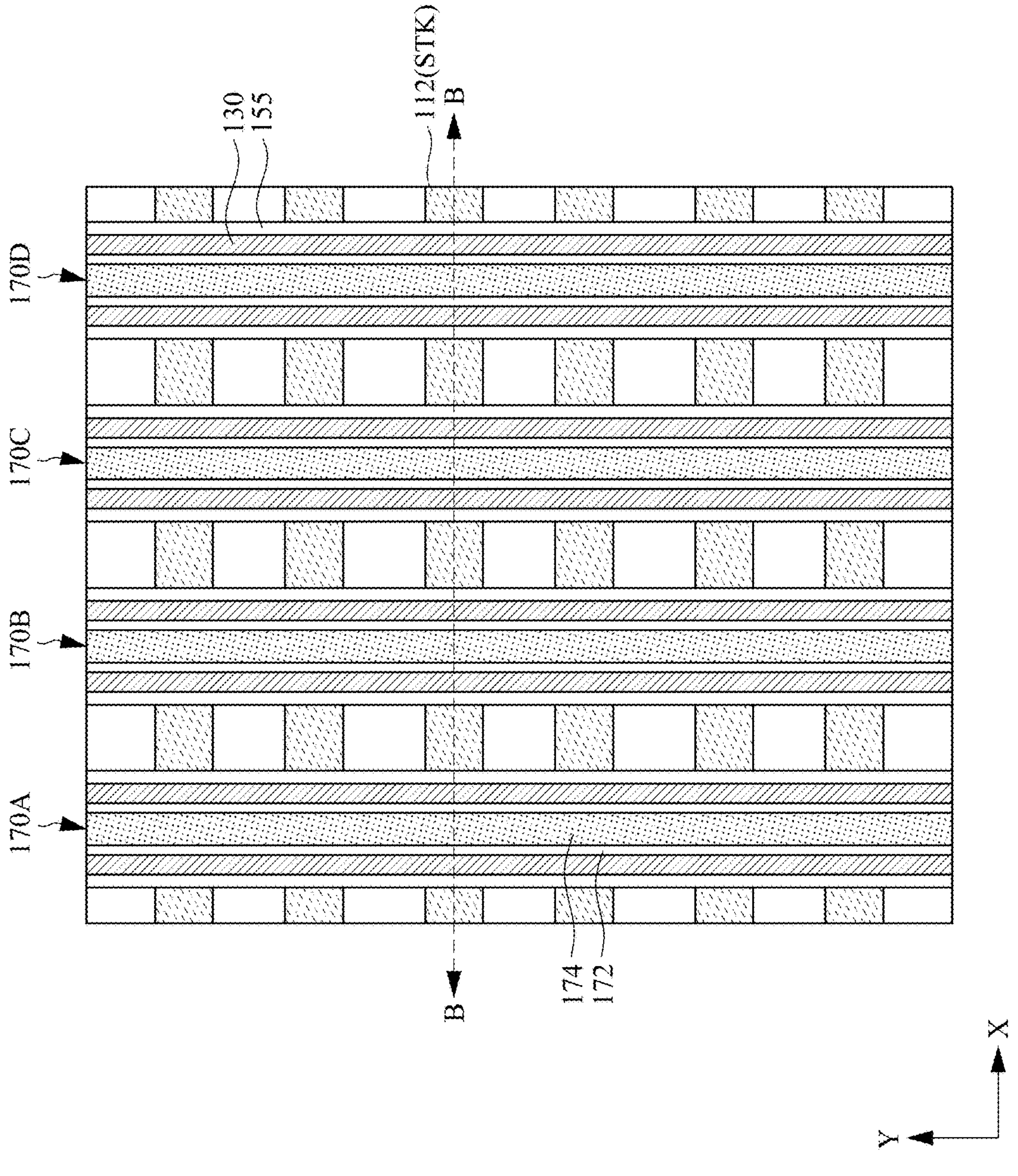
FIGS. 14A to 16B illustrate various stages of manufacturing a semiconductor device in accordance with some embodiments of the present disclosure.
Figure 14B:
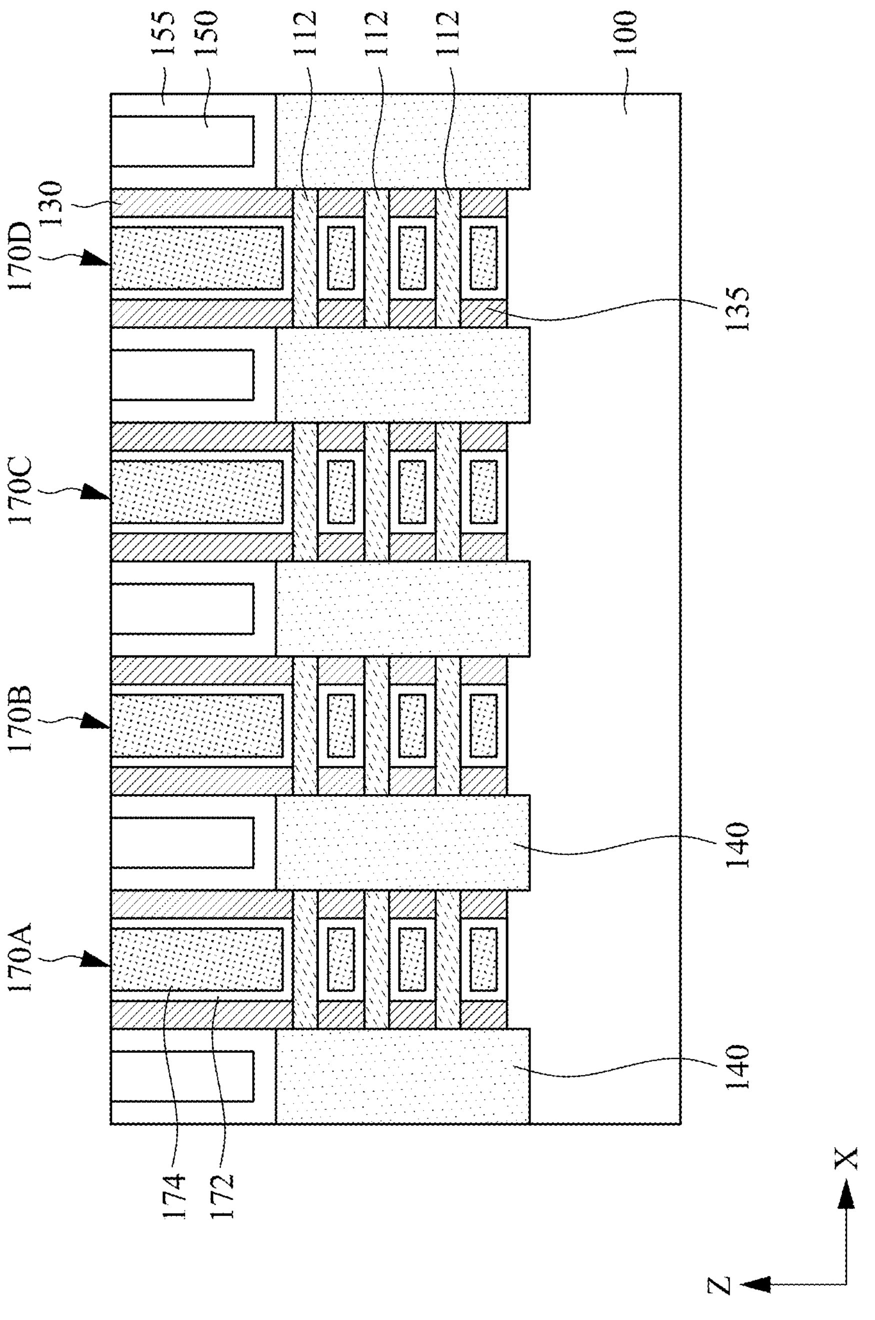
Figure 15A:
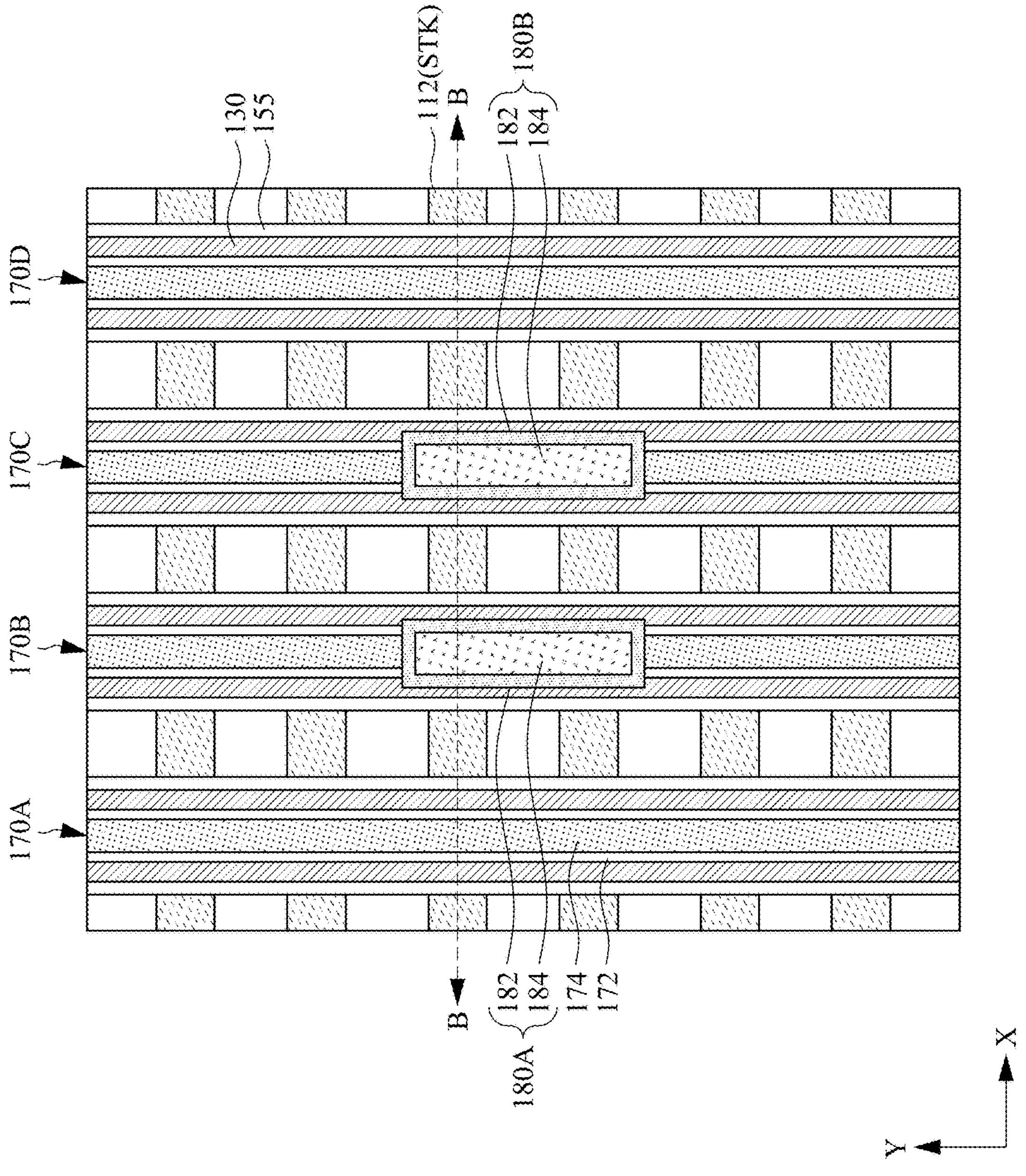
Figure 15B:
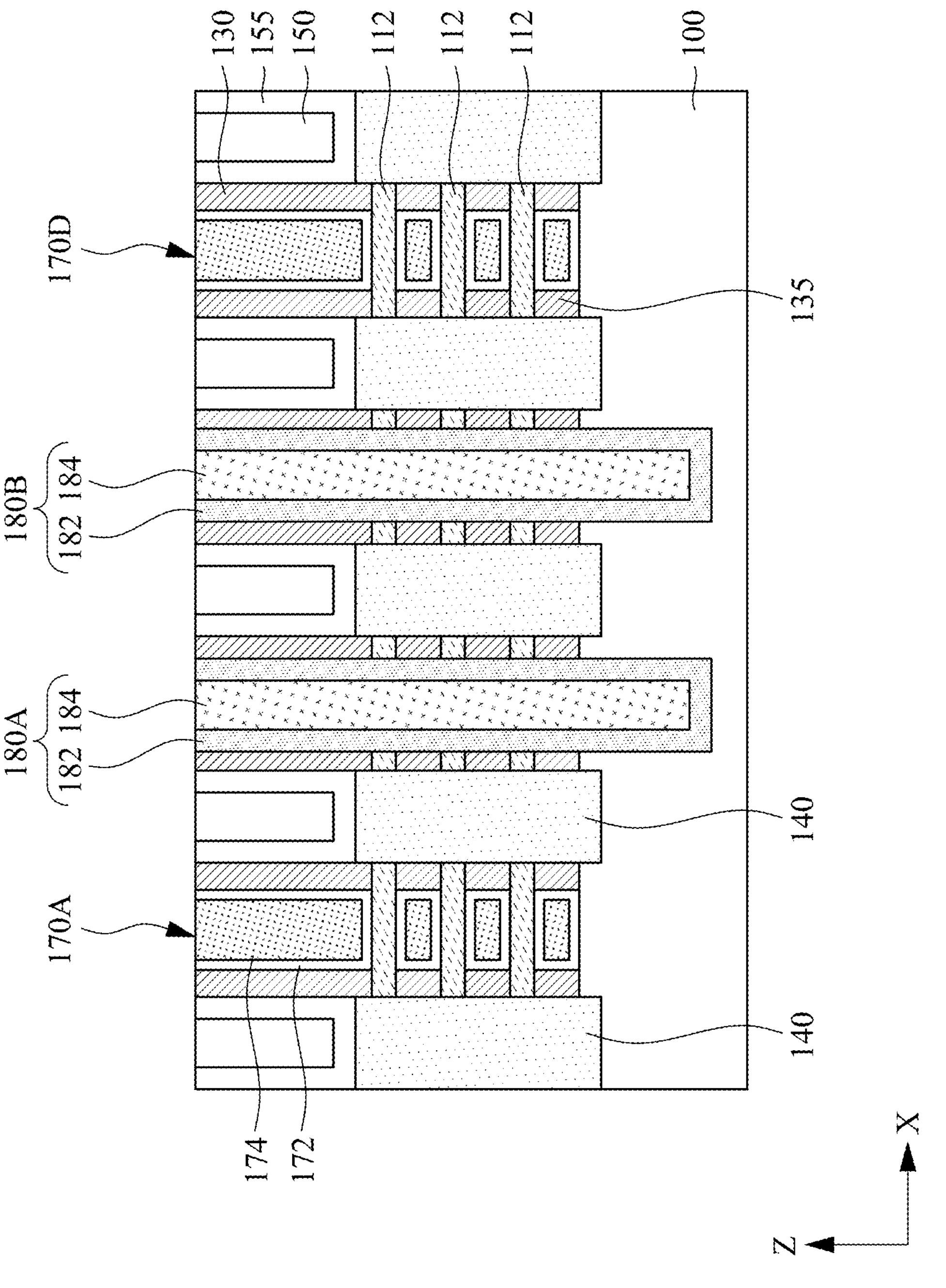
Figure 16A:
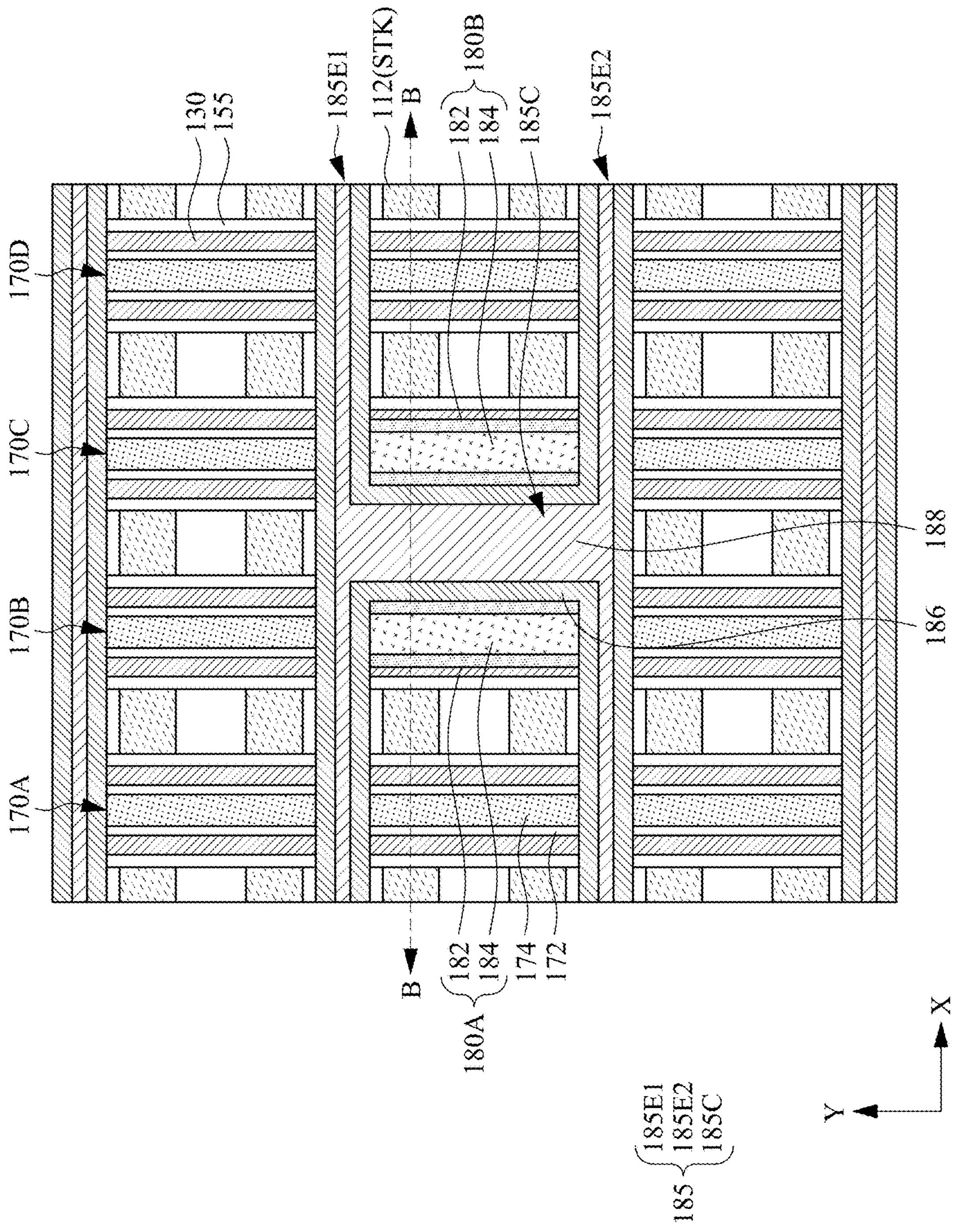
Figure 16B:
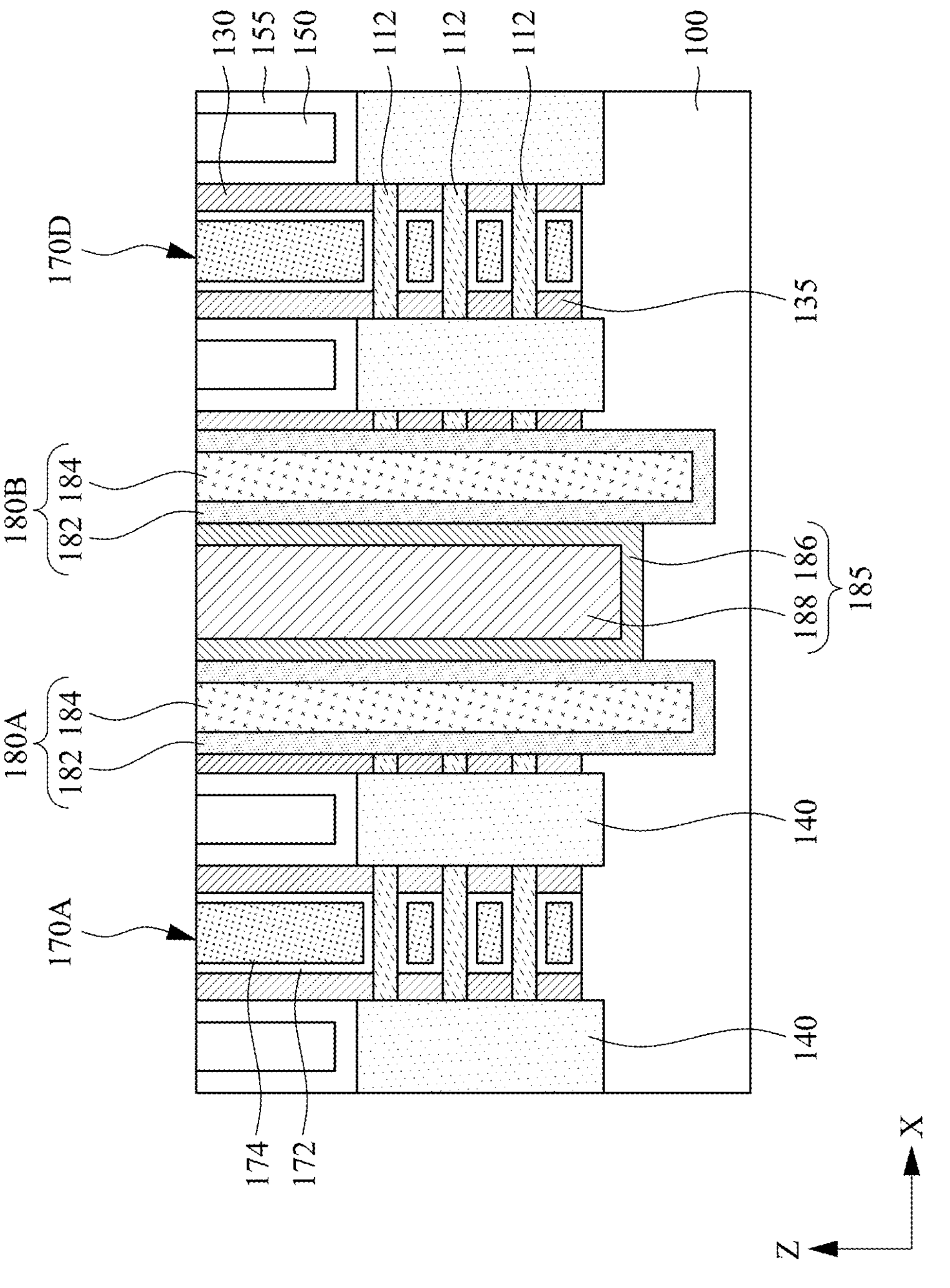

FIGS. 14A to 16B illustrate various stages of manufacturing a semiconductor device in accordance with some embodiments of the present disclosure, in which FIGS. 14A, 15A, and 16A are top views of a semiconductor device, and FIGS. 14B, 15B, and 16B are cross-sectional views along line B-B of the semiconductor device in FIGS. 14A, 15A, and 16A, respectively. In particular, the processes discussed through FIGS. 14A to 16B may be performed on the structure shown in FIGS. 1A and 1B. It is noted that some elements and processes described through FIGS. 14A to 16B may be similar to those described with respect to FIGS. 2A to 4B, similar elements are labeled the same, and relevant details will not be repeated for brevity.

Reference is made to FIGS. 14A and 14B. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172.

Reference is made to FIGS. 15A and 15B. Portions of the metal gate structures 170B and 170C are replaced with isolation structures 180A and 180B, respectively. In some embodiments, each of the isolation structures 180A and 180B may include a dielectric layer 182 and a dielectric layer 184 over the dielectric layer 182.

Reference is made to FIGS. 16A and 16B. Isolation structures 185 are formed cutting the metal gate structures 170A, 170B, 170C, and 170D, respectively. In some embodiments, each of the isolation structures 185 may include a dielectric layer 186 and a dielectric layer 188 over the dielectric layer 186.

In the top view of FIG. 16A, both of the dielectric layers 182 and 184 of the isolation structures 180A and 180B may be in contact with the dielectric layer 186 of the isolation structure 185. This is because the isolation structures 185 are formed after the formation of the isolation structures 180A and 180B. Relevant details have been described above, and will not be repeated for brevity.

Moreover, in the top view of FIG. 16A, both the gate dielectric layers 172 and the gate electrodes 174 of the metal gate structures 170A, 170B, 170C, and 170D may be in contact with the isolation structure 185. This is because the isolation structures 185 are formed after the formation of the metal gate structures 170A, 170B, 170C, and 170D. Relevant details have been described above, and will not be repeated for brevity.

Figure 17A:
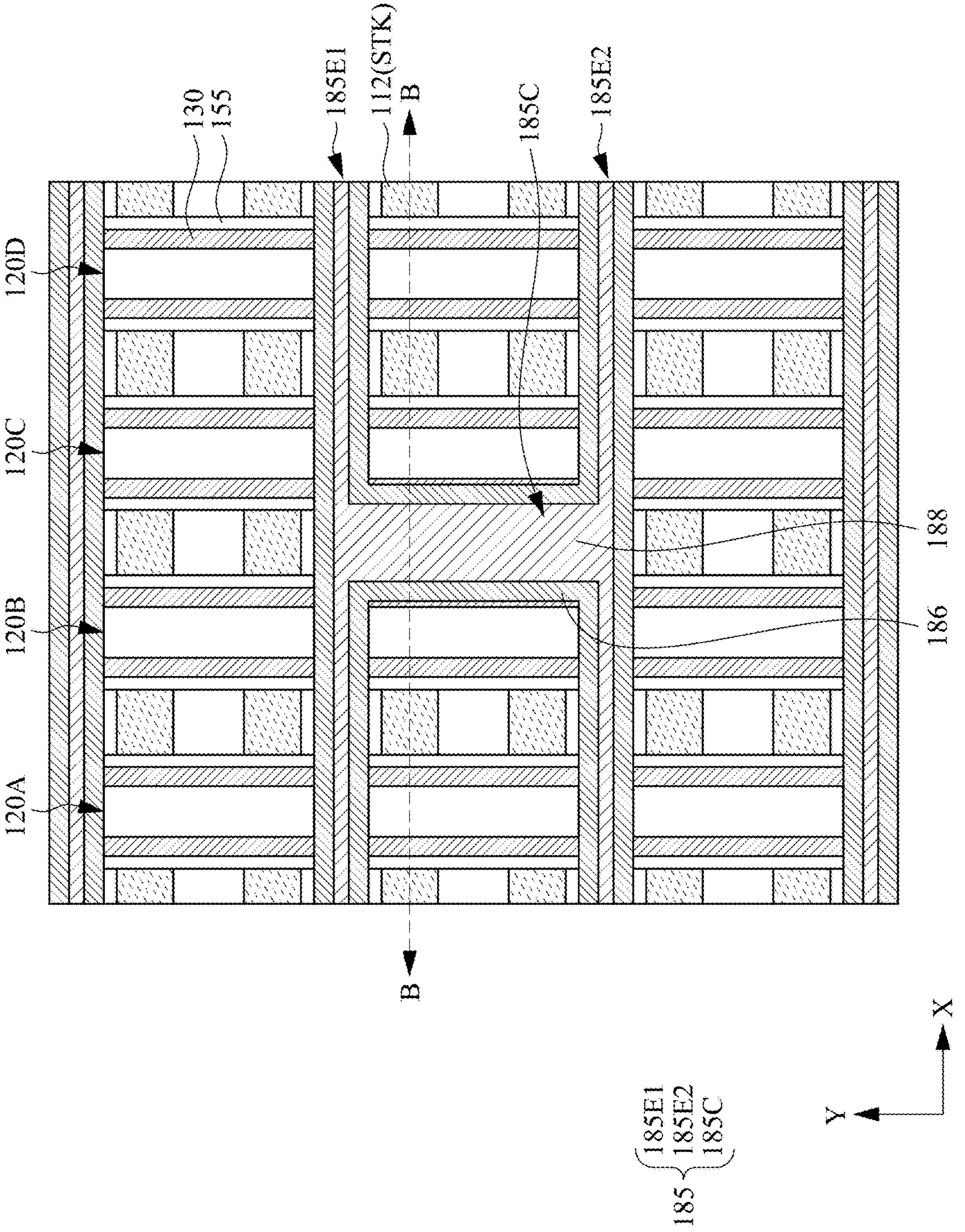
FIGS. 17A to 19B illustrate various stages of manufacturing a semiconductor device in accordance with some embodiments of the present disclosure.
Figure 17B:
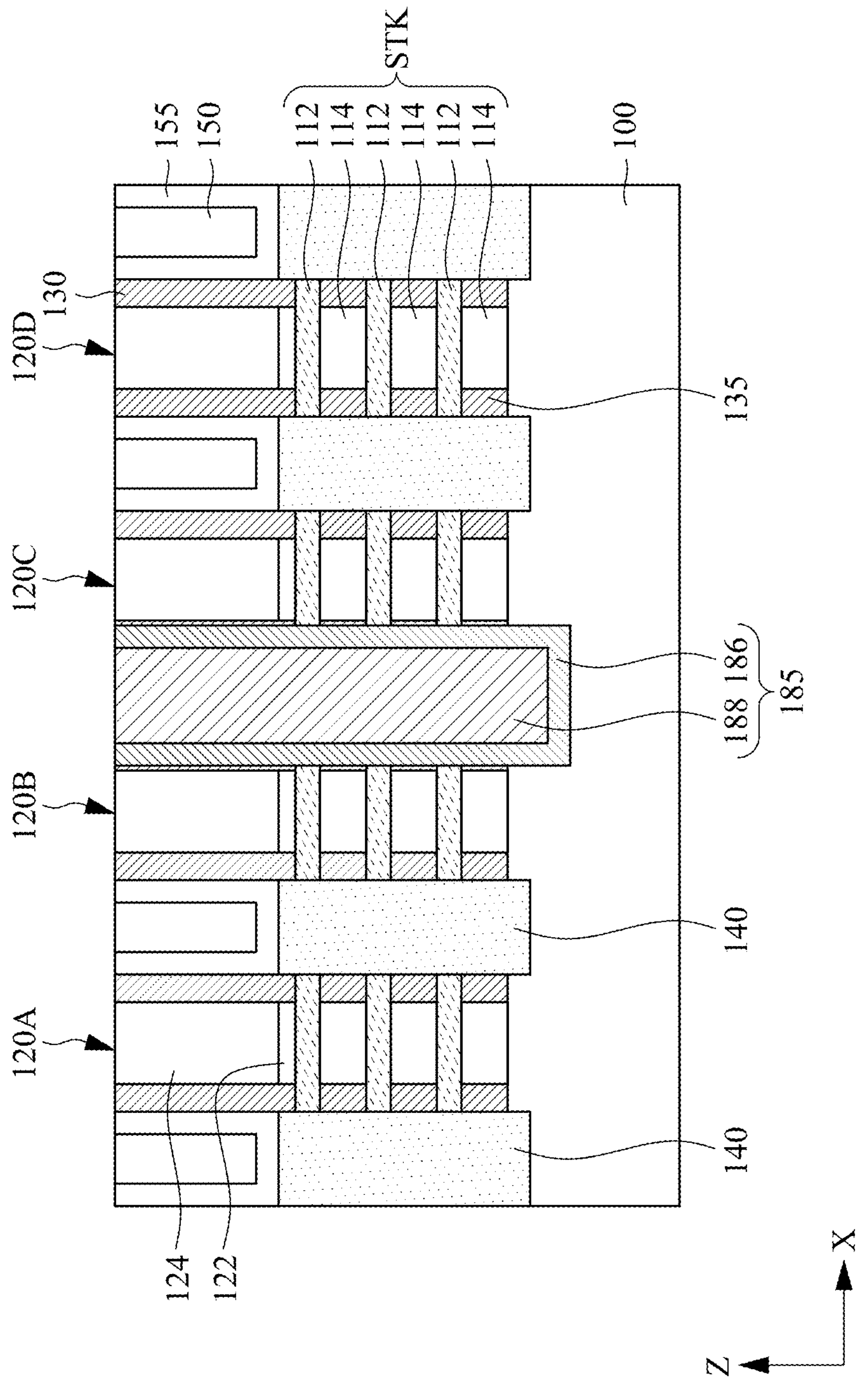
Figure 18A:
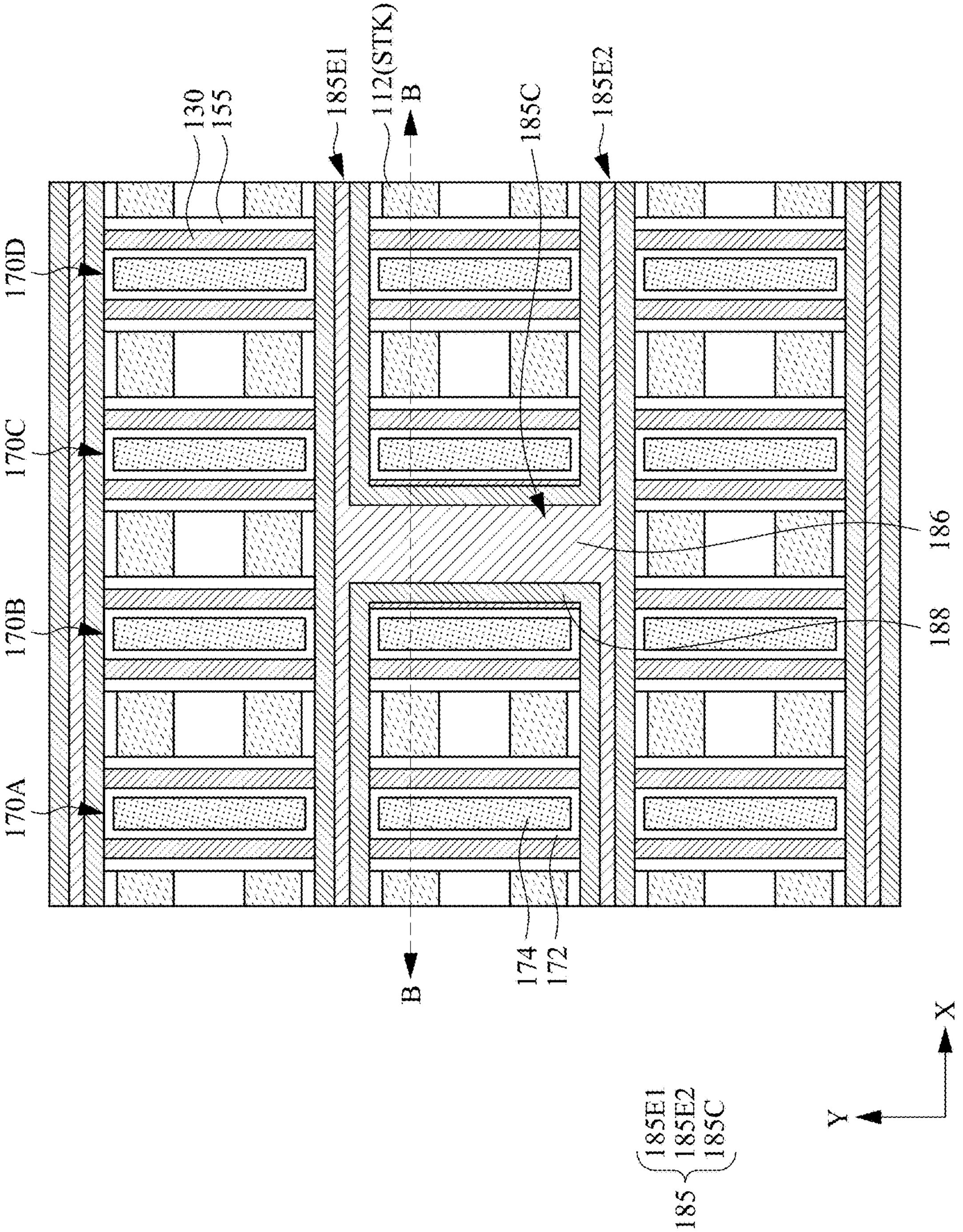
Figure 18B:
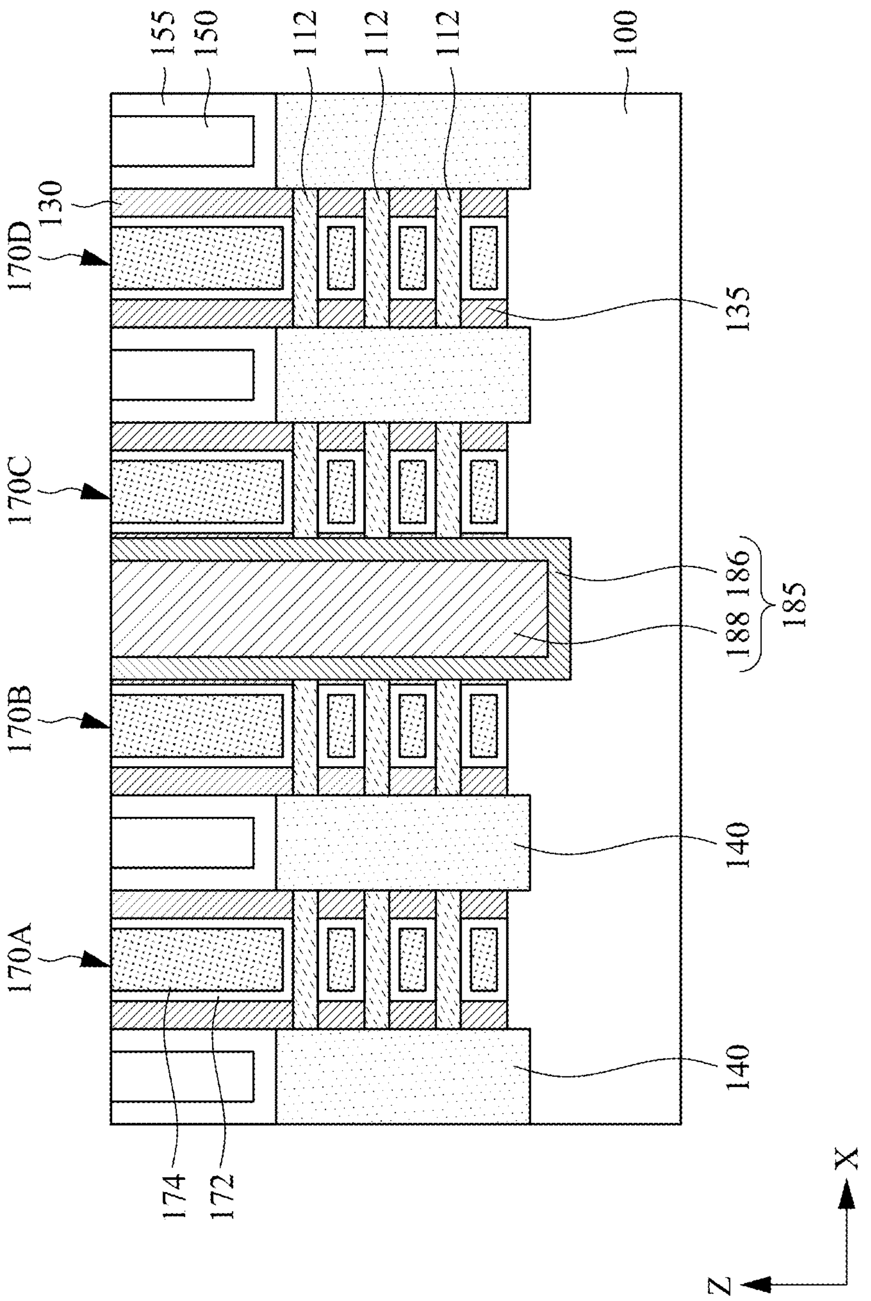
Figure 19A:
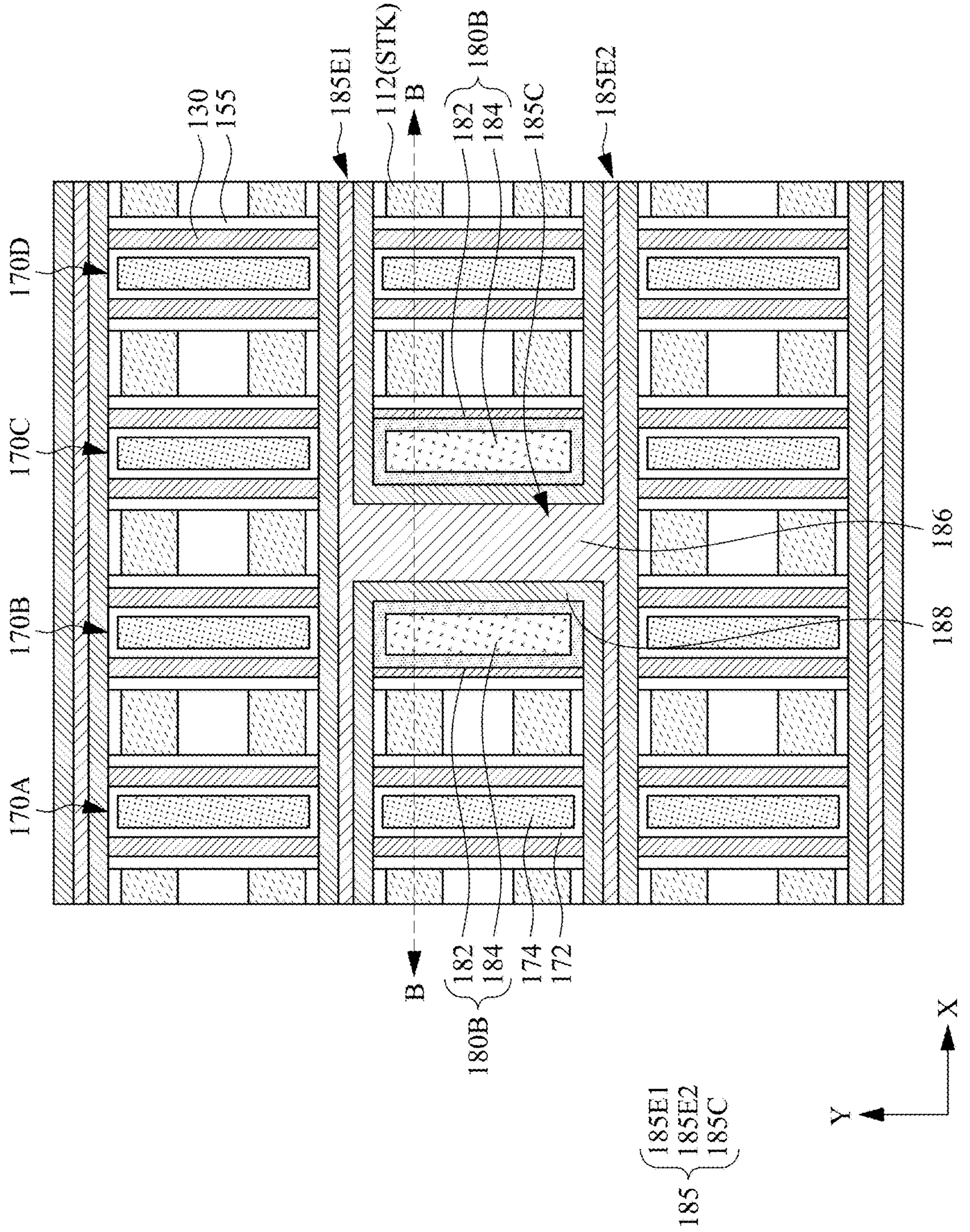
Figure 19B:
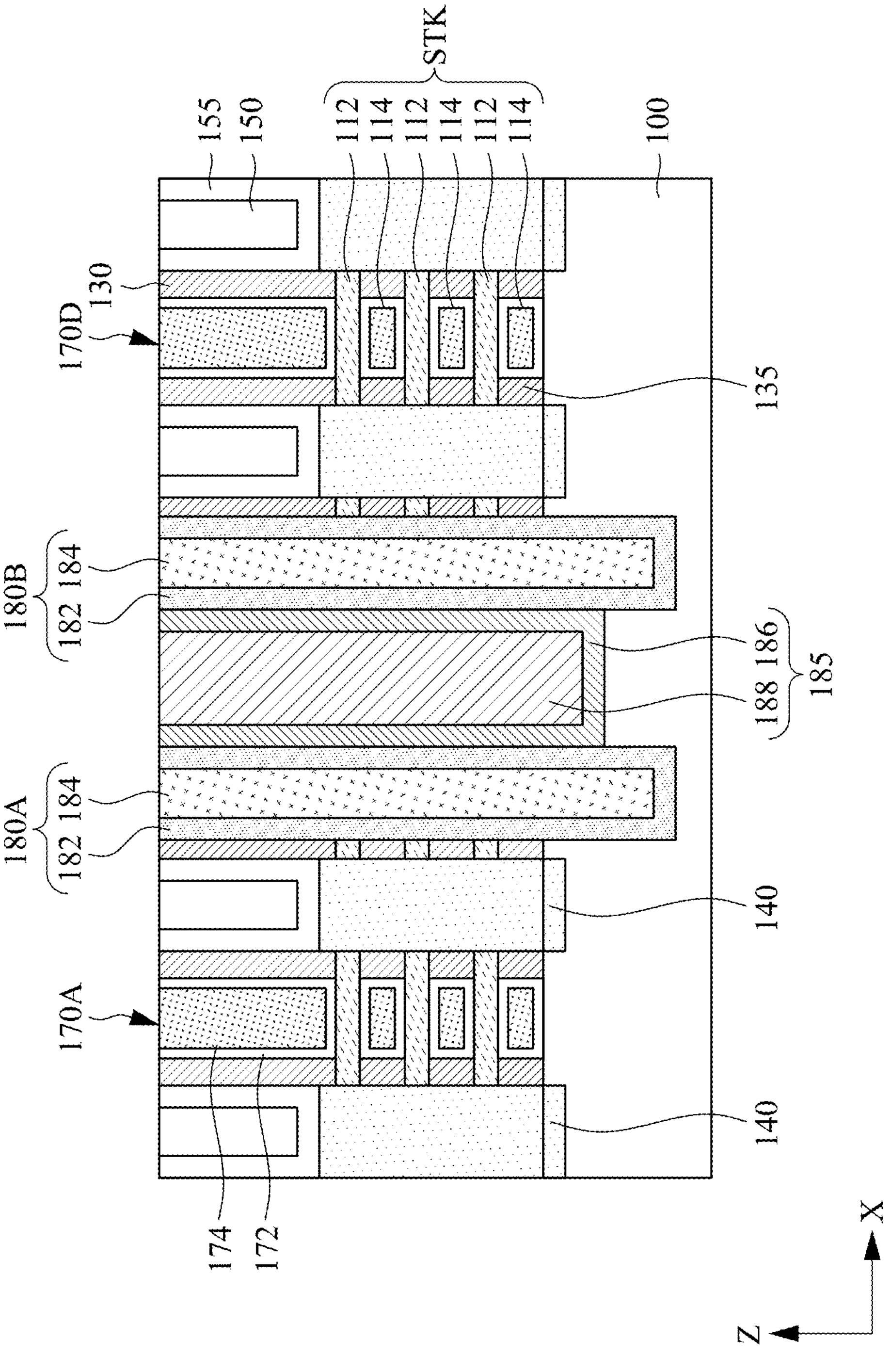

FIGS. 17A to 19B illustrate various stages of manufacturing a semiconductor device in accordance with some embodiments of the present disclosure, in which FIGS. 17A, 18A, and 19A are top views of a semiconductor device, and FIGS. 17B, 18B, and 19B are cross-sectional views along line B-B of the semiconductor device in FIGS. 17A, 18A, and 19A, respectively. In particular, the processes discussed through FIGS. 17A to 19B may be performed on the structure shown in FIGS. 1A and 1B. It is noted that some elements and processes described through FIGS. 17A to 19B may be similar to those described with respect to FIGS. 2A to 4B, similar elements are labeled the same, and relevant details will not be repeated for brevity.

Reference is made to FIGS. 17A and 17B. Isolation structures 185 are formed cutting the dummy gate structures 120A, 120B, 120C, and 120D, respectively. In some embodiments, each of the isolation structures 185 may include a dielectric layer 186 and a dielectric layer 188 over the dielectric layer 186.

Reference is made to FIGS. 18A and 18B. Dummy gate structures 120A, 120B, 120C, and 120D are replaced with metal gate structures 170A, 170B, 170C, and 170D, respectively. Each of the metal gate structures 170A, 170B, 170C, and 170D may wrap around the respective semiconductor channel layers 112. In some embodiments, each of the metal gate structures 170A, 170B, 170C, and 170D includes a gate dielectric layer 172 and a gate electrode 174 over the gate dielectric layer 172.

Reference is made to FIGS. 19A and 19B. Portions of the metal gate structures 170B and 170C are replaced with isolation structures 180A and 180B, respectively. In some embodiments, each of the isolation structures 180A and 180B may include a dielectric layer 182 and a dielectric layer 184 over the dielectric layer 182.

In the top view of FIG. 19A, the dielectric layers 182 of the isolation structures 180A and 180B may include a rectangular ring-shape top profile that surrounds the respective dielectric layer 184. Moreover, the dielectric layers 184 of the isolation structures 180A and 180B may be separated from the isolation structure 185 through the respective dielectric layers 182. This is because the isolation structures 180A and 180B are formed after the formation of the isolation structure 185. Relevant details have been described above, and will not be repeated for brevity.

In the top view of FIG. 19A, the gate electrodes 174 of the metal gate structures 170A, 170B, 170C, and 170D may be separated from the isolation structure 185 through the respective gate dielectric layers 172. This is because the metal gate structures 170A, 170B, 170C, and 170D are formed after the formation of the isolation structure 185. Relevant details have been described above, and will not be repeated for brevity.

Figure 20A:
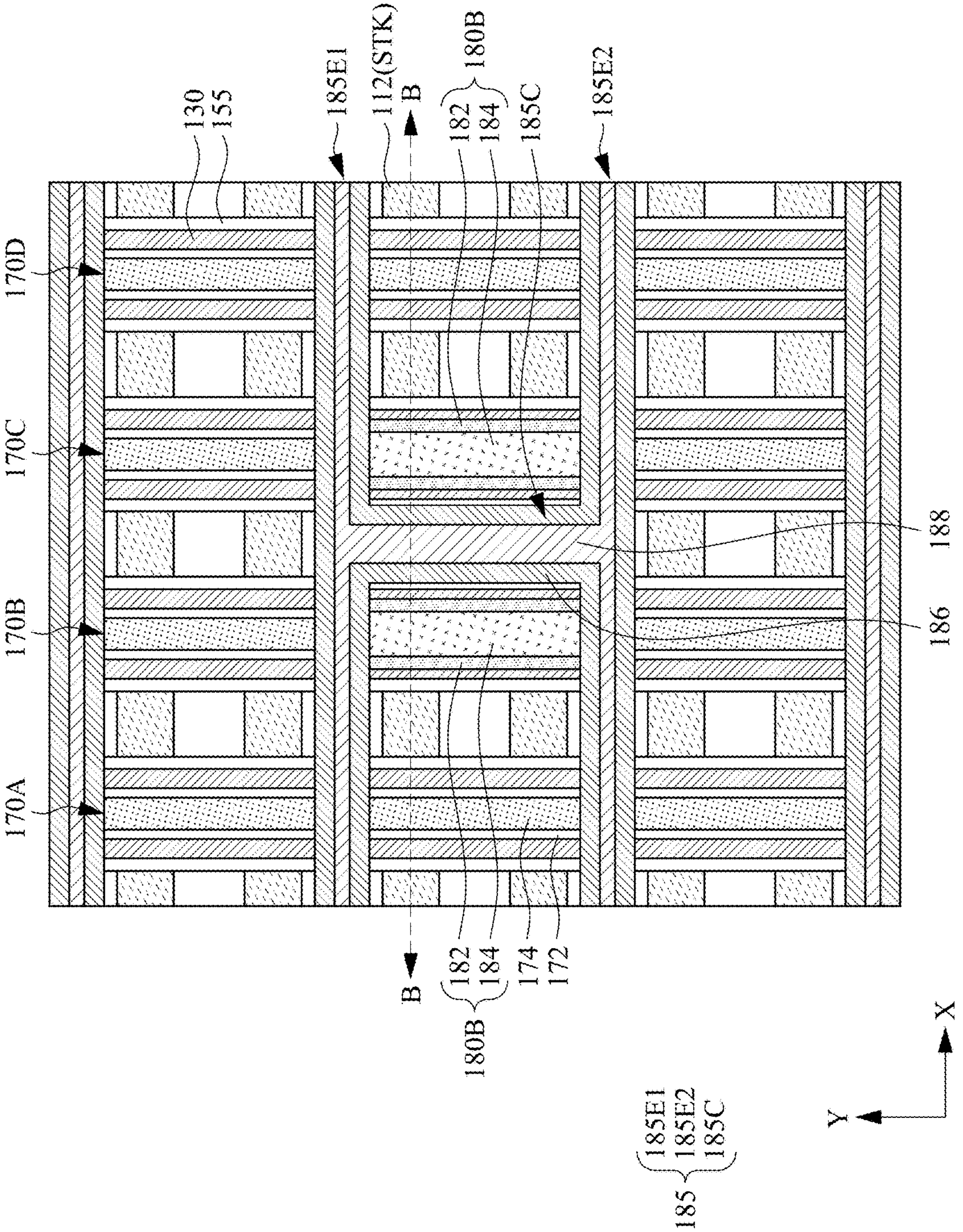
FIGS. 20A and 20B illustrate a semiconductor device in accordance with some embodiments of the present disclosure.
Figure 20B:
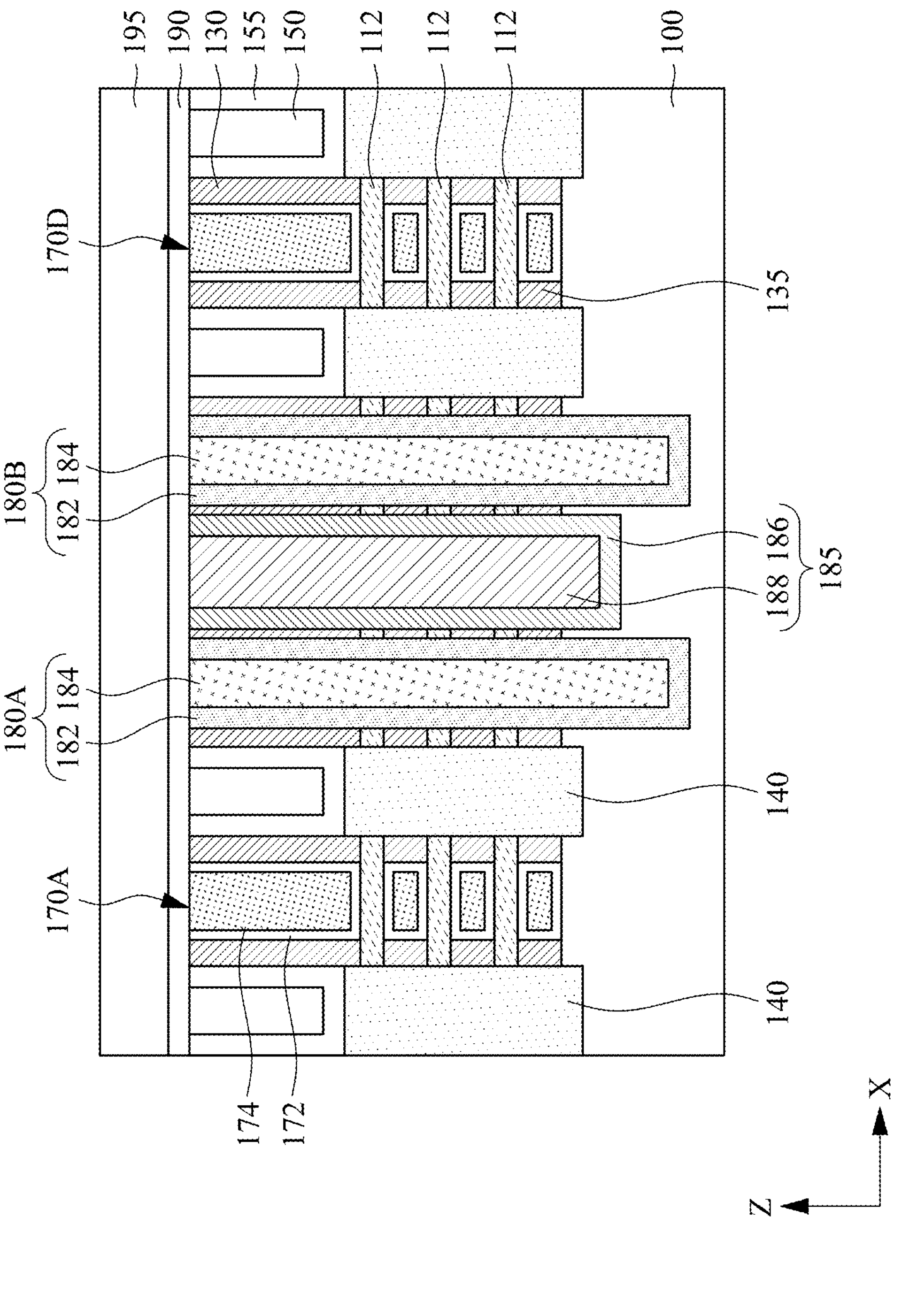

FIGS. 20A and 20B illustrate a semiconductor device in accordance with some embodiments of the present disclosure. The structure shown in FIGS. 20A and 20B is similar to the structure shown in FIGS. 4A and 4B, the formation method may be similar to those described with respect to FIGS. 2A to 4B, and thus relevant details will not be repeated for brevity.

The difference between the structure of FIGS. 20A and 20B and the structure of FIGS. 4A and 4B is that, in the structure of FIGS. 20A and 20B, the isolation structures 180A and 180B may be separated from the connection portion 185C of the isolation structure 185 along the first direction (e.g., X-direction). In some embodiments, the isolation structures 180A and 180B may still be in contact with the extension portions 185E1 and 185E2 of the isolation structure 185. In the cross-sectional view of FIG. 20B, the isolation structures 180A and 180B each may be laterally separated from the isolation structure 185 through a material of the gate spacers 130, a material of the semiconductor channel layers 112, a material of the inner spacers 135, and/or a material of the substrate 100.

It is noted that the formation order of the metal gate structures 170A to 170D, the isolation structures 180A and 180B, and the isolation structures 185 as shown in FIGS. 20A and 20B is the same as those described with respect to FIGS. 2A to 4B. However, the formation order of the metal gate structures 170A to 170D, the isolation structures 180A and 180B, and the isolation structures 185 as shown in FIGS. 20A and 20B can also be the same as those described with respect to FIGS. 5A to 7B, 8A to 10B, 11A to 13B, 14A to 16B, or 17A to 19B, and the structural relationship among the metal gate structures 170A to 170D, the isolation structures 180A and 180B, and the isolation structures 185 may be similar to those described in FIGS. 7A and 7B, 10A and 10B, 13A and 13B, 16A and 16B, or 19A and 19B. The only difference is that the isolation structures 180A and 180B may be separated from the connection portion 185C of the isolation structure 185 as shown in FIGS. 20A and 20B.

Figure 21A:
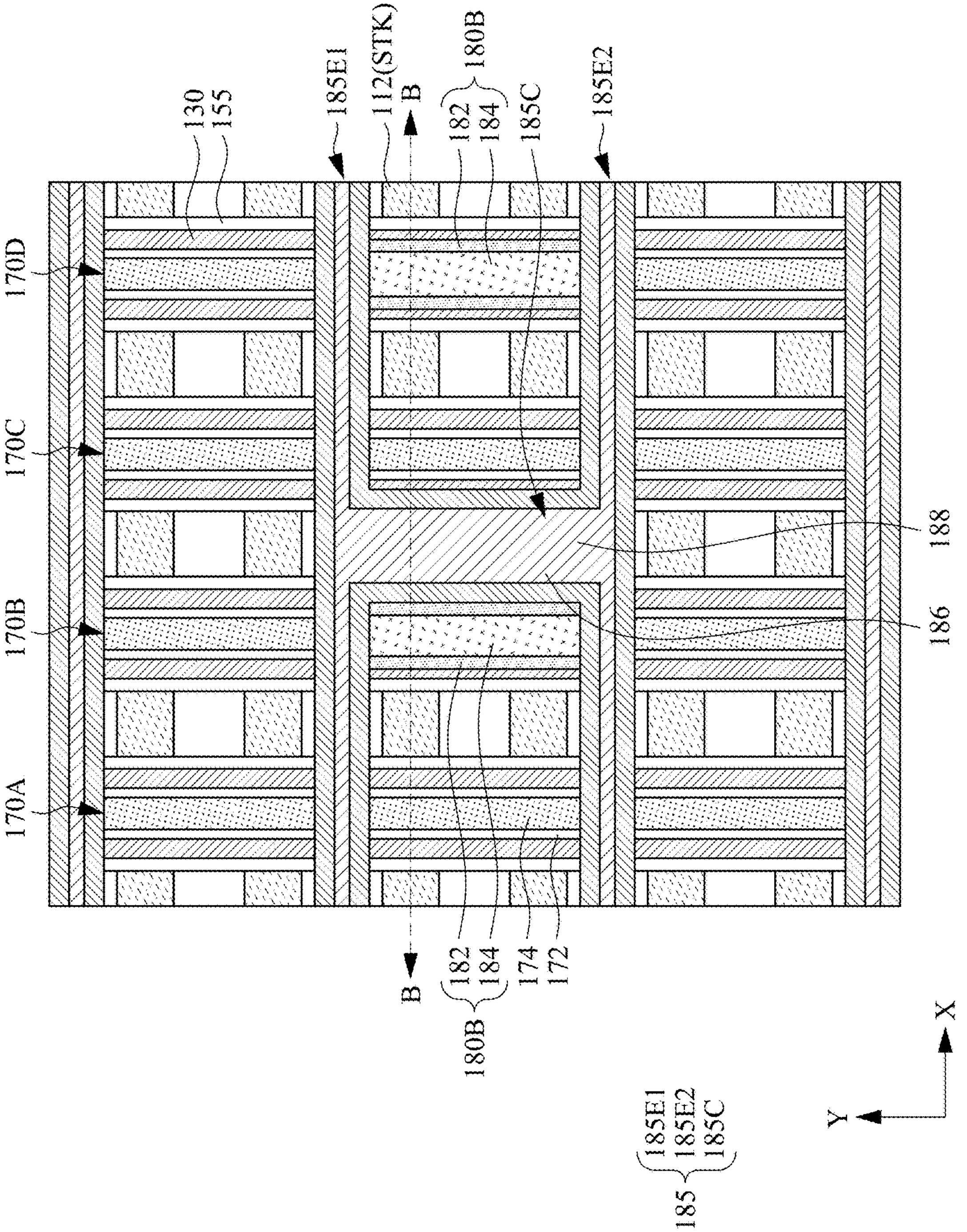
FIGS. 21A and 21B illustrate a semiconductor device in accordance with some embodiments of the present disclosure.
Figure 21B:
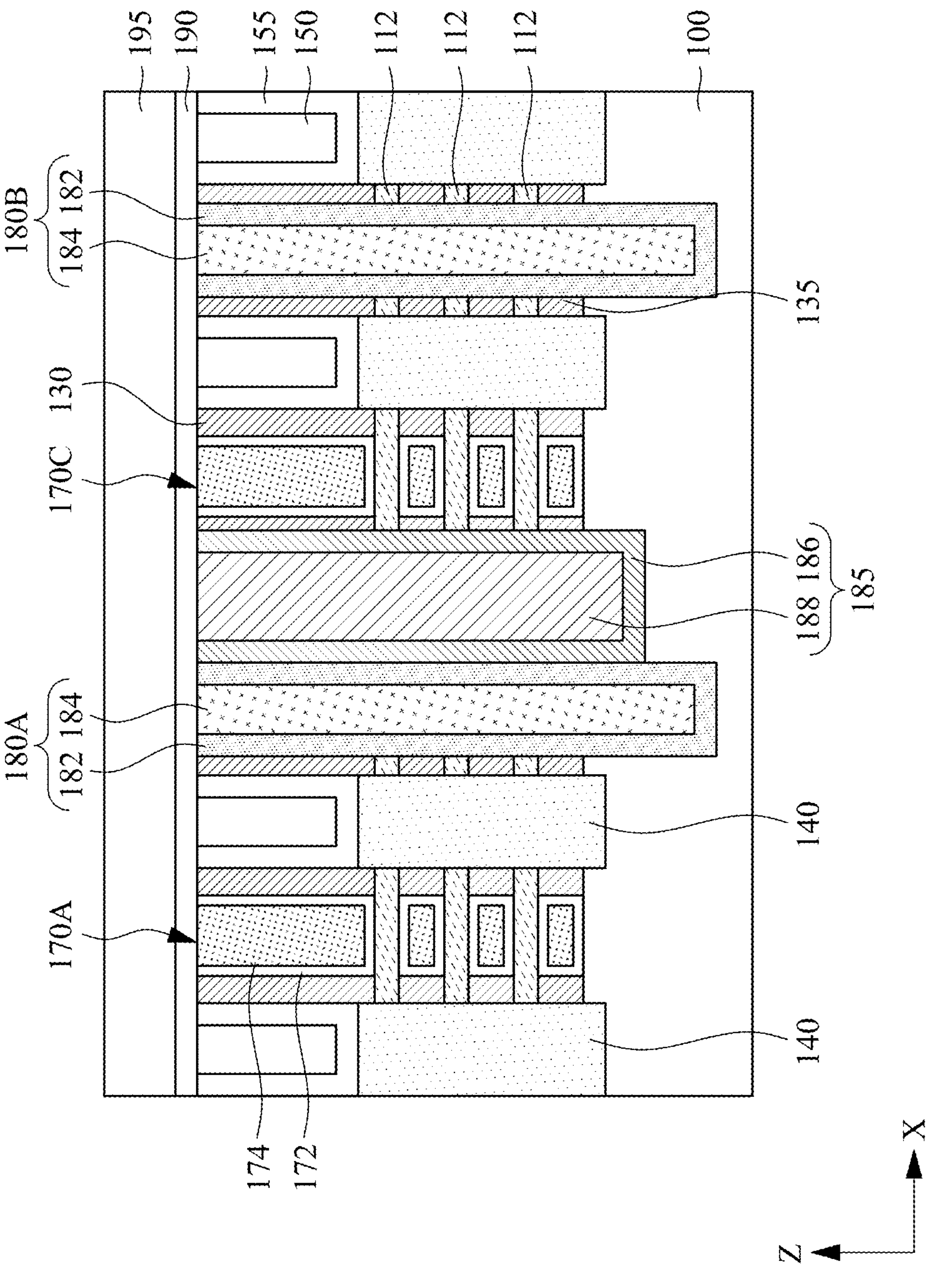

FIGS. 21A and 21B illustrate a semiconductor device in accordance with some embodiments of the present disclosure. The structure shown in FIGS. 21A and 21B is similar to the structure shown in FIGS. 4A and 4B, the formation method may be similar to those described with respect to FIGS. 2A to 4B, and thus relevant details will not be repeated for brevity.

The difference between the structure of FIGS. 21A and 21B and the structure of FIGS. 4A and 4B is that, during the formation of the structure of FIGS. 21A and 21B, the isolation structure 180B is formed by replacing a portion of the metal gate structure 170D (or the dummy gate structure 120D) rather than replacing a portion of the metal gate structure 170C (or the dummy gate structure 120C) as described in FIGS. 2A to 4B. As a result, as shown in FIGS. 21A and 21B, the isolation structure 180A may be in contact with the connection portion 185C of the isolation structure 185, while the isolation structure 180B may be separated from the connection portion 185C of the isolation structure 185. In some embodiments, the isolation structures 180A and 180B may still be in contact with the extension portions 185E1 and 185E2 of the isolation structure 185. As shown in FIG. 21B, the metal gate structure 170C may be laterally between the isolation structure 180B and the isolation structure 185.

It is noted that the formation order of the metal gate structures 170A to 170D, the isolation structures 180A and 180B, and the isolation structures 185 as shown in FIGS. 21A and 21B is the same as those described with respect to FIGS. 2A to 4B. However, the formation order of the metal gate structures 170A to 170D, the isolation structures 180A and 180B, and the isolation structures 185 as shown in FIGS. 21A and 21B can also be the same as those described with respect to FIGS. 5A to 7B, 8A to 10B, 11A to 13B, 14A to 16B, or 17A to 19B, and the structural relationship among the metal gate structures 170A to 170D, the isolation structures 180A and 180B, and the isolation structures 185 may be similar to those described in FIGS. 7A and 7B, 10A and 10B, 13A and 13B, 16A and 16B, or 19A and 19B. The only difference is that the isolation structure 180B is formed by replacing a portion of the metal gate structure 170D (or the dummy gate structure 120D), and thus the isolation structure 180B may be separated from the connection portion 185C of the isolation structure 185 as shown in FIGS. 21A and 21B.

Figure 22A:
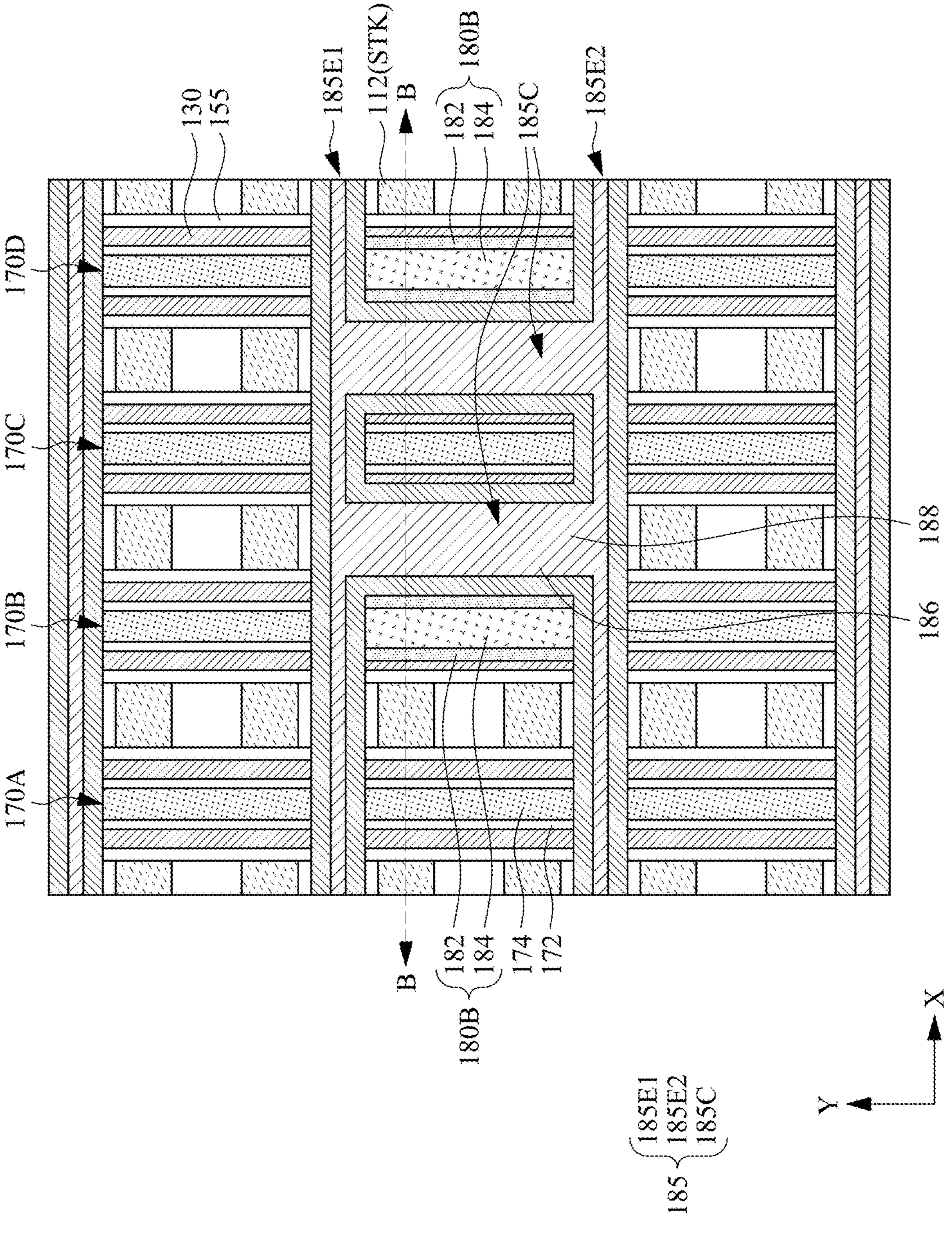
FIGS. 22A and 22B illustrate a semiconductor device in accordance with some embodiments of the present disclosure.
Figure 22B:
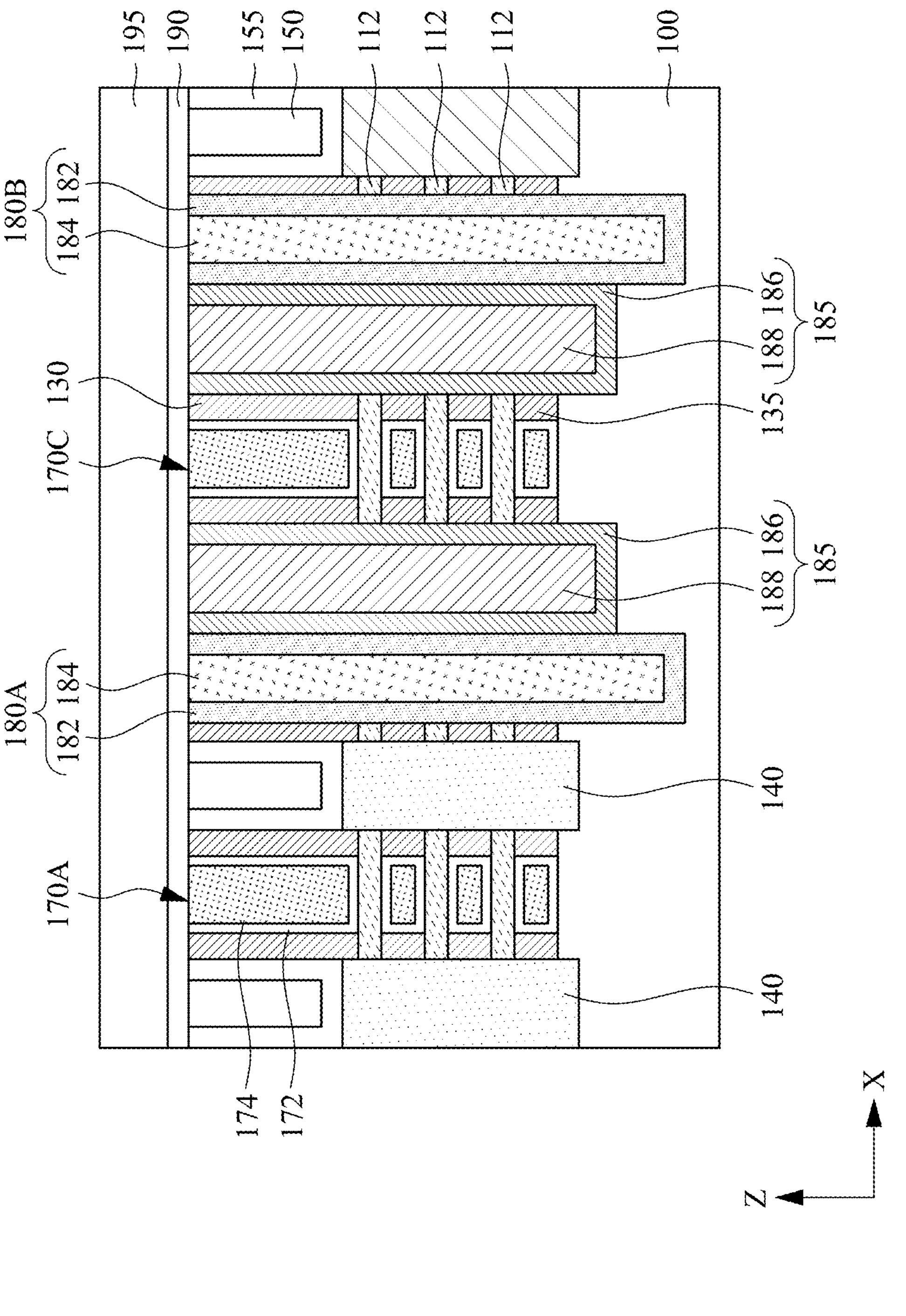

FIGS. 22A and 22B illustrate a semiconductor device in accordance with some embodiments of the present disclosure. The structure shown in FIGS. 22A and 22B is similar to the structure shown in FIGS. 21A and 21B, the formation method may be similar to those described with respect to FIGS. 2A to 4B, and thus relevant details will not be repeated for brevity.

The difference between the structure of FIGS. 22A and 22B and the structure of FIGS. 21A and 21B is that, the isolation structure 185 has two connection portions 185C that connects the extension portions 185E1 and 185E2, in which the connection portions 185C are laterally separated from each other. In some embodiments, the connection portions 185C are laterally between the isolation structures 180A and 180B, in which the isolation structure 180A is in contact with one connection portion 185C, and the isolation structure 180B is in contact with another connection portion 185C. In some embodiments, the metal gate structure 170C is between the connection portions 185C.

It is noted that the formation order of the metal gate structures 170A to 170D, the isolation structures 180A and 180B, and the isolation structures 185 as shown in FIGS. 22A and 22B is the same as those described with respect to FIGS. 2A to 4B. However, the formation order of the metal gate structures 170A to 170D, the isolation structures 180A and 180B, and the isolation structures 185 as shown in FIGS. 22A and 22B can also be the same as those described with respect to FIGS. 5A to 7B, 8A to 10B, 11A to 13B, 14A to 16B, or 17A to 19B, and the structural relationship among the metal gate structures 170A to 170D, the isolation structures 180A and 180B, and the isolation structures 185 may be similar to those described in FIGS. 7A and 7B, 10A and 10B, 13A and 13B, 16A and 16B, or 19A and 19B. The only difference is that the isolation structure 180B is formed by replacing a portion of the metal gate structure 170D (or the dummy gate structure 120D), and the isolation structure 185 include two connection portions 185C.

Figure 23A:
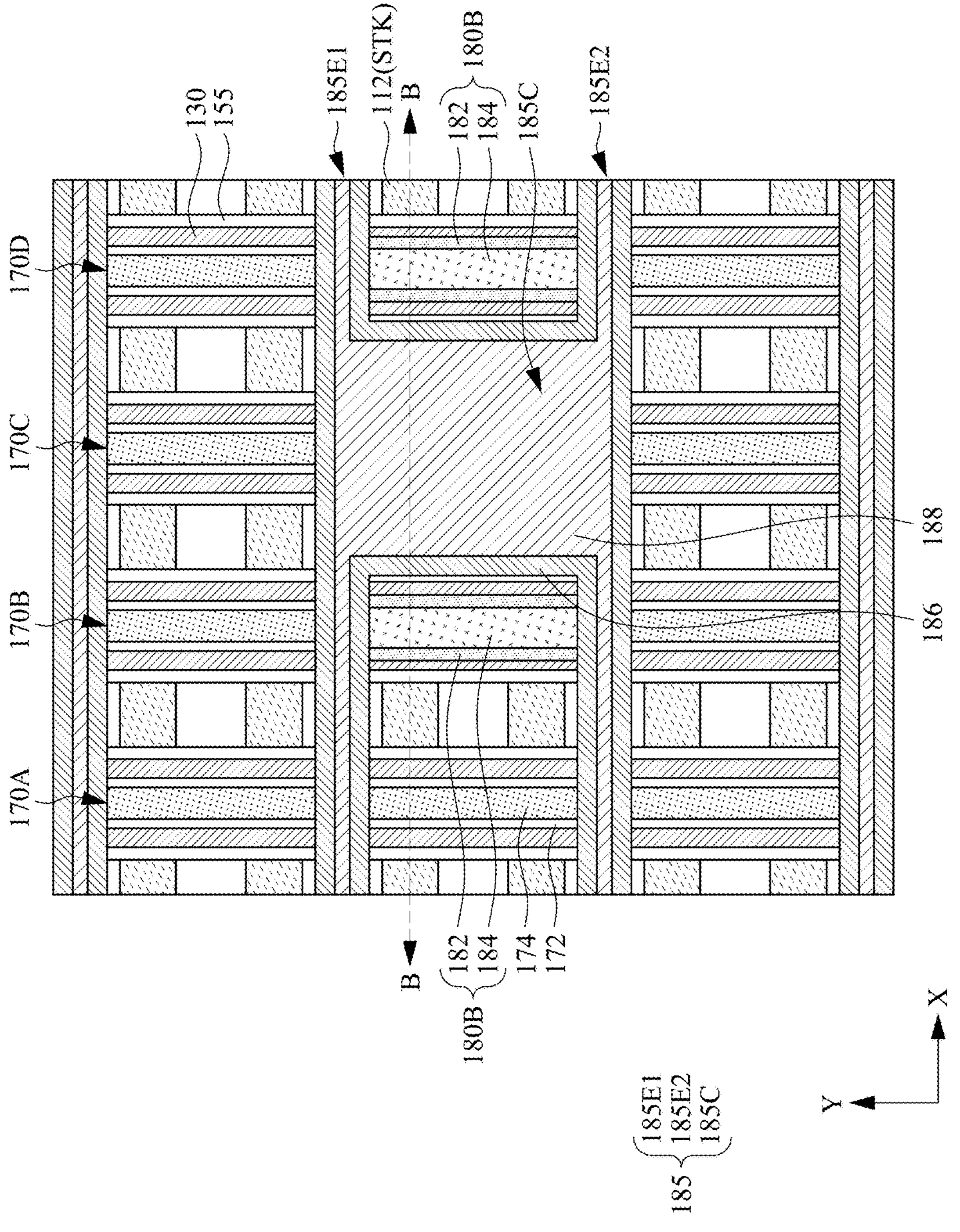
FIGS. 23A and 23B illustrate a semiconductor device in accordance with some embodiments of the present disclosure.
Figure 23B:
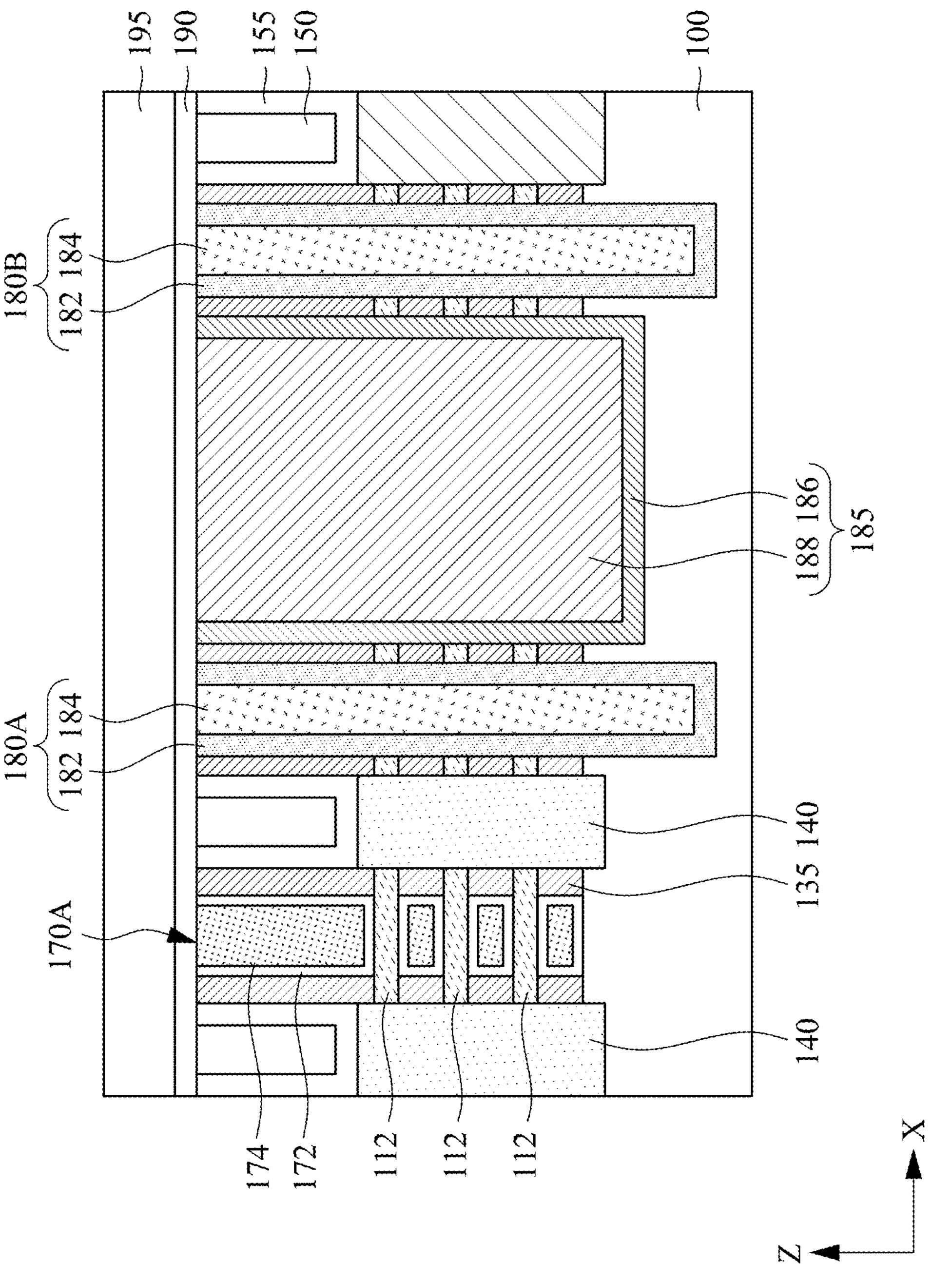

FIGS. 23A and 23B illustrate a semiconductor device in accordance with some embodiments of the present disclosure. The structure shown in FIGS. 23A and 23B is similar to the structure shown in FIGS. 21A and 21B, the formation method may be similar to those described with respect to FIGS. 2A to 4B, and thus relevant details will not be repeated for brevity.

The difference between the structure of FIGS. 23A and 23B and the structure of FIGS. 21A and 21B is that, the connection portion 185C of the isolation structure 185 is wider than the isolation structures 180A and 180B along the first direction (e.g., X-direction). Moreover, the connection portion 185C of the isolation structure 185 is separated from the isolation structures 180A and 180B. In the cross-sectional view of FIG. 23B, the isolation structures 180A and 180B each may be laterally separated from the isolation structure 185 through a material of the gate spacers 130, a material of the semiconductor channel layers 112, a material of the inner spacers 135, and/or a material of the substrate 100. In some embodiments, no materials of the metal gate structures 170A to 170D are between the isolation structures 180A (or 180B) and the isolation structure 185.

It is noted that the formation order of the metal gate structures 170A to 170D, the isolation structures 180A and 180B, and the isolation structures 185 as shown in FIGS. 23A and 23B is the same as those described with respect to FIGS. 2A to 4B. However, the formation order of the metal gate structures 170A to 170D, the isolation structures 180A and 180B, and the isolation structures 185 as shown in FIGS. 23A and 23B can also be the same as those described with respect to FIGS. 5A to 7B, 8A to 10B, 11A to 13B, 14A to 16B, or 17A to 19B, and the structural relationship among the metal gate structures 170A to 170D, the isolation structures 180A and 180B, and the isolation structures 185 may be similar to those described in FIGS. 7A and 7B, 10A and 10B, 13A and 13B, 16A and 16B, or 19A and 19B. The only difference is that the isolation structure 180B is formed by replacing a portion of the metal gate structure 170D (or the dummy gate structure 120D), the isolation structure 185 is wider than the isolation structures 180A and 180B, and the connection portion 185C of the isolation structure 185 is separated from the isolation structures 180A and 180B.

Figure 24A:
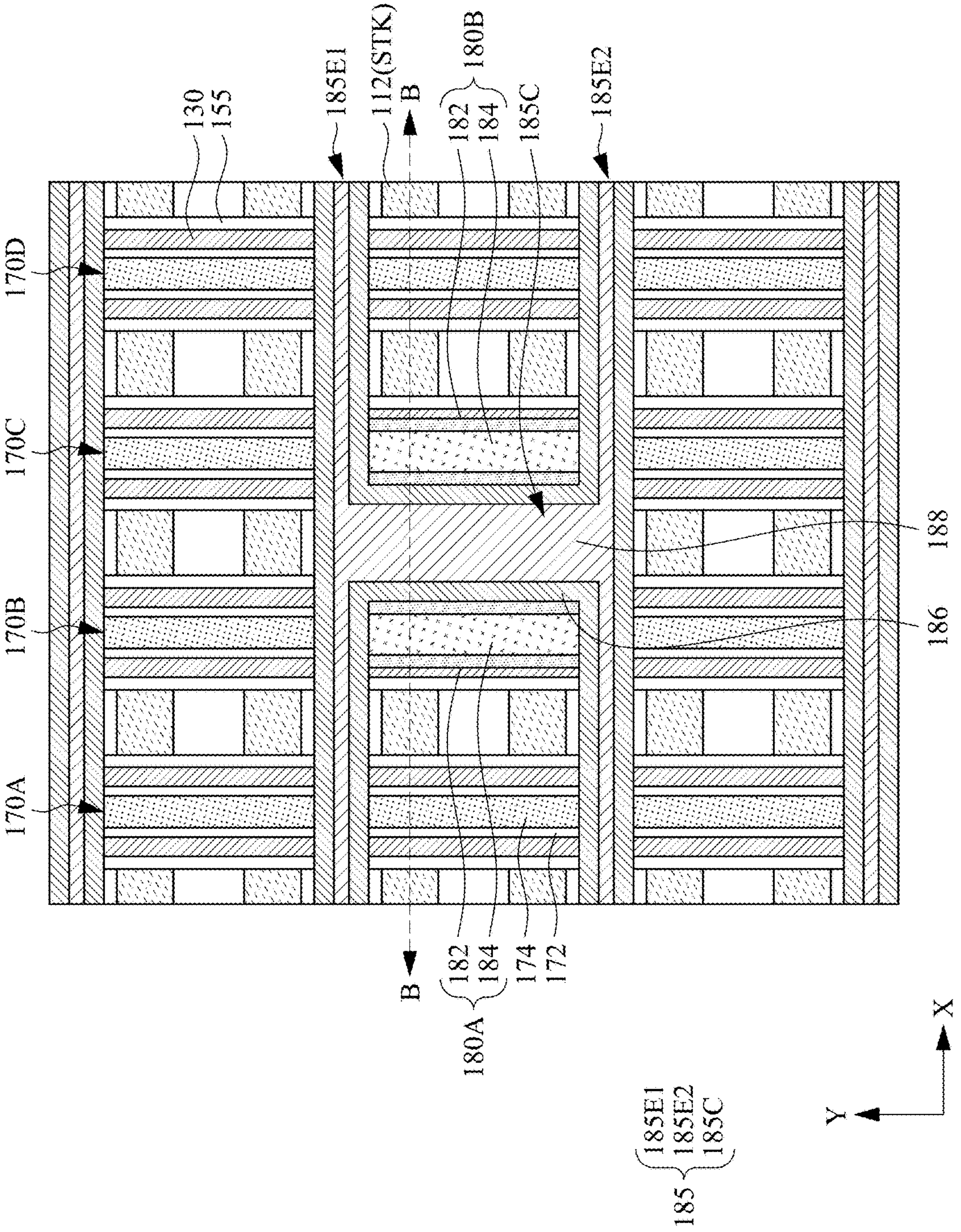
FIGS. 24A and 24B illustrate a semiconductor device in accordance with some embodiments of the present disclosure.
Figure 24B:
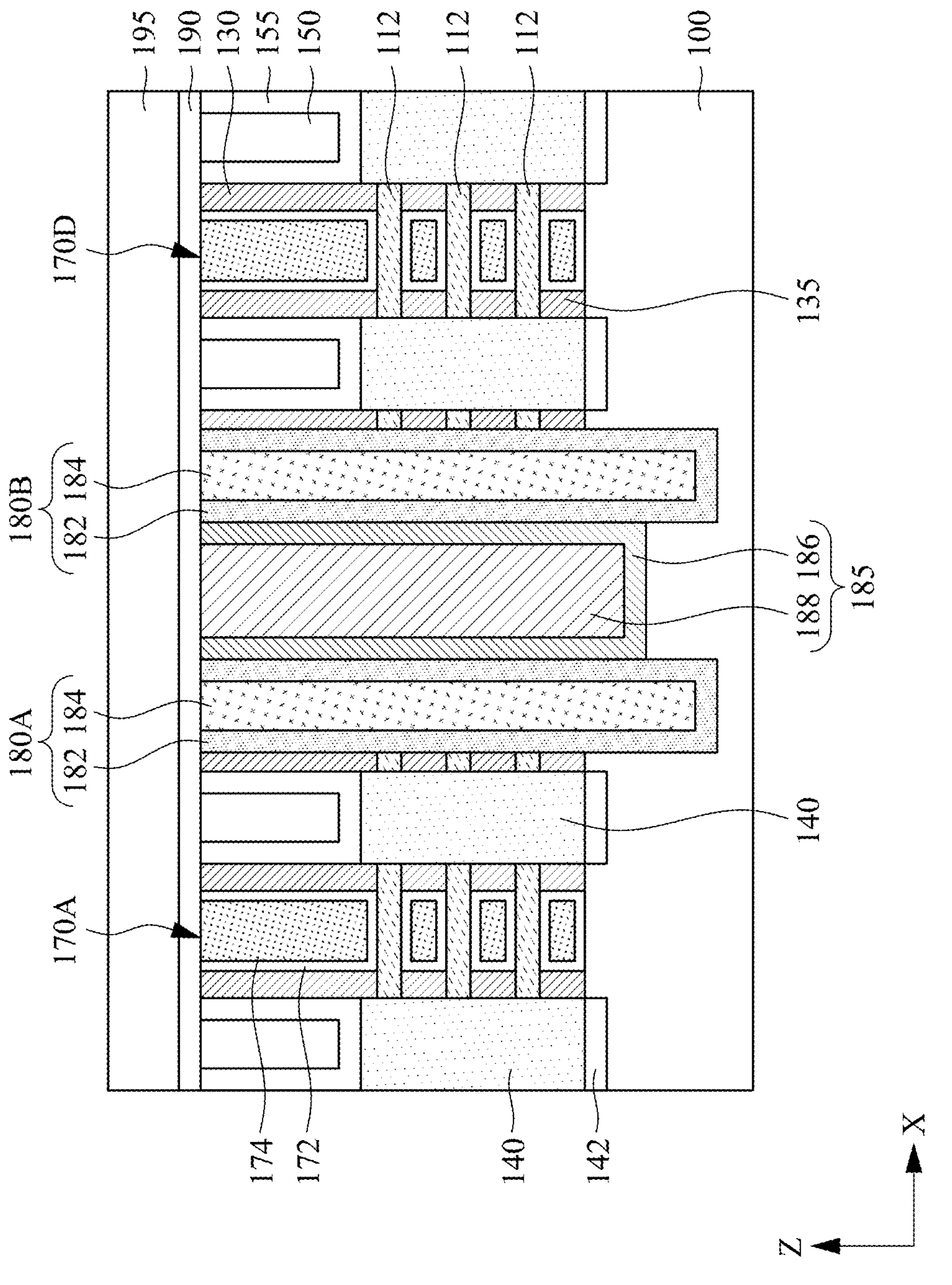

FIGS. 24A and 24B illustrate a semiconductor device in accordance with some embodiments of the present disclosure. The structure shown in FIGS. 24A and 24B is similar to the structure shown in FIGS. 4A and 4B, the formation method may be similar to those described with respect to FIGS. 2A to 4B, and thus relevant details will not be repeated for brevity.

The difference between the structure of FIGS. 24A and 24B and the structure of FIGS. 4A and 4B is that, there are dielectric layers 142 under the source/drain epitaxial structures 140, respectively. For example, prior to forming the source/drain epitaxial structures 140, the dielectric layers 142 may be formed in the source/drain openings, such that the source/drain epitaxial structures 140 may be formed over the respective dielectric layers 142. In some embodiments, the dielectric layers 142 may include oxide, nitride, or other suitable dielectric material.

It is noted that the formation order of the metal gate structures 170A to 170D, the isolation structures 180A and 180B, and the isolation structures 185 as shown in FIGS. 24A and 24B is the same as those described with respect to FIGS. 2A to 4B. However, the formation order of the metal gate structures 170A to 170D, the isolation structures 180A and 180B, and the isolation structures 185 as shown in FIGS. 24A and 24B can also be the same as those described with respect to FIGS. 5A to 7B, 8A to 10B, 11A to 13B, 14A to 16B, or 17A to 19B, and the structural relationship among the metal gate structures 170A to 170D, the isolation structures 180A and 180B, and the isolation structures 185 may be similar to those described in FIGS. 7A and 7B, 10A and 10B, 13A and 13B, 16A and 16B, or 19A and 19B. The only difference is that there are dielectric layers 142 under the source/drain epitaxial structures 140, respectively.

FIGS. 25A to 25F illustrate active regions of a semiconductor device in accordance with some embodiments of the present disclosure. In greater detail, FIGS. 25A to 25F illustrate active regions in a single cell height. It is noted in FIGS. 25A to 25F illustrate semiconductor channel layers 112A and semiconductor channel layers 112B extending along the first direction (e.g. X-direction), in which each of the semiconductor channel layers 112A may include a different width than each of the semiconductor channel layers 112B along the second direction (e.g., Y-direction), or the semiconductor channel layers 112A may be misaligned with the semiconductor channel layers 112B along the first direction (e.g. X-direction), or the number of the semiconductor channel layers 112A may be different from the number the semiconductor channel layers 112B. These differences result in a jog region (e.g., the connection semiconductor layer 112C) between the semiconductor channel layers 112A and the semiconductor channel layer(s) 112B. Here, the term "jog region" may be referred to a bridge portion that connects the semiconductor channel layers 112A and the respective semiconductor channel layer(s) 112B with different widths, positons, or numbers, and will result in a non-linear sidewall profile.

Figure 25A:
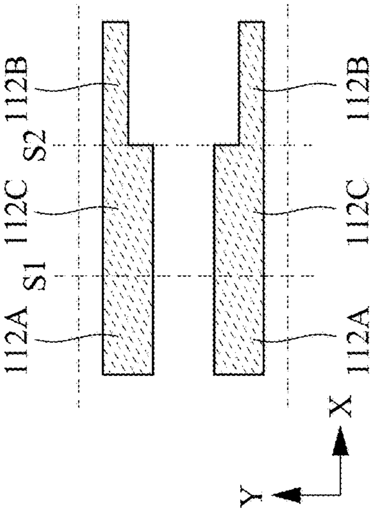
FIGS. 25A to 25F illustrate active regions of a semiconductor device in accordance with some embodiments of the present disclosure.
Figure 25B:
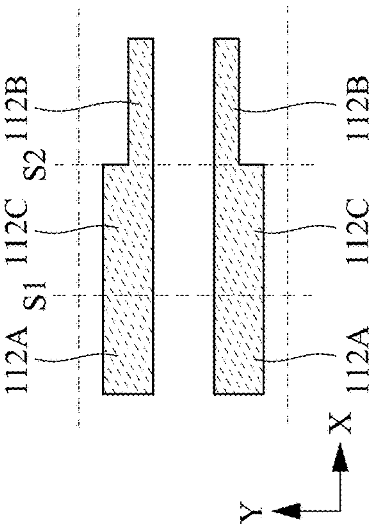

Reference is made to FIGS. 25A and 25B, the semiconductor channel layers 112A are thicker than the semiconductor channel layers 112B along the second direction, and the semiconductor channel layers 112A are connected with the semiconductor channel layers 112B through the respective connection semiconductor layers 112C, in which the connection semiconductor layers 112C may include a same material as the semiconductor channel layers 112A and 112B. The semiconductor channel layers 112A and 112B and the connection semiconductor layers 112C may be formed by patterning a semiconductor layer.

Figure 25C:
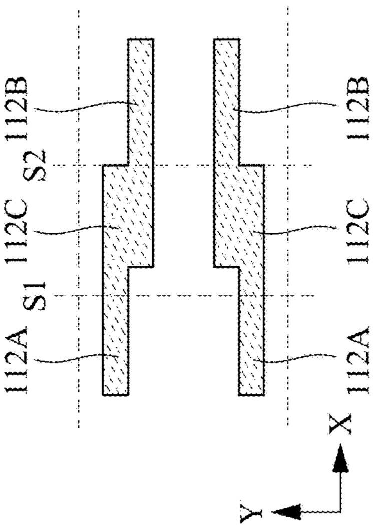
Figure 25D:
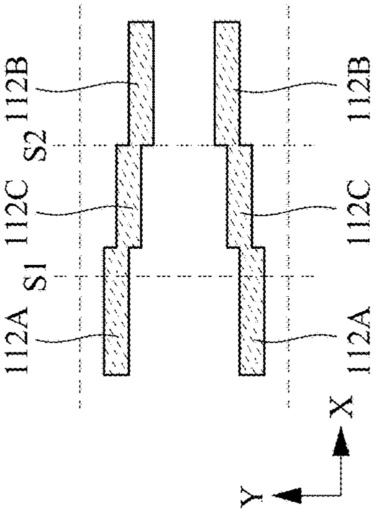

Reference is made to FIGS. 25C and 25D, the semiconductor channel layers 112A are misaligned with the semiconductor channel layers 112B along the first direction, and the semiconductor channel layers 112A are connected with the semiconductor channel layers 112B through the respective connection semiconductor layers 112C. In FIG. 25C, each of the connection semiconductor layers 112C is thicker than each of the semiconductor channel layers 112A and 112B. In FIG. 25D, each of the connection semiconductor layers 112C may include a substantially same thickness as each of the semiconductor channel layers 112A and 112B.

Figure 25E:
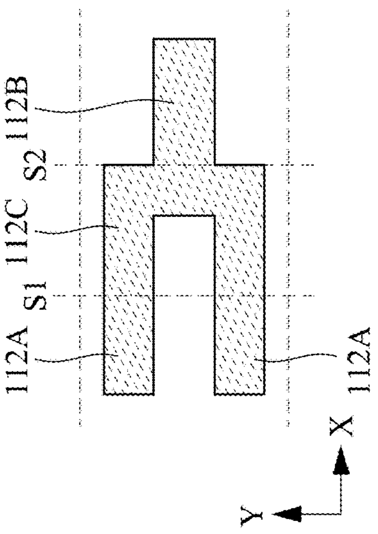
Figure 25F:
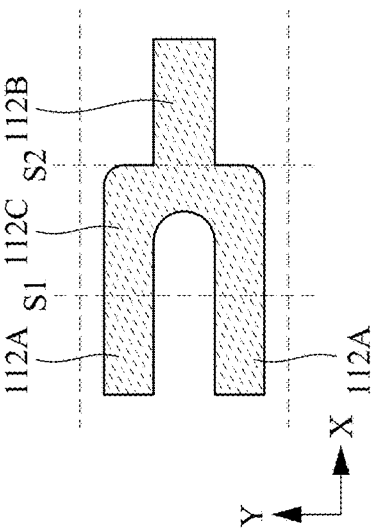

In FIGS. 25E and 25F, the number of the semiconductor channel layers 112A is greater than the number of the semiconductor channel layer 112B. For example, shown there are two semiconductor channel layers 112A connected with a single semiconductor channel layer 112B through a connection semiconductor layer 112C. In some embodiments, the connection semiconductor layer 112C may include a non-linear top profile.

Figure 26:
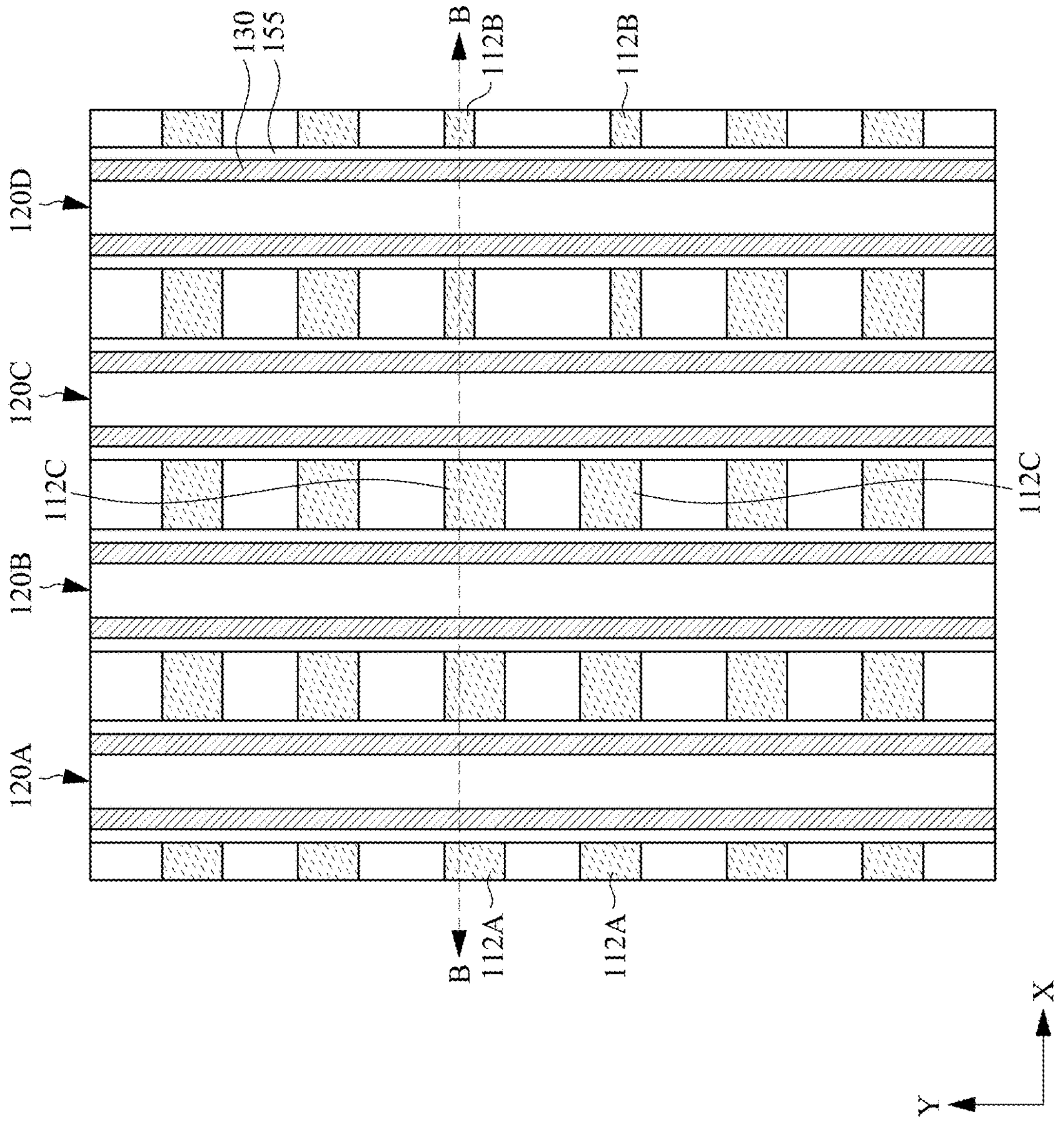
FIGS. 26 to 27 illustrate various stages of manufacturing a semiconductor device in accordance with some embodiments of the present disclosure.
Figure 27:
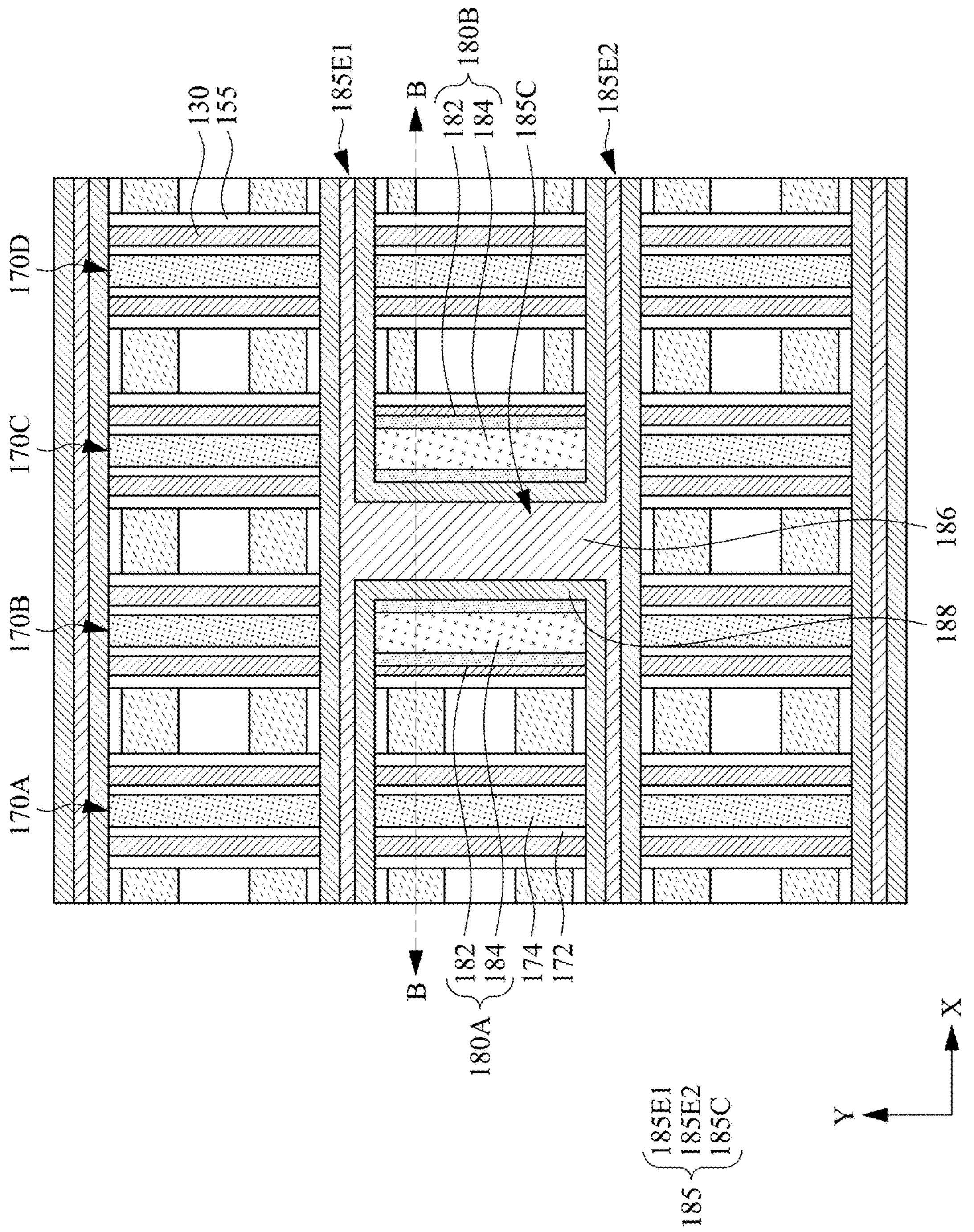

FIGS. 26 to 27 illustrate various stages of manufacturing a semiconductor device in accordance with some embodiments of the present disclosure. It is noted that some elements or details in FIGS. 26 to 27 may be similar to those described above, and thus relevant details will not be repeated for brevity.

Reference is made to FIG. 26. FIG. 26 is similar to FIG. 1A, in which parts of the semiconductor channel layers 112 are replaced with the semiconductor channel layers 112A, 112B, and the connection semiconductor layers 112C of FIG. 25A. It is noted that the semiconductor channel layers 112A, 112B, and the connection semiconductor layers 112C in FIG. 26 may also be replaced with the semiconductor channel layers 112A, the semiconductor channel layer(s) 112B, and the connection semiconductor layer(s) 112C as shown in FIGS. 25B to 25F.

In FIG. 26, dummy gate structures 120A, 120B, 120C, and 120D are formed. For example, the dummy gate structure 120A is formed over the semiconductor channel layers 112A. The dummy gate structure 120B is formed crossing the boundary (e.g., boundary S1, see FIG. 25A) between the semiconductor channel layers 112A and the connection semiconductor layers 112C. The dummy gate structure 120C is formed crossing the boundary (e.g., boundary S2, see FIG. 25A) between the semiconductor channel layers 112B and the connection semiconductor layers 112C. The dummy gate structure 120D is formed over the semiconductor channel layers 112B. The cross-sectional view along line B-B of FIG. 26 may be similar to the cross-sectional view of FIG. 2B.

Reference is made to FIG. 27. The dummy gate structures 120A, 120B, 120C, and 120D are replaced with the metal gate structures 170A, 170B, 170C, and 170D as described above. The isolation structures 180A and 180B and the isolation structure 185 are also formed. In particular, the isolation structure 180A may be formed by replacing materials of the semiconductor channel layers 112A and the connection semiconductor layers 112C at the boundary (e.g., boundary S1, see FIG. 25A) between the semiconductor channel layers 112A and the connection semiconductor layers 112C with isolation materials. The isolation structure 180B may be formed by replacing materials of the semiconductor channel layers 112B and the connection semiconductor layers 112C at the boundary (e.g., boundary S2, see FIG. 25A) between the semiconductor channel layers 112B and the connection semiconductor layers 112C with isolation materials. Moreover, the isolation structure 185 may be formed by replacing materials of the connection semiconductor layers 112C with isolation materials. The formation method of the metal gate structures 170A, 170B, 170C, and 170D, the isolation structures 180A and 180B, and the isolation structure 185 have been described above, and thus relevant details will not be repeated for brevity. The cross-sectional view along line B-B of FIG. 27 may be similar to the cross-sectional view of FIG. 4B.

In some embodiments, transistors may be formed over the semiconductor channel layers 112A and 112B. For example, the metal gate structure 170A is formed over and wrapping around the semiconductor channel layers 112A, source/drain epitaxial structures may be formed on opposite sides of the metal gate structure 170A and in contact with opposite ends of the semiconductor channel layers 112A. The metal gate structure 170D is formed over and wrapping around the semiconductor channel layers 112B, source/drain epitaxial structures may be formed on opposite sides of the metal gate structure 170D and in contact with opposite ends of the semiconductor channel layers 112B.

FIGS. 28A to 28F illustrate active regions of a semiconductor device in accordance with some embodiments of the present disclosure. In greater detail, FIGS. 28A to 28F illustrate active regions in a double cell height. It is noted in FIGS. 28A to 28F illustrate semiconductor channel layers 112A1, 112A2, and 112A3 and semiconductor channel layers 112B1, 112B2, and 112B3 extending along the first direction (e.g. X-direction), in which jog region (e.g., the connection semiconductor layers 112C1, 112C2, and 112C3) are presented between the semiconductor channel layers 112A1, 112A2, and 112A3 and semiconductor channel layers 112B1, 112B2, and 112B3.

Figure 28B:
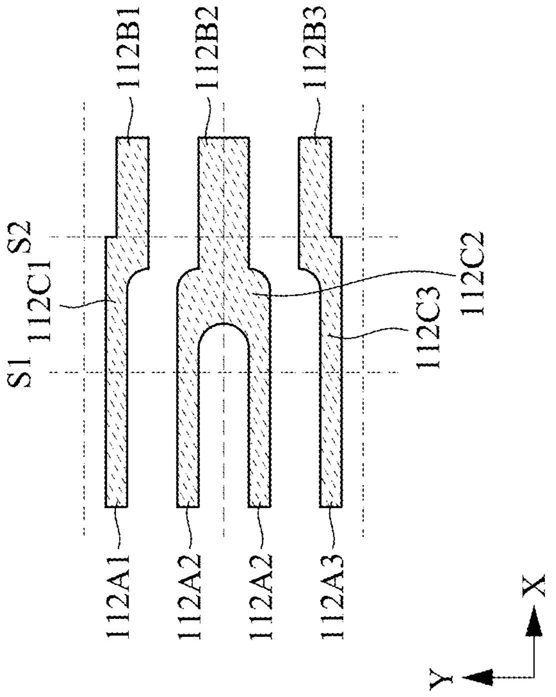
FIGS. 28A to 28F illustrate active regions of a semiconductor device in accordance with some embodiments of the present disclosure.
Figure 28A:
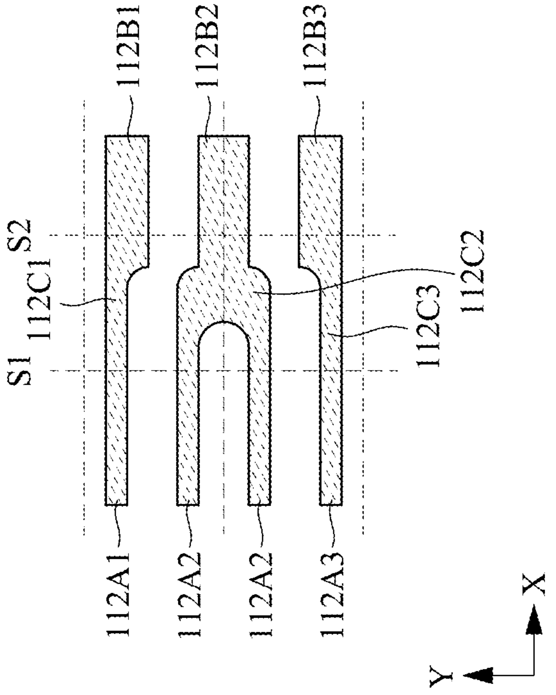

In FIG. 28A, the width of the semiconductor channel layer 112A1 is less than the width of the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B1, and the semiconductor channel layers 112A2 are connected with the semiconductor channel layer 112B2 through a connection semiconductor layer 112C2. The width of the semiconductor channel layer 112A3 is less than the width of the semiconductor channel layer 112B3, and the semiconductor channel layer 112A3 is connected with the semiconductor channel layer 112B3 through a connection semiconductor layer 112C3. The connection semiconductor layers 112C1, 112C2, and 112C3 each may include a non-linear top profile.

In FIG. 28B, the semiconductor channel layer 112A1 is misaligned with the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The semiconductor channel layer 112A3 is misaligned with the semiconductor channel layer 112B3, and the semiconductor channel layer 112A3 is connected with the semiconductor channel layer 112B3 through a connection semiconductor layer 112C3. The connection semiconductor layers 112C1, 112C2, and 112C3 each may include a non-linear top profile.

Figure 28D:
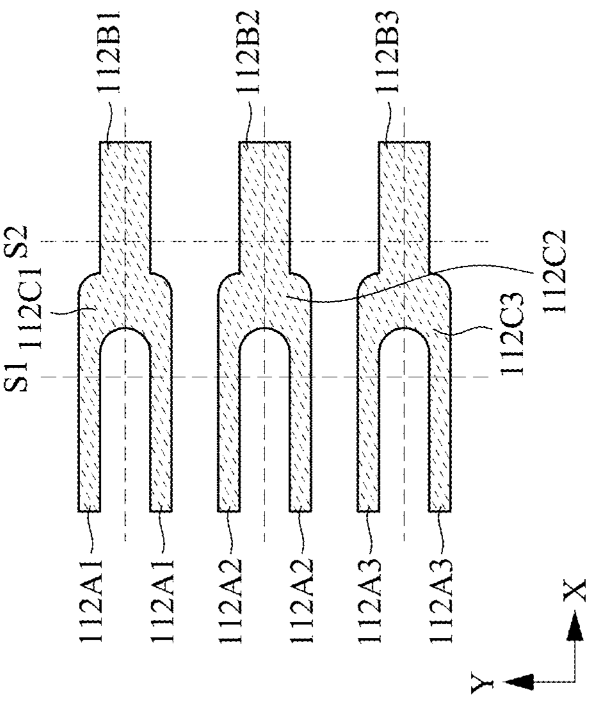
Figure 28C:
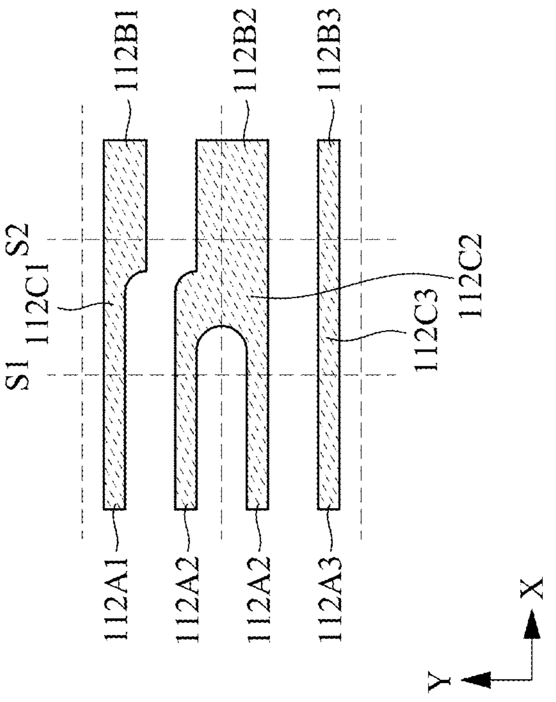

In FIG. 28C, the width of the semiconductor channel layer 112A1 is less than the width of the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The semiconductor channel layer 112A3 is connected with the semiconductor channel layer 112B3 through a connection semiconductor layer 112C3. The connection semiconductor layers 112C1 and 112C2 each may include a non-linear top profile.

In FIG. 28D, the width of the semiconductor channel layers 112A1 is less than the width of the semiconductor channel layer 112B1, and the semiconductor channel layers 112A1 are connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The width of the semiconductor channel layers 112A3 is less than the width of the semiconductor channel layer 112B3, and the semiconductor channel layers 112A3 are connected with the semiconductor channel layer 112B3 through a connection semiconductor layer 112C3. The connection semiconductor layers 112C1, 112C2, and 112C3 each may include a non-linear top profile.

Figure 28E:
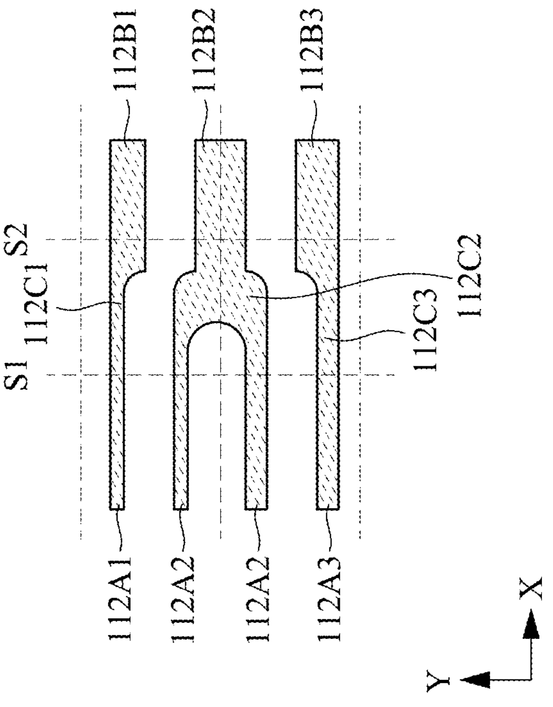

In FIG. 28E, the width of the semiconductor channel layer 112A1 is less than the width of the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The semiconductor channel layer 112A3 is connected with the semiconductor channel layer 112B3 through a connection semiconductor layer 112C3. The connection semiconductor layers 112C1, 112C2, and 112C3 each may include a non-linear top profile.

Figure 28F:
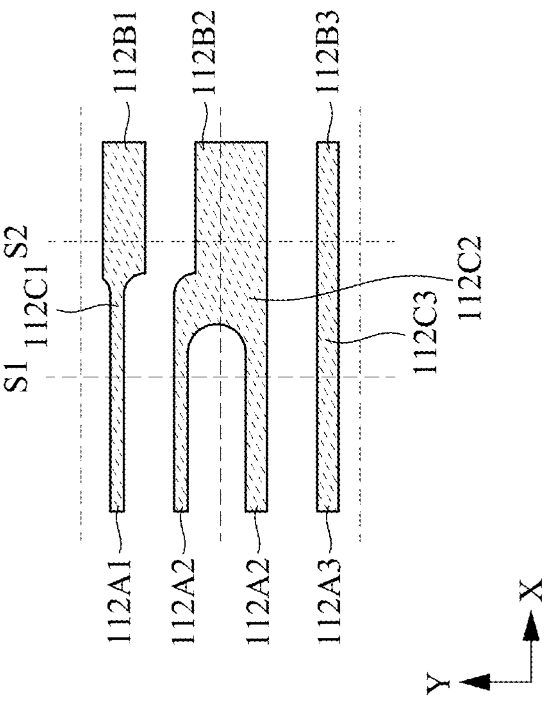

In FIG. 28F, the width of the semiconductor channel layer 112A1 is less than the width of the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The semiconductor channel layer 112A3 is connected with the semiconductor channel layer 112B3 through a connection semiconductor layer 112C3. The connection semiconductor layers 112C1 and 112C2 each may include a non-linear top profile.

Figure 29:
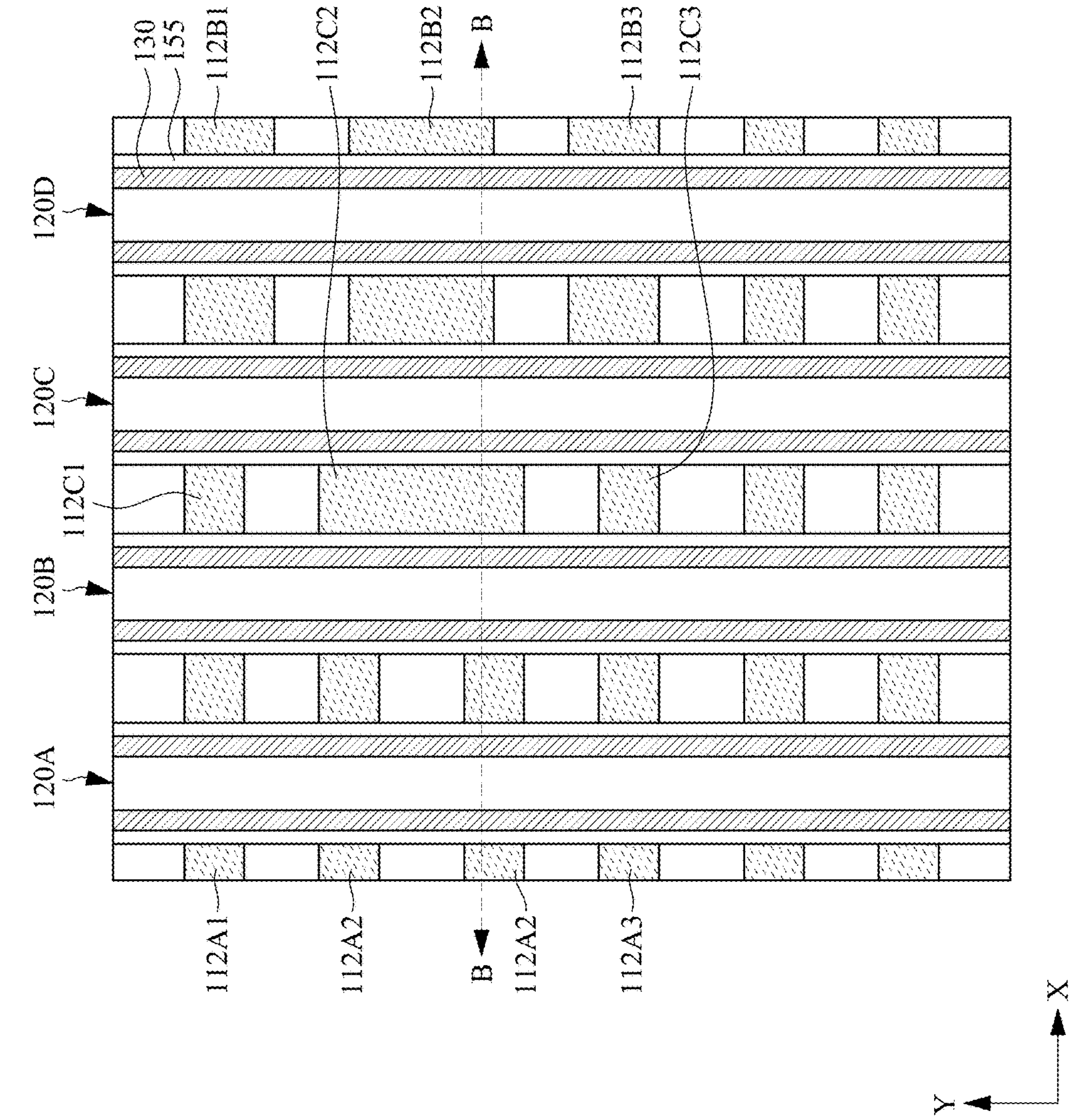
FIGS. 29 to 30 illustrate various stages of manufacturing a semiconductor device in accordance with some embodiments of the present disclosure.
Figure 30:
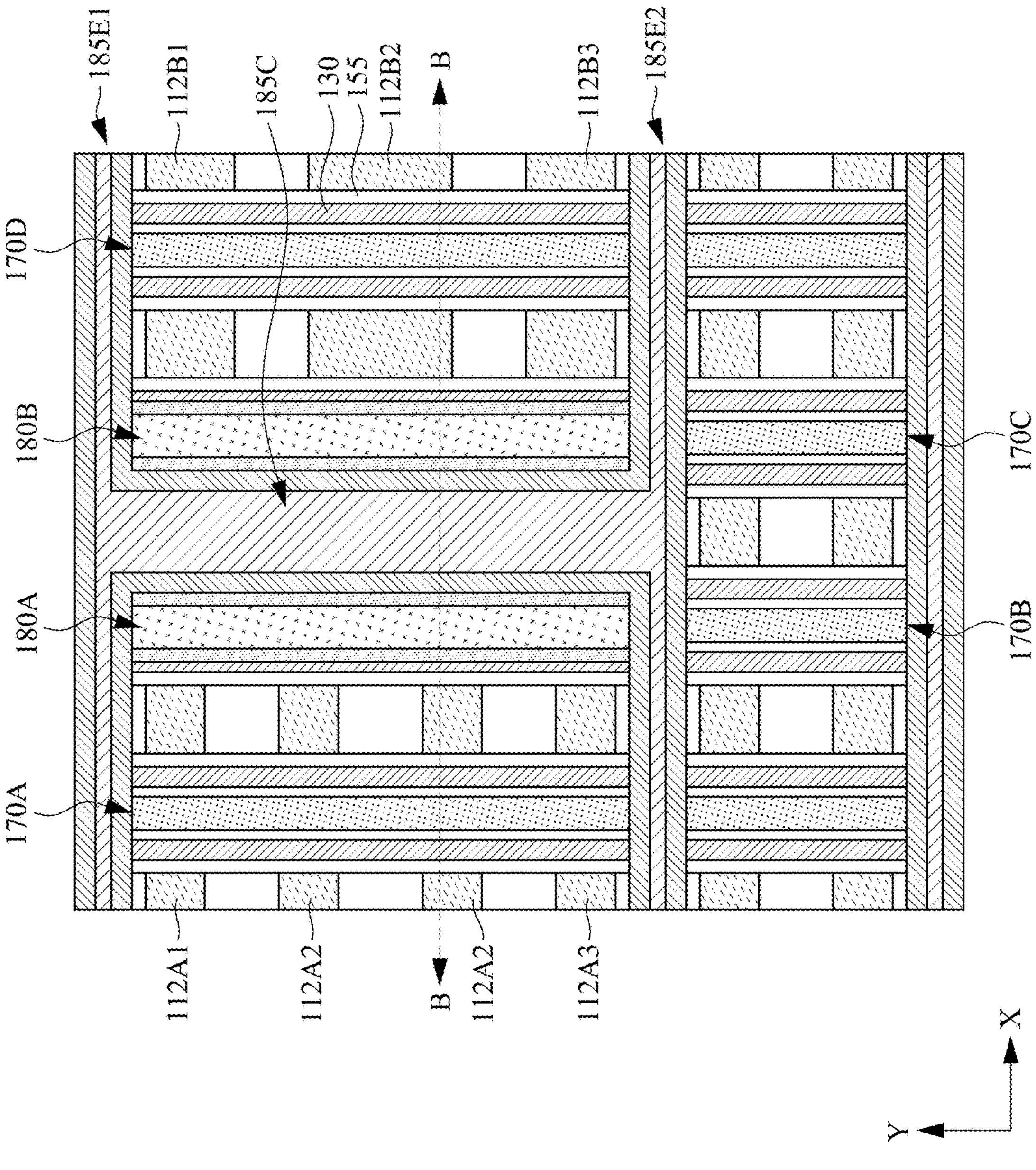

FIGS. 29 to 30 illustrate various stages of manufacturing a semiconductor device in accordance with some embodiments of the present disclosure. It is noted that some elements or details in FIGS. 29 to 30 may be similar to those described above, and thus relevant details will not be repeated for brevity.

Reference is made to FIG. 29. FIG. 29 is similar to FIG. 1A, in which parts of the semiconductor channel layers 112 are replaced with the semiconductor channel layers 112A1, 112A2, and 112A3, the semiconductor channel layers 112B1, 112B2, and 112B3, and the connection semiconductor layers 112C1, 112C2, and 112C3 of FIG. 28A. It is noted that the semiconductor channel layers 112A1, 112A2, and 112A3, the semiconductor channel layers 112B1, 112B2, and 112B3, and the connection semiconductor layers 112C1, 112C2, and 112C3 in FIG. 29 may also be replaced with the semiconductor channel layers 112A1, 112A2, and 112A3, the semiconductor channel layers 112B1, 112B2, and 112B3, and the connection semiconductor layers 112C1, 112C2, and 112C3 as shown in FIGS. 28B to 28F.

In FIG. 29, dummy gate structures 120A, 120B, 120C, and 120D are formed. For example, the dummy gate structure 120A is formed over the semiconductor channel layers 112A1, 112A2, and 112A3. The dummy gate structure 120B is formed crossing the boundary (e.g., boundary S1, see FIG. 25A) between the semiconductor channel layers 112A1, 112A2, and 112A3 and the corresponding connection semiconductor layers 112C1, 112C2, and 112C3. The dummy gate structure 120C is formed crossing the boundary (e.g., boundary S2, see FIG. 25A) between the semiconductor channel layers 112B1, 112B2, and 112B3 and the corresponding connection semiconductor layers 112C1, 112C2, and 112C3. The dummy gate structure 120D is formed over the semiconductor channel layers 112B1, 112B2, and 112B3. The cross-sectional view along line B-B of FIG. 29 may be similar to the cross-sectional view of FIG. 2B.

Reference is made to FIG. 30. The dummy gate structures 120A, 120B, 120C, and 120D are replaced with the metal gate structures 170A, 170B, 170C, and 170D as described above. The isolation structures 180A and 180B and the isolation structure 185 are also formed. In particular, the isolation structure 180A may be formed by replacing materials of the semiconductor channel layers 112A1, 112A2, and 112A3 and the connection semiconductor layers 112C1, 112C2, and 112C3 at the boundary (e.g., boundary S1, see FIG. 28A) between the semiconductor channel layers 112A1, 112A2, and 112A3 and the connection semiconductor layers 112C1, 112C2, and 112C3 with isolation materials. The isolation structure 180B may be formed by replacing materials of the semiconductor channel layers 112B1, 112B2, and 112B3 and the connection semiconductor layers 112C1, 112C2, and 112C3 at the boundary (e.g., boundary S2, see FIG. 28A) between the semiconductor channel layers 112B1, 112B2, and 112B3 and the connection semiconductor layers 112C1, 112C2, and 112C3 with isolation materials. Moreover, the isolation structure 185 may be formed by replacing materials of the connection semiconductor layers 112C1, 112C2, and 112C3 with isolation materials. The formation method of the metal gate structures 170A, 170B, 170C, and 170D, the isolation structures 180A and 180B, and the isolation structure 185 have been described above, and thus relevant details will not be repeated for brevity. The cross-sectional view along line B-B of FIG. 30 may be similar to the cross-sectional view of FIG. 4B.

In some embodiments, transistors may be formed over the semiconductor channel layers 112A1, 112A2, and 112A3 and the semiconductor channel layers 112B1, 112B2, and 112B3. For example, the metal gate structure 170A is formed over and wrapping around the semiconductor channel layers 112A1, 112A2, and 112A3, source/drain epitaxial structures may be formed on opposite sides of the metal gate structure 170A and in contact with opposite ends of the semiconductor channel layers 112A1, 112A2, and 112A3. The metal gate structure 170D is formed over and wrapping around the semiconductor channel layers 112B1, 112B2, and 112B3, source/drain epitaxial structures may be formed on opposite sides of the metal gate structure 170D and in contact with opposite ends of the semiconductor channel layers 112B1, 112B2, and 112B3.

Figure 31B:
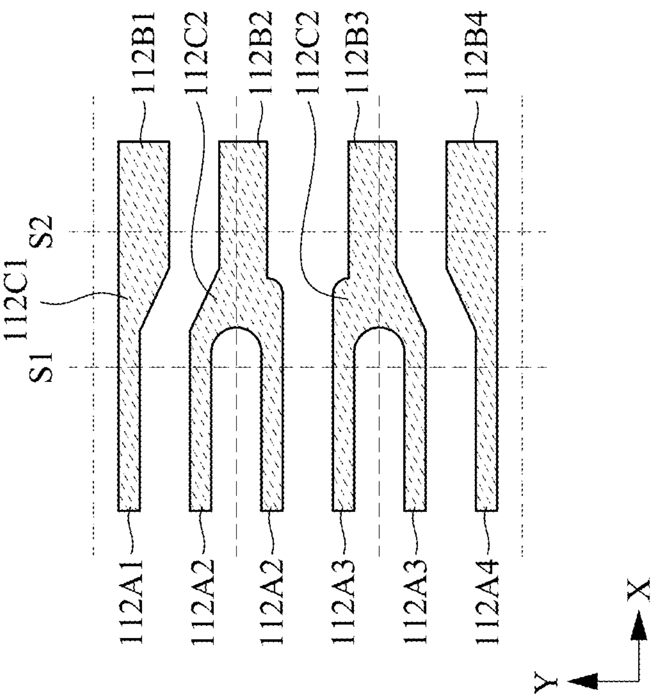
FIGS. 31A to 31B illustrate active regions of a semiconductor device in accordance with some embodiments of the present disclosure.
Figure 31A:
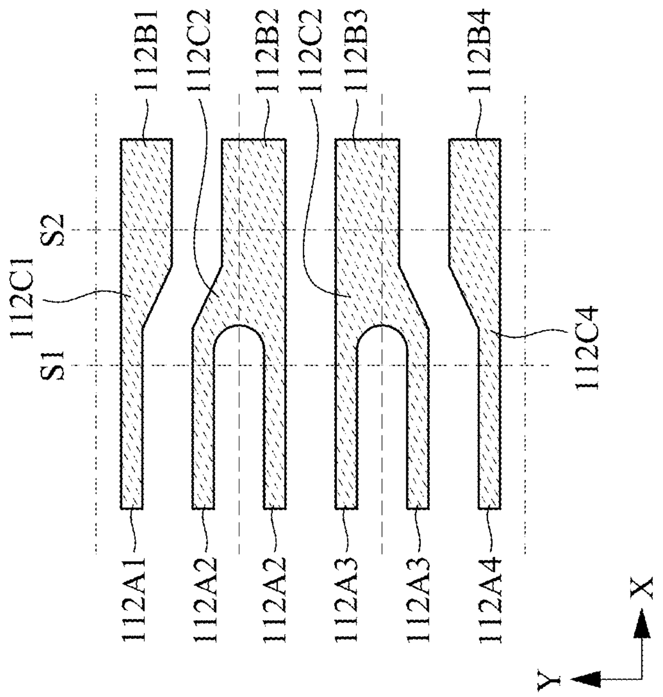

FIGS. 31A to 31B illustrate active regions of a semiconductor device in accordance with some embodiments of the present disclosure. In greater detail, FIGS. 25A to 25F illustrate active regions in a 1.5 cell height. It is noted in FIGS. 31A to 31B illustrate semiconductor channel layers 112A1, 112A2, 112A3, and 112A4 and semiconductor channel layers 112B1, 112B2, 112B3, and 112B4 extending along the first direction (e.g. X-direction), in which jog regions (e.g., the connection semiconductor layers 112C1, 112C2, 112C3, and 112C4) are presented between the semiconductor channel layers 112A1, 112A2, 112A3, and 112A4 and semiconductor channel layers 112B1, 112B2, 112B3, and 112B4.

In FIGS. 31A to 31B, the width of the semiconductor channel layer 112A1 is less than the width of the semiconductor channel layer 112B1, and the semiconductor channel layer 112A1 is connected with the semiconductor channel layer 112B1 through a connection semiconductor layer 112C1. The width of the semiconductor channel layers 112A2 is less than the width of the semiconductor channel layer 112B2, and the semiconductor channel layers 112A2 are connected with the semiconductor channel layer 112B2 through a connection semiconductor layer 112C2. The width of the semiconductor channel layers 112A3 is less than the width of the semiconductor channel layer 112B3, and the semiconductor channel layers 112A3 are connected with the semiconductor channel layer 112B3 through a connection semiconductor layer 112C3. The width of the semiconductor channel layer 112A4 is less than the width of the semiconductor channel layer 112B4, and the semiconductor channel layer 112A4 is connected with the semiconductor channel layer 112B4 through a connection semiconductor layer 112C4. The connection semiconductor layers 112C1, 112C2, 112C3, and 112C4 each may include a non-linear top profile.

Figure 32:
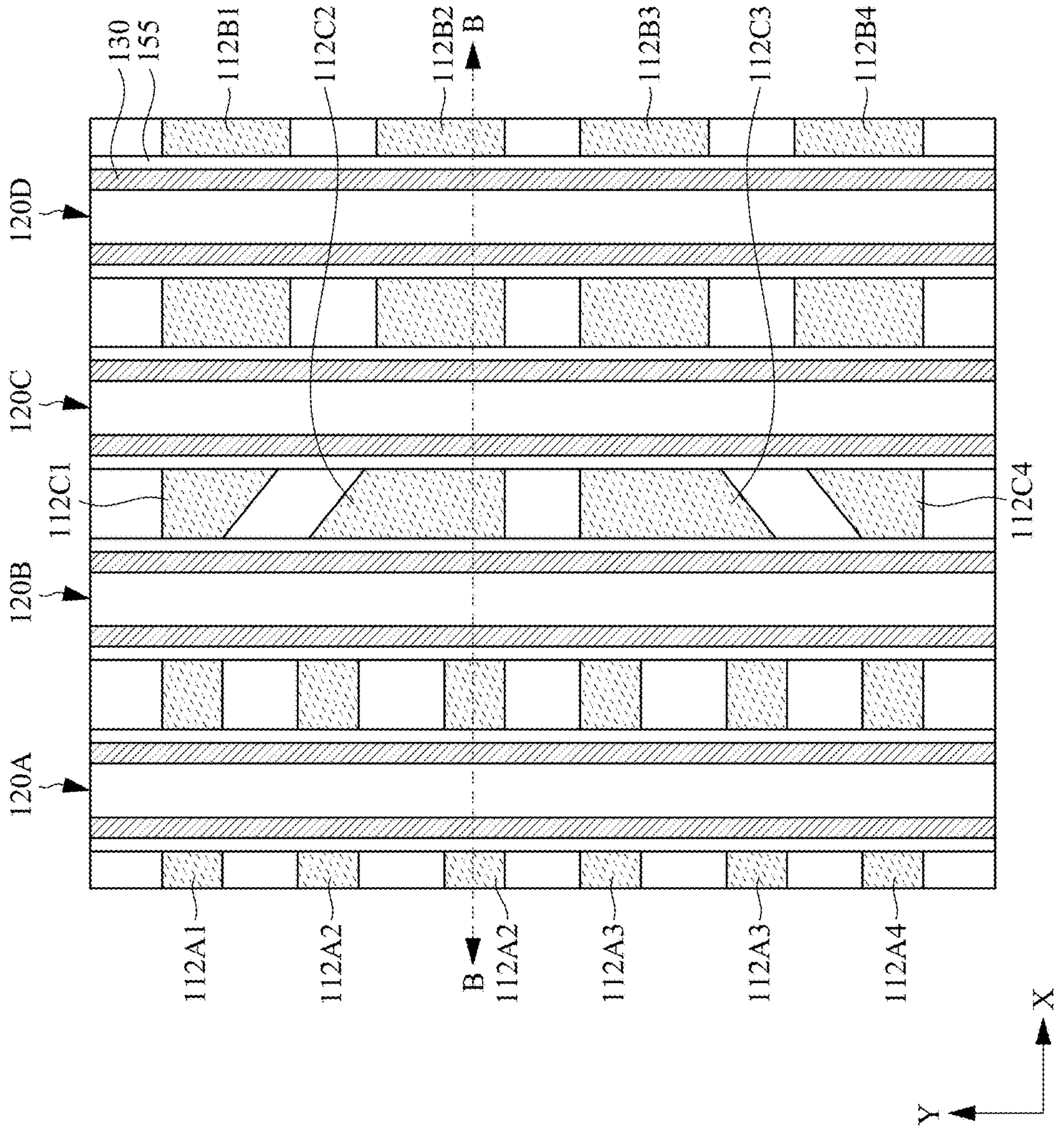
FIGS. 32 to 33 illustrate various stages of manufacturing a semiconductor device in accordance with some embodiments of the present disclosure.
Figure 33:
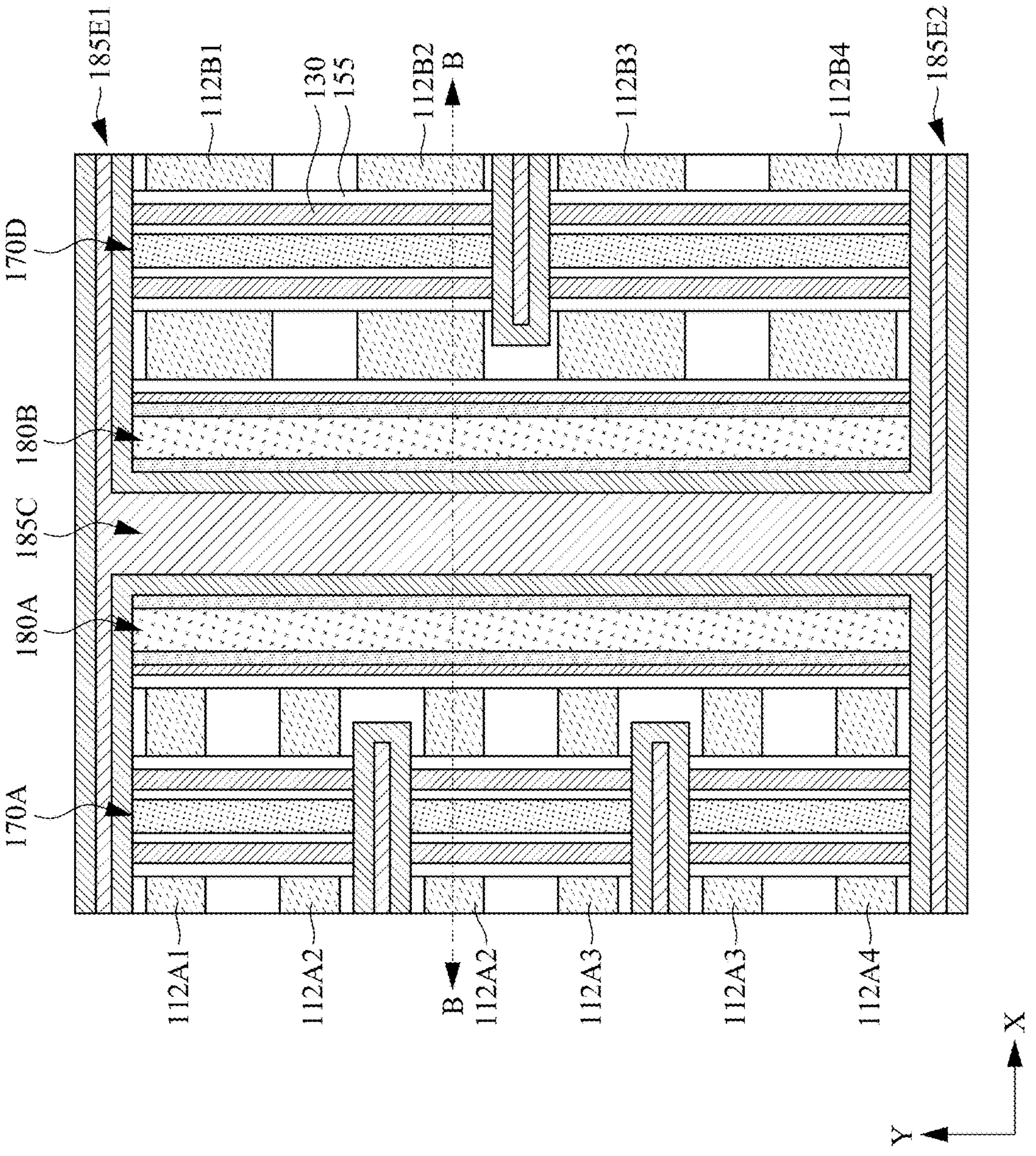

FIGS. 32 to 33 illustrate various stages of manufacturing a semiconductor device in accordance with some embodiments of the present disclosure. It is noted that some elements or details in FIGS. 32 to 33 may be similar to those described above, and thus relevant details will not be repeated for brevity.

Reference is made to FIG. 32. FIG. 29 is similar to FIG. 1A, in which parts of the semiconductor channel layers 112 are replaced with the semiconductor channel layers 112A1, 112A2, 112A3, and 112A4, the semiconductor channel layers 112B1, 112B2, 112B3, and 112B4, and the connection semiconductor layers 112C1, 112C2, 112C3, and 112C4 of FIG. 31A. It is noted that the semiconductor channel layers 112A1, 112A2, 112A3, and 112A4, the semiconductor channel layers 112B1, 112B2, 112B3, and 112B4, and the connection semiconductor layers 112C1, 112C2, 112C3, and 112C4 in FIG. 32 may also be replaced with the semiconductor channel layers 112A1, 112A2, 112A3, and 112A4, the semiconductor channel layers 112B1, 112B2, 112B3, and 112B4, and the connection semiconductor layers 112C1, 112C2, 112C3, and 112C4 as shown in FIG. 31B.

In FIG. 32, dummy gate structures 120A, 120B, 120C, and 120D are formed. For example, the dummy gate structure 120A is formed over the semiconductor channel layers 112A1, 112A2, 112A3, and 112A4. The dummy gate structure 120B is formed crossing the boundary (e.g., boundary S1, see FIG. 25A) between the semiconductor channel layers 112A1, 112A2, 112A3, and 112A4 and the corresponding connection semiconductor layers 112C1, 112C2, 112C3, and 112C4. The dummy gate structure 120C is formed crossing the boundary (e.g., boundary S2, see FIG. 25A) between the semiconductor channel layers 112B1, 112B2, 112B3, and 112B4 and the corresponding connection semiconductor layers 112C1, 112C2, 112C3, and 112C4. The dummy gate structure 120D is formed over the semiconductor channel layers 112B1, 112B2, 112B3, and 112B4. The cross-sectional view along line B-B of FIG. 32 may be similar to the cross-sectional view of FIG. 2B.

Reference is made to FIG. 33. The dummy gate structures 120A, 120B, 120C, and 120D are replaced with the metal gate structures 170A, 170B, 170C, and 170D as described above. The isolation structures 180A and 180B and the isolation structure 185 are also formed. In particular, the isolation structure 180A may be formed by replacing materials of the semiconductor channel layers 112A1, 112A2, 112A3, and 112A4 and the connection semiconductor layers 112C1, 112C2, 112C3, and 112C4 at the boundary (e.g., boundary S1, see FIG. 31A) between the semiconductor channel layers 112A1, 112A2, 112A3, and 112A4 and the connection semiconductor layers 112C1, 112C2, 112C3, and 112C4 with isolation materials. The isolation structure 180B may be formed by replacing materials of the semiconductor channel layers 112B1, 112B2, 112B3, and 112B4 and the connection semiconductor layers 112C1, 112C2, 112C3, and 112C4 at the boundary (e.g., boundary S2, see FIG. 31A) between the semiconductor channel layers 112B1, 112B2, 112B3, and 112B4 and the connection semiconductor layers 112C1, 112C2, 112C3, and 112C4 with isolation materials. Moreover, the isolation structure 185 may be formed by replacing materials of the connection semiconductor layers 112C1, 112C2, 112C3, and 112C4 with isolation materials. The formation method of the metal gate structures 170A, 170B, 170C, and 170D, the isolation structures 180A and 180B, and the isolation structure 185 have been described above, and thus relevant details will not be repeated for brevity. The cross-sectional view along line B-B of FIG. 33 may be similar to the cross-sectional view of FIG. 4B.

In some embodiments, transistors may be formed over the semiconductor channel layers 112A1, 112A2, 112A3, and 112A4 and the semiconductor channel layers 112B1, 112B2, 112B3, and 112B4. For example, the metal gate structure 170A is formed over and wrapping around the semiconductor channel layers 112A1, 112A2, 112A3, and 112A4, source/drain epitaxial structures may be formed on opposite sides of the metal gate structure 170A and in contact with opposite ends of the semiconductor channel layers 112A1, 112A2, 112A3, and 112A4. The metal gate structure 170D is formed over and wrapping around the semiconductor channel layers 112B1, 112B2, 112B3, and 112B4, source/drain epitaxial structures may be formed on opposite sides of the metal gate structure 170D and in contact with opposite ends of the semiconductor channel layers 112B1, 112B2, 112B3, and 112B4.

Figure 34:
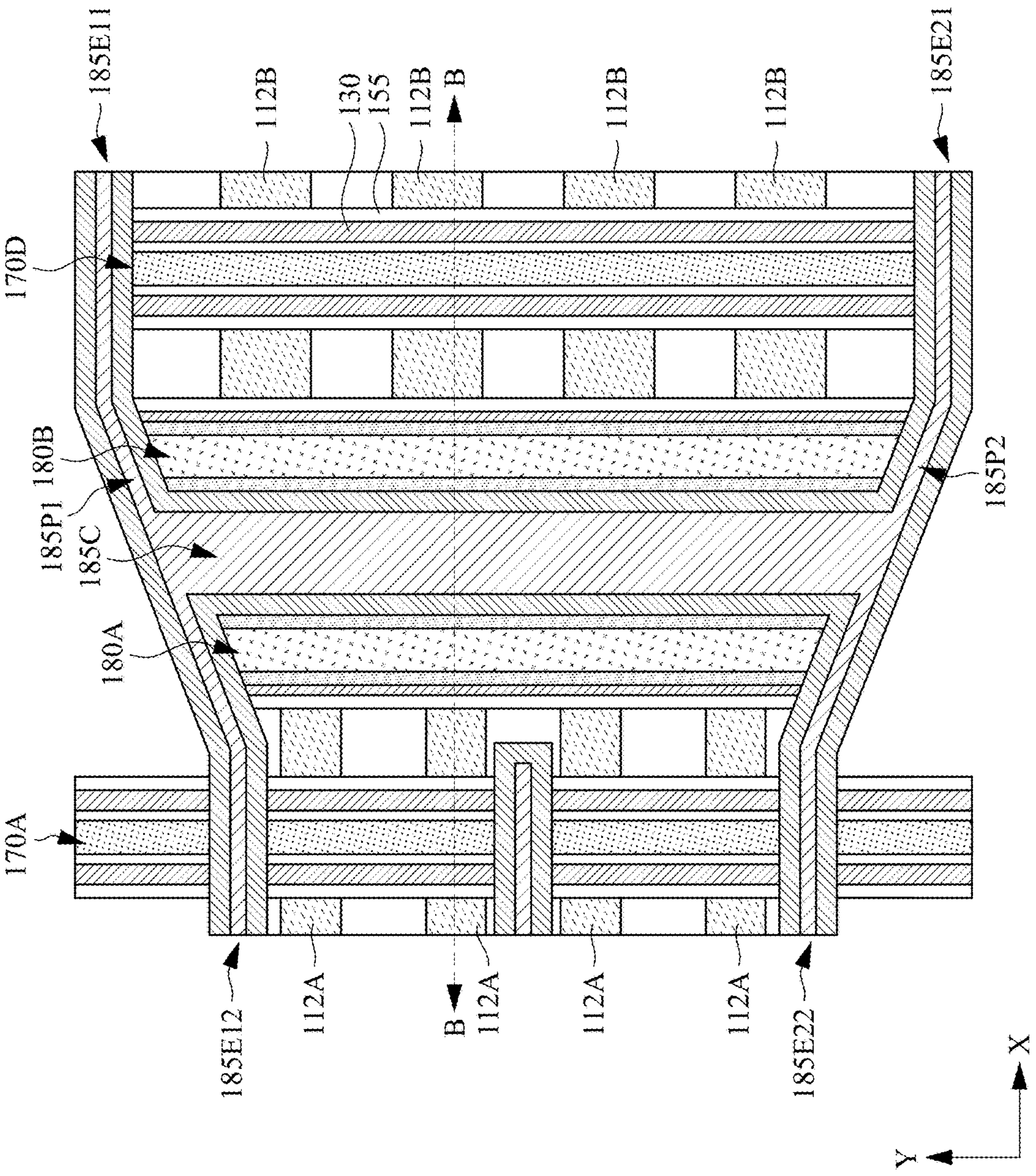
FIG. 34 illustrates a semiconductor device in accordance with some embodiments of the present disclosure.

FIG. 34 illustrates a semiconductor device in accordance with some embodiments of the present disclosure. It is noted that some elements of FIG. 34 have been described above, and thus relevant details will not be repeated.

Shown there is semiconductor channel layers 112A and semiconductor channel layers 112B extending along the first direction (e.g., X-direction), in which the semiconductor channel layers 112A may be narrower than the semiconductor channel layers 112B along the second direction (e.g., Y-direction), and the semiconductor channel layers 112A are misaligned with the semiconductor channel layers 112B along the first direction (e.g., X-direction).

In some embodiments, transistors may be formed over the semiconductor channel layers 112A and 112B. For example, the metal gate structure 170A is formed over and wrapping around the semiconductor channel layers 112A, source/drain epitaxial structures may be formed on opposite sides of the metal gate structure 170A and in contact with opposite ends of the semiconductor channel layers 112A. The metal gate structure 170D is formed over and wrapping around the semiconductor channel layers 112B, source/drain epitaxial structures may be formed on opposite sides of the metal gate structure 170D and in contact with opposite ends of the semiconductor channel layers 112B. The isolation structures 180A and 180B and the isolation structure 185 are also formed. The cross-sectional view along line B-B of FIG. 34 may be similar to the cross-sectional view of FIG. 4B.

With respect to the isolation structure 185, from the top view, the isolation structure 185 includes an extension portions 185E11 and 185E12 extending along the first direction (e.g., X-direction), and an inclined portion 185P1 connecting the extension portions 185E11 and 185E12. The isolation structure 185 further includes an extension portions 185E21 and 185E22 extending along the first direction (e.g., X-direction), and an inclined portion 185P2 connecting the extension portions 185E21 and 185E22. The isolation structure 185 further includes a connection portion 185C connecting the inclined portion 185P1 and the inclined portion 185P2. Here, the "inclined portion" may be referred to a portion that forms a non-zero angle with the first direction (e.g., X-direction), in which the non-zero angle is between 0 and 90 degrees. In some embodiments, the distance between the extension portions 185E11 and 185E21 along the second direction (e.g., Y-direction) is greater than the distance between the extension portions 185E12 and 18522 along the second direction.

With respect to the isolation structures 180A and 180B, from the top view, the isolation structure 180A connects the extension portions 185E12 and 18522 of the isolation structure 185, and the isolation structure 180B connects the extension portions 185E11 and 18521 of the isolation structure 185. The isolation structure 180A is longer than the isolation structure 180B along the second direction (e.g., Y-direction).

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide an isolation structure having an H-shape top profile. The isolation structure may cut on a dummy region of semiconductor channel layers (e.g., a region where no active device is formed thereon), which may be beneficial for leakage reduction, and will further improve the device performance.

In some embodiments of the present disclosure, a semiconductor device includes a substrate, a transistor over the substrate, and a first isolation structure adjacent to the transistor. The transistor includes a channel layer extending along a first direction, a gate structure over the channel layer and extending along a second direction substantially perpendicular to the first direction, and source/drain structures on opposite ends of the channel layer. In a top view, the first isolation structure includes a first extension portion and a second extension portion extending along the first direction, and a connection portion extending along the second direction and connecting with the first extension portion and the second extension portion.

In some embodiments, the first isolation structure comprises a first dielectric layer and a second dielectric layer lining the first dielectric layer.

In some embodiments, the gate structure comprises a gate dielectric layer and a gate electrode over the gate dielectric layer, wherein in the top view the gate dielectric layer and the gate electrode both are in contact with the first isolation structure.

In some embodiments, the gate structure comprises a gate dielectric layer and a gate electrode over the gate dielectric layer, wherein in the top view the gate electrode is spaced apart from the first isolation structure through the gate dielectric layer.

In some embodiments, a top surface of the first isolation structure is higher than a top surface of the channel layer, and the first isolation structure extends into the substrate.

In some embodiments, the semiconductor device further includes a second isolation structure and a third isolation structure on opposite sides of the first isolation structure.

In some embodiments, in the top view, the second isolation structure and the third isolation structure are between the first extension portion and the second extension portion of the first isolation structure.

In some embodiments of the present disclosure, a semiconductor device includes a substrate, a transistor over the substrate, a first isolation structure adjacent to the transistor, and a second isolation structure and a third isolation structure on opposite sides of the first isolation structure. The transistor includes a channel layer extending along a first direction, a gate structure over the channel layer and extending along a second direction substantially perpendicular to the first direction, and source/drain structures on opposite ends of the channel layer. The second and third isolation structures are made of a same material.

In some embodiments, in a top view, the first isolation structure has an H-shape top profile.

In some embodiments, the second isolation structure and the third isolation structure are in contact with the first isolation structure.

In some embodiments, at least one of the second isolation structure and the third isolation structure is spaced apart from the first isolation structure.

In some embodiments, a bottom surface of the first isolation structure is at a different than bottom surfaces of the second isolation structure and the third isolation structure.

In some embodiments, in a top view, the first isolation structure comprises a first extension portion and a second extension portion extending along the first direction, and a connection portion extending along the second direction and connecting with the first extension portion and the second extension portion.

In some embodiments, in the top view, each of the second isolation structure and the third isolation structure is in contact with the first extension portion and the second extension portion of the first isolation structure.

In some embodiments, the second isolation structure comprises a first dielectric layer and a second dielectric layer lining the first dielectric layer, and in the top view the first and second dielectric layers both are in contact with the first isolation structure.

In some embodiments, the second isolation structure comprises a first dielectric layer and a second dielectric layer lining the first dielectric layer, and in the top view the first dielectric layer is spaced apart from the first isolation structure through the second dielectric layer.

In some embodiments of the present disclosure, a method includes forming a semiconductor channel layer over a substrate; forming a dummy gate structure over the semiconductor channel layer; forming source/drain structures on opposite ends of the semiconductor channel layer; replacing the dummy gate structure with a metal gate structure; forming a first isolation structure over the substrate, wherein in a top view, the first isolation structure comprises a first extension portion and a second extension portion extending along a first direction, and a connection portion extending along a second direction perpendicular to the first direction and connecting with the first extension portion and the second extension portion; and forming a second isolation structure and a third isolation structure on opposite sides of the first isolation structure.

In some embodiments, the first isolation structure is formed prior to the second isolation structure and the third isolation structure.

In some embodiments, the first isolation structure is formed after the second isolation structure and the third isolation structure.

In some embodiments, replacing the dummy gate structure with the metal gate structure is performed prior to forming the first, second, and third isolation structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a transistor over the substrate and comprising:

a channel layer extending along a first direction;

a gate structure over the channel layer and extending along a second direction substantially perpendicular to the first direction; and source/drain structures on opposite ends of the channel layer; and a first isolation structure adjacent to the transistor, wherein in a top view, the first isolation structure comprises a first extension portion and a second extension portion extending along the first direction, and a connection portion extending along the second direction and connecting between the first extension portion and the second extension portion, wherein the first isolation structure comprises a first dielectric layer and a second dielectric layer, and in the top view, the second dielectric layer lining the first dielectric layer in the first extension portion, the second extension portion, and the connection portion, wherein each of the first extension portion, the second extension portion, and the connection portion extends into the substrate below the channel layer.

2. The semiconductor device of claim 1, wherein the gate structure comprises a gate dielectric layer and a gate electrode over the gate dielectric layer, wherein in the top view the gate dielectric layer and the gate electrode both are in contact with the first isolation structure.

3. The semiconductor device of claim 1, wherein the gate structure comprises a gate dielectric layer and a gate electrode over the gate dielectric layer, wherein in the top view the gate electrode is spaced apart from the first isolation structure through the gate dielectric layer.

4. The semiconductor device of claim 1, wherein a top surface of the first isolation structure is higher than a top surface of the channel layer, and the first isolation structure extends into the substrate.

5. The semiconductor device of claim 1, further comprising:

a second isolation structure and a third isolation structure on opposite sides of the first isolation structure.

6. The semiconductor device of claim 5, wherein in the top view, the second isolation structure and the third isolation structure are between the first extension portion and the second extension portion of the first isolation structure.

7. The semiconductor device of claim 1, wherein in the top view, the first isolation structure has an H-shape top profile.

8. A semiconductor device, comprising:

a substrate;

a transistor over the substrate and comprising:

a channel layer extending along a first direction;

a gate structure over the channel layer and extending along a second direction substantially perpendicular to the first direction; and source/drain structures on opposite ends of the channel layer;

a first isolation structure adjacent to the transistor; and a second isolation structure and a third isolation structure on opposite sides of the first isolation structure, wherein the second and third isolation structures are made of a same material, wherein in a top view, the first isolation structure comprises a first extension portion and a second extension portion extending along the first direction, and a connection portion extending along the second direction and connecting between the first extension portion and the second extension portion, wherein the first isolation structure comprises a first dielectric layer and a second dielectric layer, and in the top view, the second dielectric layer lining the first dielectric layer in the first extension portion, the second extension portion, and the connection portion, wherein each of the first extension portion, the second extension portion, and the connection portion extends into the substrate below the channel layer.

9. The semiconductor device of claim 8, wherein in the top view, the first isolation structure has an H-shape top profile.

10. The semiconductor device of claim 8, wherein the second isolation structure and the third isolation structure are in contact with the first isolation structure.

11. The semiconductor device of claim 8, wherein at least one of the second isolation structure and the third isolation structure is spaced apart from the first isolation structure.

12. The semiconductor device of claim 8, wherein a bottom surface of the first isolation structure is at a different depth than bottom surfaces of the second isolation structure and the third isolation structure.

13. The semiconductor device of claim 8, wherein in the top view, each of the second isolation structure and the third isolation structure is in contact with the first extension portion and the second extension portion of the first isolation structure.

14. The semiconductor device of claim 8, wherein the second isolation structure comprises a first dielectric layer and a second dielectric layer lining the first dielectric layer, and in the top view the first and second dielectric layers both are in contact with the first isolation structure.

15. The semiconductor device of claim 8, wherein the second isolation structure comprises a first dielectric layer and a second dielectric layer lining the first dielectric layer, and in the top view the first dielectric layer is spaced apart from the first isolation structure through the second dielectric layer.

16. The semiconductor device of claim 8, wherein a top surface of the first isolation structure is higher than a top surface of the channel layer, and the first isolation structure extends into the substrate.

17. A method, comprising:

forming a semiconductor channel layer along a first direction over a substrate;

forming a dummy gate structure over the semiconductor channel layer and extending along a second direction;

forming source/drain structures on opposite ends of the semiconductor channel layer;

replacing the dummy gate structure with a metal gate structure;

forming a first isolation structure over the substrate, wherein in a top view, the first isolation structure comprises a first extension portion and a second extension portion extending along the first direction, and a connection portion extending along the second direction perpendicular to the first direction and connecting between the first extension portion and the second extension portion; and forming a second isolation structure and a third isolation structure on opposite sides of the first isolation structure, wherein the first isolation structure comprises a first dielectric layer and a second dielectric layer, and in the top view, the second dielectric layer lining the first dielectric layer in the first extension portion, the second extension portion, and the connection portion, wherein each of the first extension portion, the second extension portion, and the connection portion extends into the substrate below the semiconductor channel layer.

18. The method of claim 17, wherein the first isolation structure is formed prior to the second isolation structure and the third isolation structure.

19. The method of claim 17, wherein the first isolation structure is formed after the second isolation structure and the third isolation structure.

20. The method of claim 17, wherein replacing the dummy gate structure with the metal gate structure is performed prior to forming the first, second, and third isolation structures.

* * * * *